(12) United States Patent
Kashihara

(10) Patent No.: US 9,837,459 B2
(45) Date of Patent: Dec. 5, 2017

(54) SEMICONDUCTOR DEVICE AND MANUFACTURING METHOD THEREOF

(71) Applicant: RENESAS ELECTRONICS CORPORATION, Tokyo (JP)

(72) Inventor: Keiichiro Kashihara, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/228,928

(22) Filed: Aug. 4, 2016

(65) Prior Publication Data

US 2016/0343760 A1 Nov. 24, 2016

Related U.S. Application Data

(62) Division of application No. 13/761,669, filed on Feb. 7, 2013, now Pat. No. 9,437,639.

(30) Foreign Application Priority Data

Feb. 17, 2012 (JP) .................................. 2012-032574

(51) Int. Cl.
  *H01L 27/146* (2006.01)
  *H01L 23/544* (2006.01)

(52) U.S. Cl.
  CPC ...... *H01L 27/14632* (2013.01); *H01L 23/544* (2013.01); *H01L 27/1464* (2013.01);
  (Continued)

(58) Field of Classification Search
  CPC .............................................. H01L 27/14601
  See application file for complete search history.

(56) References Cited

U.S. PATENT DOCUMENTS 4,356,223 A 10/1982 Iida et al.
5,889,335 A 3/1999 Kuroi et al.
(Continued)

FOREIGN PATENT DOCUMENTS

CN 102044549 A 5/2011
JP 11-087488 A 3/1999
(Continued)

OTHER PUBLICATIONS

Office Action issued in corresponding Chinese patent application No. 201310059629.9, dated Sep. 28, 2016.
(Continued)

*Primary Examiner* — Kenneth Parker
*Assistant Examiner* — Fang-Xing Jiang
(74) *Attorney, Agent, or Firm* — McDermott Will & Emery LLP

(57) ABSTRACT

Provided is a semiconductor device which allows an alignment mark used for the manufacturing of a solid-state image sensor (semiconductor device) having a back-side-illumination structure to be formed in a smaller number of steps. The semiconductor device includes a semiconductor layer having a first main surface and a second main surface opposing the first main surface, a plurality of photodiodes which are formed in the semiconductor layer and in each of which photoelectric conversion is performed, a light receiving lens disposed over the second main surface of the semiconductor layer to supply light to each of the photodiodes, and a mark for alignment formed inside the semiconductor layer. The mark for alignment is formed so as to extend from the first main surface toward the second main surface and have a protruding portion protruding from the second main surface in a direction toward where the light receiving lens is disposed.

5 Claims, 94 Drawing Sheets

(52) U.S. Cl.
CPC .. *H01L 27/14627* (2013.01); *H01L 27/14645* (2013.01); *H01L 27/14685* (2013.01); *H01L 27/14687* (2013.01); H01L 2223/5442 (2013.01); H01L 2223/5446 (2013.01); H01L 2223/54426 (2013.01); H01L 2924/0002 (2013.01)

(56) References Cited

U.S. PATENT DOCUMENTS

| | | |
|---|---|---|
| 7,101,726 B2 | 9/2006 | Yamamoto et al. |
| 8,120,081 B2 | 2/2012 | Murakoshi |
| 8,138,533 B2 | 3/2012 | Koike et al. |
| 8,552,516 B2 | 10/2013 | Murakoshi et al. |
| 9,059,062 B2 | 6/2015 | Yorikado et al. |
| 2005/0104148 A1* | 5/2005 | Yamamoto ........ H01L 27/14601 257/432 |
| 2006/0094151 A1 | 5/2006 | Sumi |
| 2006/0249803 A1 | 11/2006 | Yamamoto et al. |
| 2010/0091154 A1 | 4/2010 | Shim et al. |
| 2010/0155796 A1* | 6/2010 | Koike ............... H01L 21/76898 257/292 |
| 2010/0181637 A1* | 7/2010 | Harada ............ H01L 27/14621 257/459 |
| 2010/0225774 A1 | 9/2010 | Enomoto et al. |
| 2011/0084350 A1 | 4/2011 | Murakoshi et al. |

FOREIGN PATENT DOCUMENTS

| | | |
|---|---|---|
| JP | 2005-150463 A | 6/2005 |
| JP | 2005-268738 A | 9/2005 |
| JP | 2006-059873 A | 3/2006 |
| JP | 2008-147332 A | 6/2008 |
| JP | 2009-252963 A | 10/2009 |
| JP | 2010-147230 A | 7/2010 |
| JP | 2010-212307 A | 9/2010 |
| JP | 2010-225818 A | 10/2010 |
| JP | 2011-014674 A | 1/2011 |
| JP | 2011-066043 A | 3/2011 |
| JP | 2011-066241 A | 3/2011 |
| JP | 2011-086709 A | 4/2011 |
| JP | 2011-114325 A | 6/2011 |

OTHER PUBLICATIONS

Office Action issued in corresponding Taiwan Patent Application No. 102103589, dated Sep. 26, 2016.
Notification of Reasons for Refusal, issued in corresponding Japanese Patent Application No. 2012-032574, dated Sep. 8, 2015; with English translation.
Non-Final Office Action issued in related U.S. Appl. No. 13/761,669, dated Mar. 28, 2014.
Final Office Action issued in related U.S. Appl. No. 13/761,669, dated Aug. 28, 2014.
Non-Final Office Action issued in related U.S. Appl. No. 13/761,669, dated Mar. 13, 2015.
Final Office Action issued in related U.S. Appl. No. 13/761,669, dated Jul. 30, 2015.
Final Office Action issued in related U.S. Appl. No. 13/761,669, dated Nov. 16, 2015.
Office Action issued in corresponding Chinese Patent Application No. 2013100596299, dated Jun. 2, 2017.

* cited by examiner

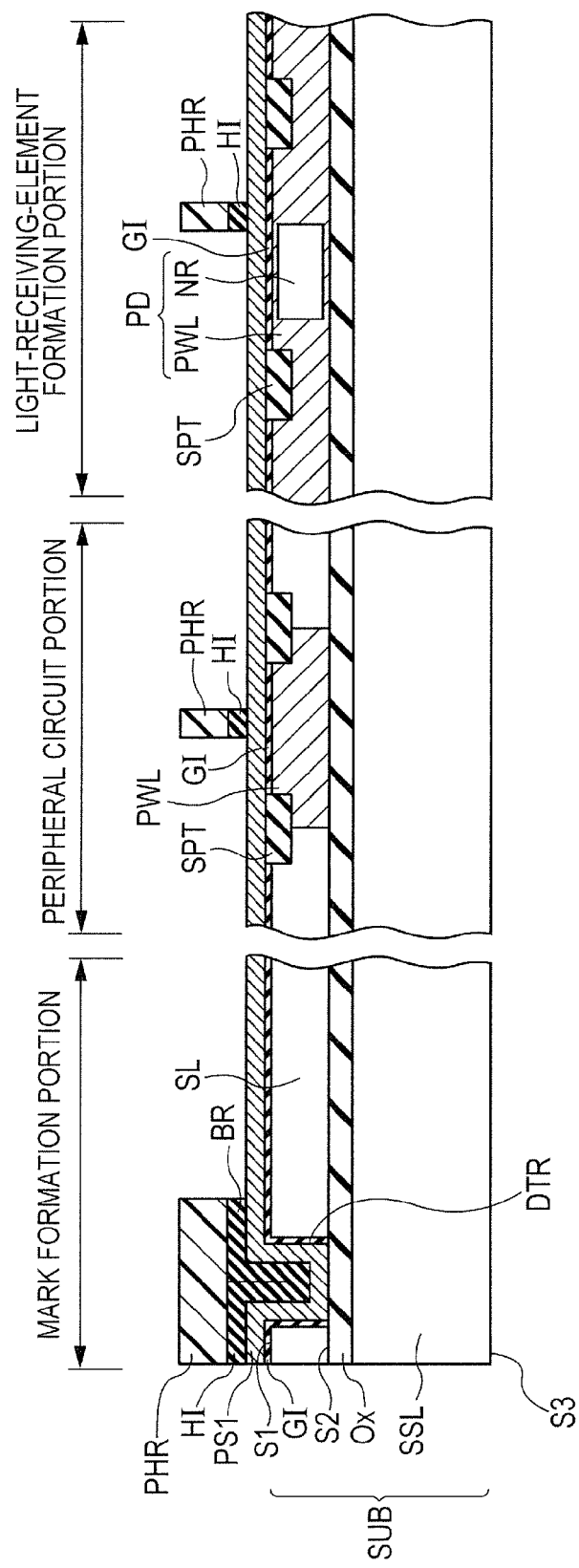

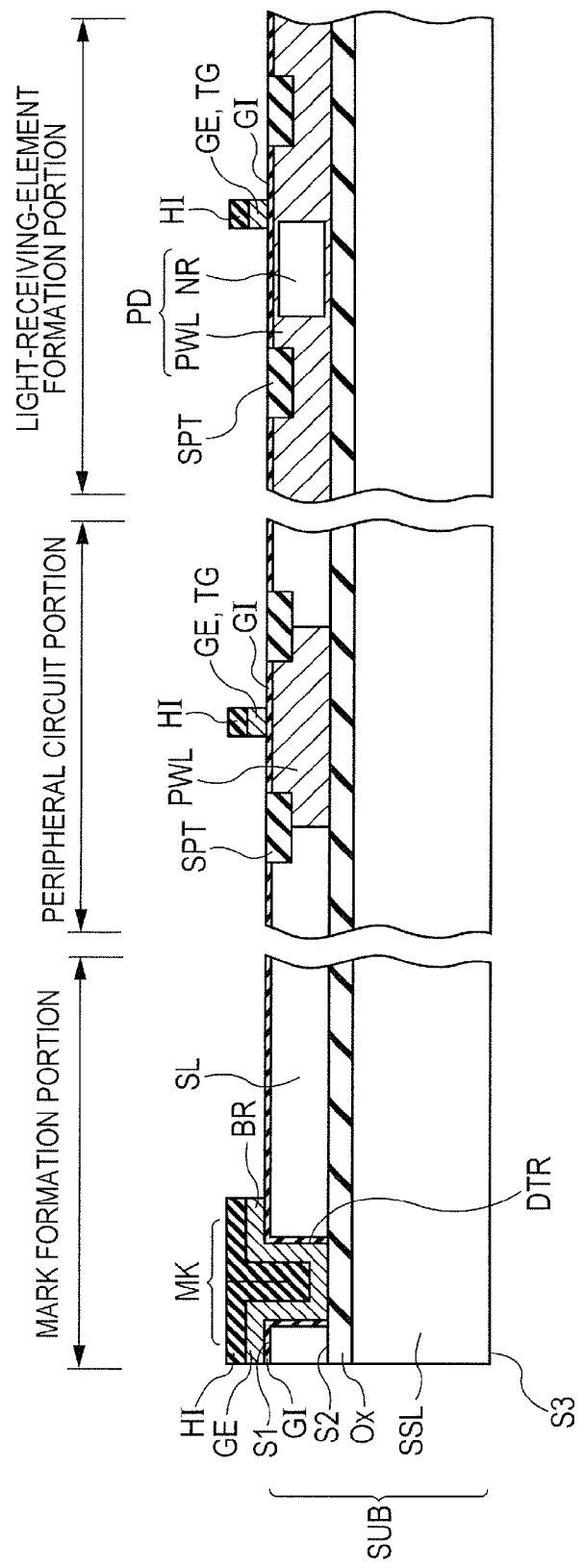

SEMICONDUCTOR DEVICE AND MANUFACTURING METHOD THEREOF

CROSS-REFERENCE TO RELATED APPLICATIONS

This application is a Divisional application of U.S. patent application Ser. No. 13/761,669, filed on Feb. 7, 2013, which in turn claims the benefit of Japanese Application No. 2012-032574, filed on Feb. 17, 2012, the disclosures of which Applications are incorporated by reference herein.

BACKGROUND

The present invention relates to a semiconductor device and a manufacturing method thereof, and particularly to a solid-state image sensor having a so-called back-side-illumination light receiving element and a manufacturing method thereof.

A solid-state image sensor is a semiconductor device in which an electrode, wiring, and a light receiving element such as a photodiode are formed over the front surface of the semiconductor substrate, and normally has a so-called front-side-illumination structure in which the light receiving element is illuminated with light for photoelectric conversion emitted from thereabove (from above the front surface thereof).

However, the front-side-illumination light receiving element is illuminated with light from above metal wiring formed over the light receiving element. As a result, a part of the light is reflected by the metal wiring and the like, resulting in the problem that the light does not efficiently reach the light receiving element. To solve the problem, a solid-state image sensor having a so-called back-side-illumination structure has been developed in which a light receiving element is illuminated with light for photoelectric conversion emitted from therebelow (from below the back surface thereof). Solid-state image sensors each having a back-side-illumination structure are disclosed in, e.g., Japanese Unexamined Patent Publication No. 2005-150463 (Patent Document 1), Japanese Unexamined Patent Publication No. 2010-212307 (Patent Document 2), Japanese Unexamined Patent Publication No. 2010-147230 (Patent Document 3), Japanese Unexamined Patent Publication No. 2009-252963 (Patent Document 4), and Japanese Unexamined Patent Publication No. 2008-147332 (Patent Document 5).

In a back-side-illumination solid-state image sensor, a light receiving area can be increased compared with that in a front-side-illumination solid-state image sensor. Accordingly, the back-side-illumination solid-state image sensor has the advantage of an improved sensitivity of detecting light received thereby. Therefore, it has been expected to apply a back-side-illumination solid-state image sensor to a high-density and high-sensitivity image sensor or the like.

RELATED ART DOCUMENTS

Patent Documents

[Patent Document 1]
Japanese Unexamined Patent Publication No. 2005-150463
[Patent Document 2]
Japanese Unexamined Patent Publication No. 2010-212307
[Patent Document 3]
Japanese Unexamined Patent Publication No. 2010-147230
[Patent Document 4]
Japanese Unexamined Patent Publication No. 2009-252963
[Patent Document 5]
Japanese Unexamined Patent Publication No. 2008-147332

SUMMARY

However, in the case of using a back-side-illumination type, a condenser lens is formed on the back side so that back-side processing such as alignment of a position at which the condenser lens is to be formed is required. This needs an extra manufacturing step for forming, on the back side of a semiconductor substrate, an alignment mark used for the alignment during the back-side processing.

For instance, in the example shown in Japanese Unexamined Patent Publication No. 2008-147332, an alignment mark for front-side processing is separate from an alignment mark for back-side processing. In this case, the front-side alignment mark is formed separately from the back-side alignment mark to result in an extremely large number of steps required to form these alignment marks, which is complicated and troublesome.

Also, in each of the examples shown in Japanese Unexamined Patent Publication Nos. 2005-150463 and 2009-252963, to form an alignment mark used for back-side processing, an extra step of forming a hard mask including a silicon oxide film and a silicon nitride film and the like are required. In addition, after the alignment mark is formed, an extra step for removing these thin films as the hard mask is also required. Thus, to form the alignment mark used for back-side processing, the plurality of extra steps are required. Accordingly, it is desired to minimize the steps required to form the alignment mark used for back-side processing.

For the other examples shown in Japanese Unexamined Patent Publication Nos. 2010-212307 and 2010-147230 also, it is desired to further reduce the steps and enhance efficiency by, e.g., further reducing the number of steps required for forming the alignment mark for back-side processing and utilizing the steps required to form the alignment mark for other steps, and so forth.

The present invention has been achieved in view of the foregoing problems. An object of the present invention is to provide a semiconductor device which allows an alignment mark used for the manufacturing of a solid-state image sensor (semiconductor device) having a back-side-illumination structure to be formed in a smaller number of steps, and a manufacturing method thereof.

A semiconductor device according to an embodiment of the present invention includes the following configuration. The above semiconductor device includes: a semiconductor layer having a first main surface and a second main surface opposing the first main surface; a plurality of light receiving elements which are formed in the semiconductor layer and in each of which photoelectric conversion is performed; a light receiving lens disposed over the second main surface of the semiconductor layer to supply light to each of the light receiving elements; and a mark for alignment formed inside the semiconductor layer. The above mark for alignment extends from the first main surface toward the second main surface, and the mark for alignment includes a protruding portion formed so as to protrude from the second main surface in a direction toward where the light receiving lens is disposed.

A semiconductor device according to another embodiment of the present invention includes the following configuration. The above semiconductor device includes: a semiconductor layer having a first main surface and a second main surface opposing the first main surface; a plurality of light receiving elements which are formed in the semiconductor layer and in each of which photoelectric conversion is performed; a light receiving lens disposed over the second main surface of the semiconductor layer to supply light to each of the light receiving elements; a mark for alignment formed inside the semiconductor layer; and a transistor for inputting/outputting an electric signal to/from each of the light receiving elements. The above transistor includes a gate electrode. The mark for alignment extends from the first main surface toward the second main surface. The above mark for alignment is formed of a first layer comprised of a conductive film or a semiconductor film which fills at least a part of an inside of a trench portion formed in the semiconductor layer. The above first layer is the same as a layer of the gate electrode.

A method of manufacturing the semiconductor device according to the embodiment of the present invention includes, e.g., the following configuration. First, a semiconductor substrate is prepared which has a first main surface and a third main surface opposing the first main surface and has an insulating film layer embedded in an inside thereof so as to extend along the first and third main surfaces. A single-layer trench processing mask is formed so as to cover the first main surface of the above semiconductor substrate. By means of the above trench processing mask, a trench portion extending from the first main surface to reach at least the insulating film layer is formed. An inside of the trench portion is filled with a first layer comprised of a conductive film or a semiconductor film. At least a part of the first layer formed outside the trench portion is removed, while leaving the first layer with which the inside of the trench portion is filled, to form a mark for alignment comprised of the first layer inside the trench portion. A region of the above semiconductor substrate located between the first main surface thereof and the insulating film layer is changed to a semiconductor layer to form, from the first main surface, a plurality of light receiving elements in the semiconductor layer. A region of the semiconductor substrate extending from the third main surface to an upper surface of the insulating film layer is removed. By means of the above mark for alignment, a light receiving lens for supplying light to each of the light receiving elements is disposed over a second main surface of the semiconductor layer opposing the first main surface.

A method of manufacturing the semiconductor device according to the other embodiment of the present invention includes, e.g., the following configuration. First, a semiconductor substrate is prepared which has a first main surface and a third main surface opposing the first main surface and has an insulating film layer embedded in an inside thereof so as to extend along the first and third main surfaces. A trench portion extending from the above first main surface to reach the insulating film layer is formed. An inside of the trench portion is filled with a first layer comprised of a conductive film or a semiconductor film and covering the above first main surface. A part of the first layer formed outside the trench portion is removed, while leaving the first layer with which the inside of the above trench portion is filled, to form a mark for alignment comprised of the first layer inside the trench portion and a gate electrode included in a transistor for inputting/outputting an electric signal to/from each of light receiving elements. A region of the above semiconductor substrate located between the first main surface thereof and the insulating film layer is changed to a semiconductor layer to form, from the first main surface, the plurality of light receiving elements in the semiconductor layer. A region of the above semiconductor substrate extending from the third main surface to an upper surface of the insulating film layer is removed. By means of the above mark for alignment, a light receiving lens for supplying light to each of the light receiving elements is disposed over a second main surface of the semiconductor layer opposing the first main surface. The first layer with which the inside of the trench portion is filled in the step of filling the inside of the above trench portion is the same as a layer of the gate electrode formed over the first main surface to form a transistor for inputting/outputting an electric signal to/from each of the light receiving elements.

According to the embodiment of the present invention, the trench processing mask for forming an alignment mark used for, e.g., back-side processing is formed to include a single layer. Accordingly, compared to the case where the processing mask is formed to include a plurality of layers, the number of steps of forming the alignment mark used for back-side processing can be reduced. Therefore, it is possible to provide a semiconductor device having a solid-state image sensor having a back-side-illumination structure at lower cost. In the case where a protruding portion is formed, it is possible to utilize the protruding portion to enhance visual recognizability of the alignment mark when viewed from the second main surface side.

According to the other embodiment of the present invention, the conductive film or the semiconductor film filling the inside of the trench portion for forming an alignment mark used for, e.g., back-side processing is formed (simultaneously) in the same layer as that of the gate electrode included in the transistor for inputting/outputting an electric signal to/from the light receiving element. That is, by utilizing the step of forming the gate electrode, the alignment mark used for back-side processing can be formed with higher efficiency. Accordingly, it is possible to reduce the total number of steps required to form the semiconductor device and provide the semiconductor device having the solid-state image sensor having the back-side-illumination structure at lower cost.

BRIEF DESCRIPTION OF THE DRAWINGS

FIG. 94 is a schematic cross-sectional view showing the first step of a manufacturing method of the semiconductor device in the ninth example of Embodiment 3 shown in FIG. 93; and FIG. 95 is a schematic cross-sectional view showing the second step of the manufacturing method of the semiconductor device in the ninth example of Embodiment 3 shown in FIG. 93.

DETAILED DESCRIPTION

The embodiments of the present invention will be described below based on the drawings.

Embodiment 1

First, a description will be given of a semiconductor device in a wafer state as Embodiment 1.

Figure 1:
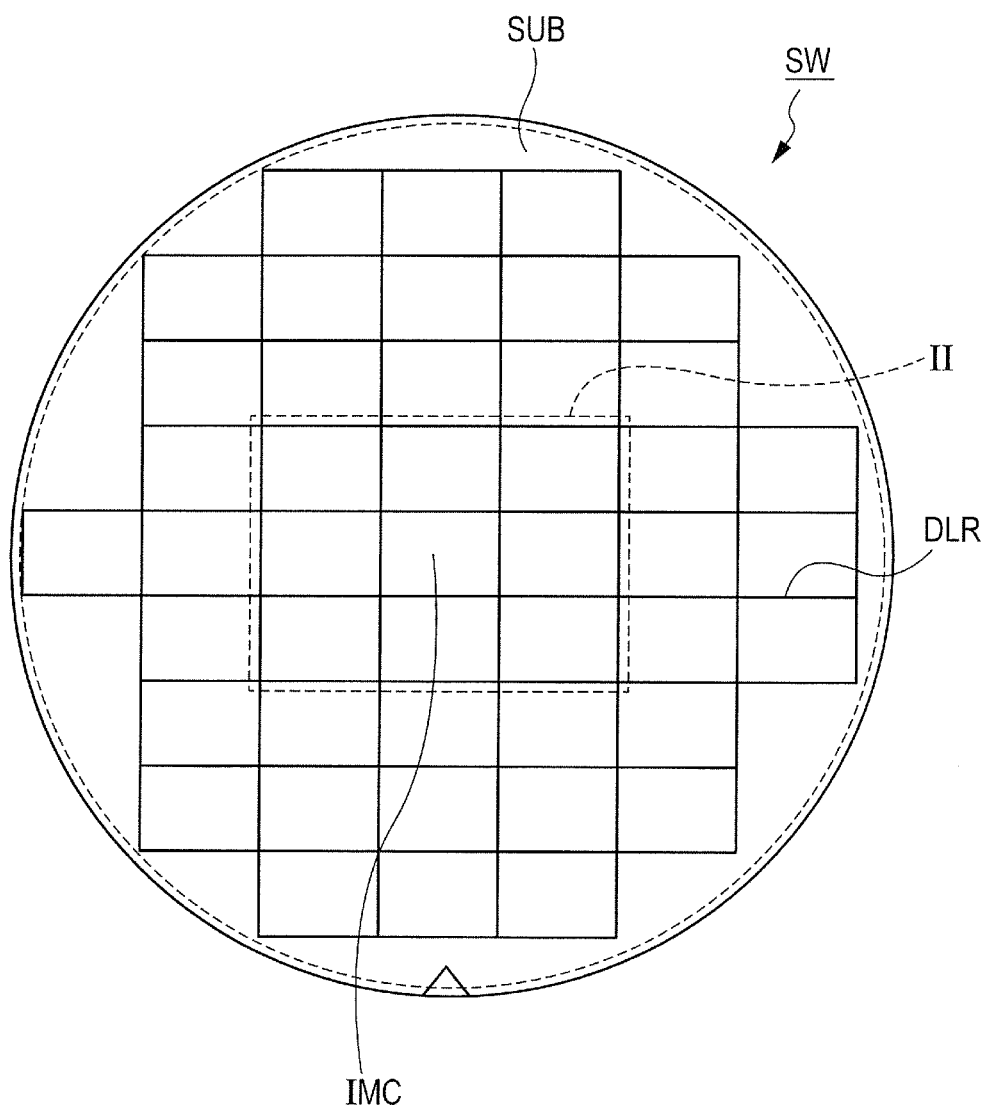
FIG. 1 is a schematic plan view showing a semiconductor device according to the present invention in a wafer state.

As shown in FIG. 1, a semiconductor wafer SW is formed with a plurality of chip regions IMC for image sensors. The plurality of chip regions IMC each having a rectangular planar shape are arranged in rows and columns.

Figure 2:
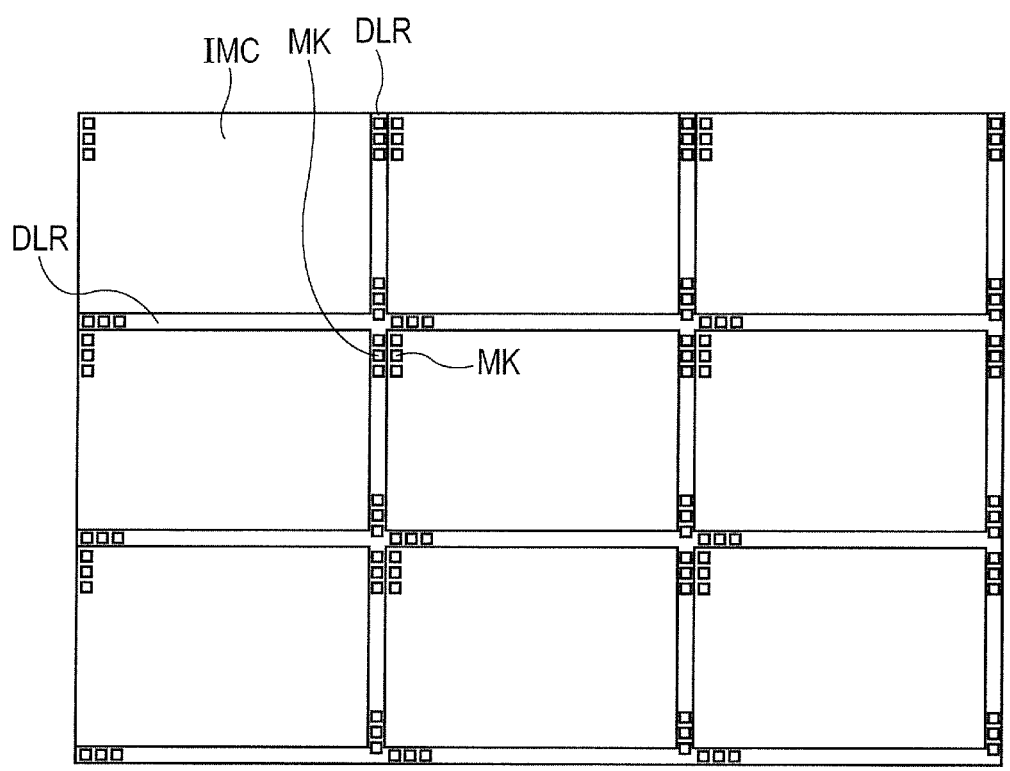
FIG. 2 is a schematic enlarged plan view of the region enclosed by the dotted line II in FIG. 1.

As shown in FIGS. 1 and 2, each of the plurality of chip regions IMC is formed with a solid-state image sensor including a plurality of light receiving elements. In the vicinity of the outer periphery of each of the chip regions IMC, a peripheral circuit for controlling the light receiving elements such as, e.g., photodiodes is formed. The peripheral circuit is formed as a so-called CMOS (Complementary Metal Oxide Semiconductor) transistor circuit in the outer peripheral area of the area (pixel array formation portion) of the chip region IMC where the plurality of light receiving elements are formed.

In the semiconductor wafer SW, between the plurality of chip regions IMC, dicing line regions DLR are formed. The semiconductor wafer SW is subjected to dicing in the dicing line regions DLR to be divided into a plurality of semiconductor chips.

Alignment marks MK (marks for alignment or marks for inspecting misalignment) used in the formation of a semiconductor device such as a solid-state image sensor are formed over the dicing line regions DLR or over the chip regions IMC. When formed over the chip regions IMC, the alignment marks MK are preferably formed in the vicinities of the end portions of the chip regions IMC.

Figure 3:
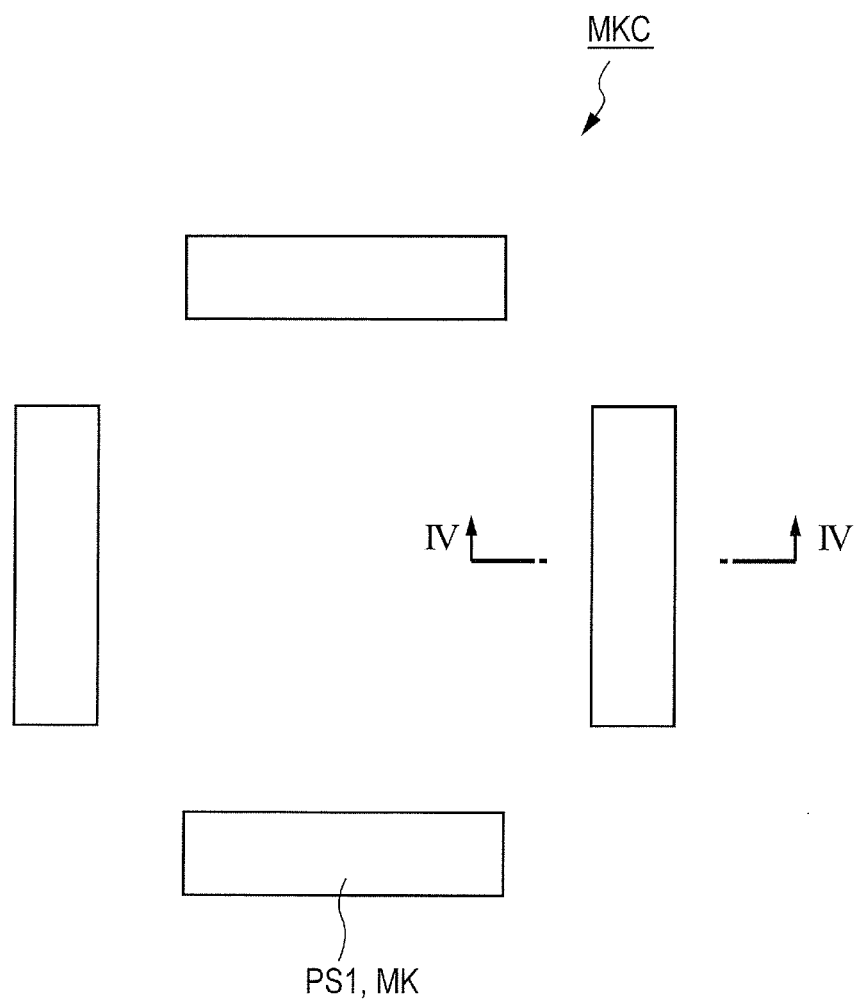
FIG. 3 is a schematic enlarged view showing the first example of a two-dimensional form of an alignment mark in Embodiment 1 of the present invention.
Figure 4:
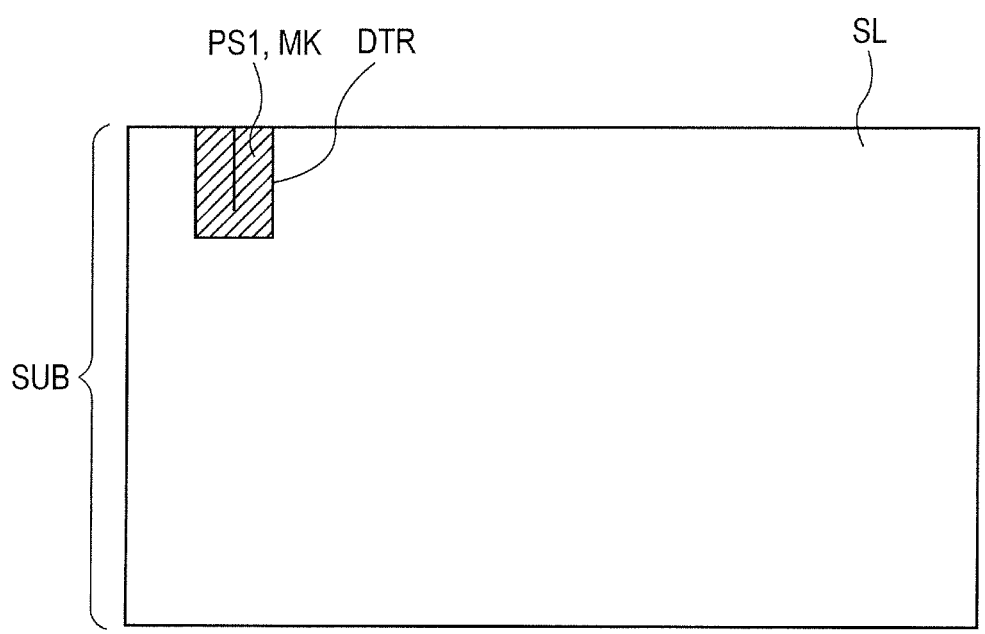
FIG. 4 is a schematic cross-sectional view showing the first example of the form of the alignment mark in Embodiment 1 in the portion along the line IV-IV of FIG. 3.

As shown in FIGS. 3 and 4, each of the alignment marks MK is in the form of a pattern of a polysilicon layer PS1 in planar view which is formed inside a semiconductor layer SL (semiconductor substrate SUB) made of, e.g., single-crystal silicon. That is, the alignment mark MK is comprised of the polysilicon layer PS1 (first layer) disposed so as to fill at least a part of the inside of a trench portion DTR formed in the main surface of the semiconductor layer SL. More specifically, the alignment mark MK is in the form of, e.g., the single polysilicon layer PS1 embedded in at least a part of the inside of the trench portion DTR formed in one of the main surfaces of the semiconductor layer SL (semiconductor substrate SUB). Accordingly, the alignment mark MK is formed so as to extend from the one main surface of the semiconductor layer SL toward the other main surface thereof opposing the one main surface. The alignment mark MK may be formed only in a part of the region between the one main surface of the semiconductor layer SL and the other main surface thereof. Alternatively, the alignment mark MK may also extend through the semiconductor layer SL from the one main surface thereof to the other main surface thereof.

Note that the alignment mark MK may also be formed of, e.g., a single-layer pattern of the polysilicon layer PS1 shown in FIG. 4. However, as shown in, e.g., FIG. 3, the individual alignment marks MK may also have a layout such as that of an alignment mark set MKC in which the four alignment marks MK are arranged in a rectangular configuration in planar view.

However, as will be described later, in the case where, e.g., the polysilicon layer PS1 as the alignment mark MK inside the trench portion DTR is in the form (of a brim portion) in which the polysilicon layer PS1 extends from the inside of the trench portion DTR to the outside thereof, the following definition is given here. That is, in this case, it is defined here that not only the polysilicon layer PS1 inside the trench portion DTR and the like, but also the portion of the polysilicon layer PS1 outside the trench portion DTR which is continued to the inside portion thereof and the like are also included in the alignment mark MK.

Note that, in FIG. 4, the cross-sectional shape of the alignment mark MK of FIG. 3 is particularly emphatically shown so that the semiconductor substrate SUB of FIG. 4 does not necessarily correspond to the form of the semiconductor substrate of FIG. 3.

Each of the alignment marks MK (MKC) is formed over the dicing line region DLR, or preferably over the outer peripheral area of the chip region IMC. Preferably, the outer peripheral area when the front side of the dicing line region DLR or the front side of the chip region IMC of FIG. 2 is viewed in planar view has a first region where the alignment mark MK is formed and a second region where the alignment mark MK is not formed. Only a part of the outer peripheral portion means having both of a region where the alignment mark MK is formed and a region where the alignment mark MK is not formed, as described above.

More specifically, in, e.g., FIG. 2, the region of the outer peripheral portion of each of the chip regions IMC in which the alignment mark MK is disposed in the upper left part thereof corresponds to the foregoing first region, and the region of the outer peripheral portion of each of the chip regions IMC which is other than the foregoing first region and in which the alignment mark MK is not disposed corresponds to the foregoing second region. The same applies also to the front side of the dicing line region DLR. The region where the alignment mark MK is disposed corresponds to the foregoing first region, and the region other than the foregoing first region corresponds to the foregoing second region. In the case of, e.g., the mark for inspecting misalignment, the total of four alignment marks MK are preferably placed on the four corners of the front side of the dicing line region DLR or the chip region IMC.

Figure 5:
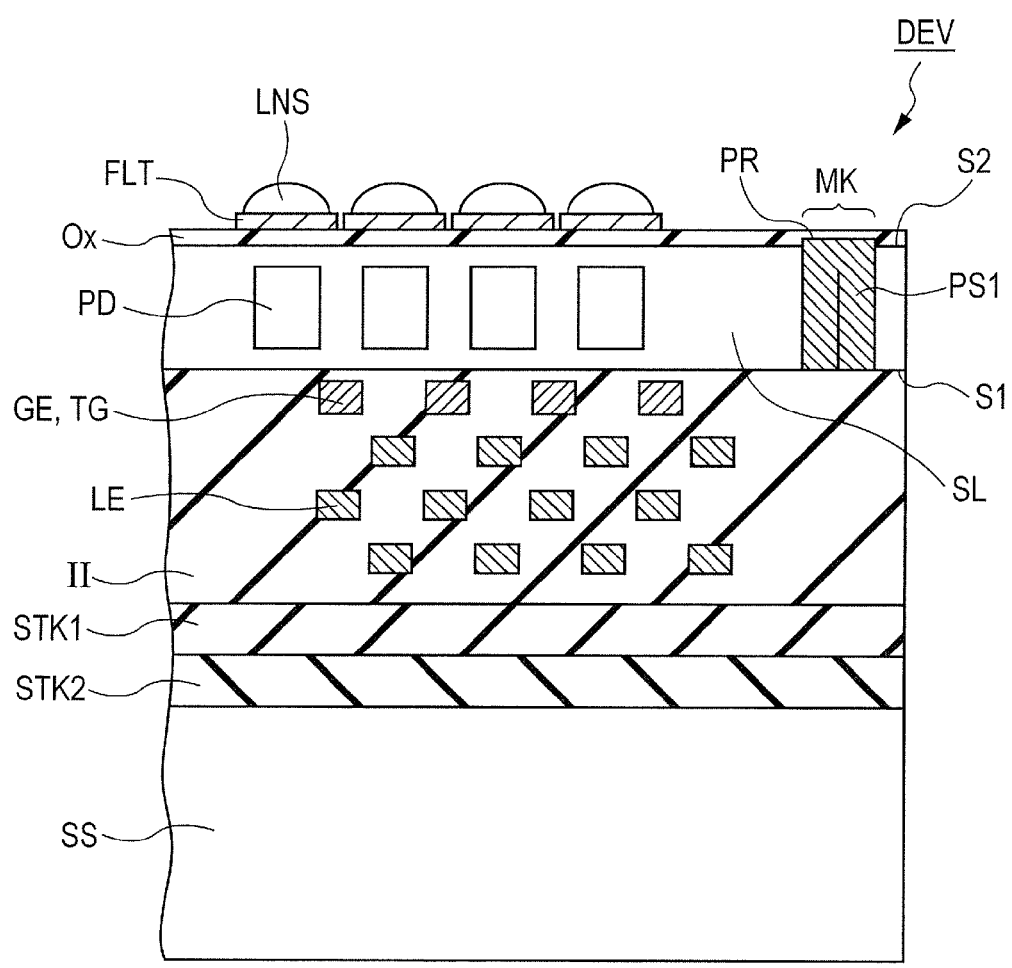
FIG. 5 is a schematic cross-sectional view showing a form of a light-receiving-element formation portion in which photodiodes, transistors, and the first example of a form of the alignment mark are formed in a semiconductor device according to Embodiment 1.

As shown in FIG. 5, in a semiconductor device DEV according to the first example of Embodiment 1, inside the semiconductor layer SL made of, e.g., silicon, a plurality of (e.g., four in FIG. 5) photodiodes PD (light receiving elements) and the alignment mark MK are formed. The photodiodes, the alignment mark MK, and the like each described above are formed to extend from a front main surface S1 (first main surface) as the front main surface of the semiconductor layer SL into the semiconductor layer SL. Over the front main surface S1, gate electrodes GE and an interlayer insulating layer II are formed. The interlayer insulating layer II is comprised of, e.g., a silicon oxide film or the like. In the interlayer insulating layer II, a plurality of metal wires LE (e.g., in three layers in FIG. 5) are formed. Accordingly, in FIG. 5, the configurations of, e.g., the foregoing light-receiving-element formation portion (pixel array region) of the chip region IMC and an alignment-mark formation region (mark formation portion in FIG. 5) thereof are collectively shown.

Note that, in FIG. 5, the photodiodes PD each schematically depicted in the form of a single rectangle are shown. However, actually, each of the photodiodes PD has a so-called pn-junctioned generally known configuration including, e.g., a p-type impurity region and an n-type impurity region, as will be described later.

A back main surface S2 (second main surface) opposing the front main surface S1 of the semiconductor layer SL is the back main surface of the semiconductor layer SL. Over the back main surface S2, a planarizing layer Ox comprised of, e.g., a silicon oxide film is formed. Over the planarizing layer Ox, color filters FLT including a red filter, a green filter, and a blue filter are formed. Over the color filters FLT, on-chip lenses LNS (light receiving lenses) are formed. The color filters FLT and the on-chip lenses LNS each mentioned above are formed at positions substantially overlapping the photodiodes PD in planar view. Therefore, the semiconductor device DEV is a solid-state image sensor which photo-electrically converts light incident from the back main surface S2 side of the semiconductor layer SL on the photodiodes PD to generate an electric signal in the photodiodes PD. That is, the semiconductor device DEV is a so-called back-side-illumination solid-state image sensor.

The gate electrodes GE are electrodes included in transistors TG which input/output electric signals to/from the photodiodes PD. More specifically, the transistors TG are transfer transistors which input/output electric signals between the photodiodes PD and, e.g., the metal wires LE and the peripheral circuit or the like.

Over the interlayer insulating layer II (over the main surface thereof opposite to the semiconductor layer SL when viewed from the interlayer insulating layer II), an adhesive layer STK1 is formed. Components having the semiconductor layer SL, the color filters, and the like and formed with the adhesive layer STK1 are coupled to a supporting substrate SS formed with an adhesive layer STK2. The coupling between the semiconductor layer SL and the supporting substrate SS is achieved by the adhesive layers STK1 and STK2 which come in contact with each other to be joined together. Note that the supporting substrate SS is a substrate for supporting the components having the semiconductor layer SL and the like, and is a semiconductor wafer made of, e.g., single-crystal silicon. The adhesive layers STK1 and STK2 are each formed of, e.g., a silicon oxide film. By being joined to the supporting substrate SS, the adhesive layers STK1 and STK2 can improve the mechanical strength of the semiconductor layer SL formed with the photodiodes PD and the like.

The alignment mark MK is formed to extend from the front main surface S1 of the semiconductor layer SL through the semiconductor layer SL in the thickness direction of the semiconductor layer SL, reach the back main surface S2, and protrude from the back main surface S2 in an upward direction (toward where the on-chip lenses LNS are disposed) above the back main surface S2 in the drawing. That is, between the lower main surface (in contact with the back main surface S2) of the planarizing layer Ox in the drawing and the bottom portion (uppermost surface in FIG. 5) of the alignment mark MK, a protruding portion PR is formed.

In other words, between the uppermost surface of the first layer (polysilicon layer PS1) comprised of a conductive film or a semiconductor film and forming the alignment mark MK and the back main surface S2 of the semiconductor layer SL, the protruding portion PR is formed. It may also be possible that the alignment mark MK extends from the front main surface S1 toward the back main surface S2 and the bottom surface thereof extends to reach, e.g., the upper main surface (over which the color filters FLT are formed) of the planarizing layer Ox in the drawing.

The protruding portion PR further enhances the visual recognizability of the alignment mark MK from the back main surface S2 side. That is, even when the alignment mark MK is made of the same silicon as that of the semiconductor layer SL, it is possible to enhance the visual recognizability of the alignment mark MK from the back main surface S2 side utilizing the protruding portion PR. The alignment mark MK made of the same material as silicon as the semiconductor layer SL shows the same chemical reactivity as that shown by the semiconductor layer SL. Therefore, if, e.g., a chemical solution which does not give damage to the semiconductor layer SL is used, the damage given to the alignment mark MK is reduced similarly to the damage given to the semiconductor layer SL.

Note that the upper surface of the alignment mark MK is covered with the planarizing layer Ox but, when the planarizing layer Ox is made of a material having high light transmittance such as a silicon oxide film, the alignment mark MK disposed under the planarizing layer Ox can be visually recognized from above.

The polysilicon layer PS1 fills up the entire inside of the trench portion DTR (see FIG. 4) forming the alignment mark MK. The polysilicon layer PS1 is not formed outside the trench portion DTR, and the height of the lowermost portion of the polysilicon layer PS1 (in FIG. 5) is substantially equal to the height of the front main surface S1.

Next, referring to FIGS. 6 to 17, a description will be given of a manufacturing method of the alignment mark MK particularly according to the first example in the semiconductor device of Embodiment 1.

In FIGS. 6 to 17, a mark formation portion in the dicing line region DLR described above, a peripheral circuit portion in which an NMOS transistor is formed, and the light-receiving-element formation portion which is included in a region where the pixel array is formed and in which the single photodiode PD is particularly formed are shown side by side.

Figure 6:
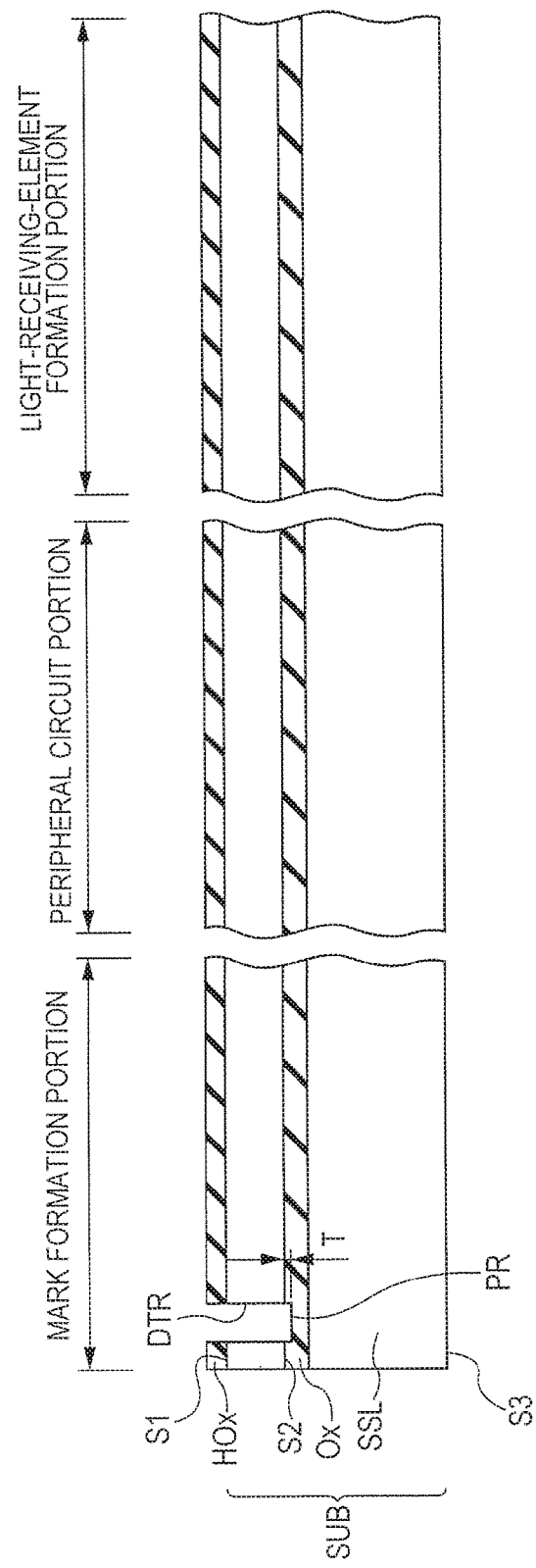
FIG. 6 is a schematic cross-sectional view showing the first step of a manufacturing method of the semiconductor device in the first example of Embodiment 1 shown in FIG. 5.

As shown in FIG. 6, the semiconductor substrate SUB is prepared first. The semiconductor substrate SUB has the main surface S1 (first main surface), and a main surface S3 (third main surface) opposing the main surface S1. The insulating film layer Ox comprised of, e.g., a silicon oxide film is formed so as to extend along, e.g., the main surface S1 and the main surface S3 and be embedded in the semiconductor substrate SUB. The semiconductor layer SL made of single-crystal silicon is formed to come in contact with one of the pair of main surfaces (main surfaces along the main surfaces S1 and S3) of the insulating film layer Ox, while a sub-substrate SSL made of single-crystal silicon is formed to come in contact with the other of the pair of main surfaces of the insulating film layer Ox. By way of example, it is assumed that the semiconductor layer SL and the sub-substrate SSL are made of single-crystal silicon having an n-type impurity. In this manner, the semiconductor substrate SUB as a so-called SOI (Silicon on Insulator) substrate having a structure in which the sub-substrate SSL, the insulating film layer Ox, and the semiconductor layer SL are stacked in this order is prepared. The semiconductor layer SL has the pair of main surfaces including the front main surface S1 and the back main surface S2. The front main surface S1 is the same as the main surface S1 of the semiconductor substrate SUB.

By, e.g., a CVD (Chemical Vapor Deposition) method, an insulating film such as, e.g., a silicon oxide film HOx is formed so as to cover substantially the entire main surface S1 of the semiconductor substrate SUB (front main surface S1 of the semiconductor layer SL). The thickness of the silicon oxide film HOx is preferably controlled to be, e.g., not less than 200 nm and not more than 400 nm. By way of example, the thickness of the silicon oxide film HOx is preferably controlled to be 300 nm (not less than 250 nm and not more than 350 nm). Particularly in the region of the mark formation portion where the alignment mark MK (trench portion DTR) is to be formed, the silicon oxide film HOx is etched using a pattern of a photoresist (photosensitive agent) not shown which has been patterned using a typical photo-engraving technique (exposure to light and development). The etching of the silicon oxide film HOx is performed by dry etching such as, e.g., a RIE (Reactive Ion Etching) method.

Using the silicon oxide film HOx thus patterned as a hard mask (trench processing mask) for the etching of the semiconductor substrate SUB, typical etching is performed on the semiconductor substrate SUB. In this manner, the trench portion DTR is formed so as to extend from the uppermost main surface of the silicon oxide film HOx through the silicon oxide film HOx and the semiconductor layer SL and reach the inside of the insulating film layer Ox. Here, between the main surface S2 and the lowermost portion of the trench portion DTR (corresponding to the protruding portion PR of FIG. 5), the protruding portion PR of the trench portion DTR is formed. The trench portion DTR is formed such that a level difference T in the vertical direction of FIG. 6 is preferably not less than 10 nm and not more than 150 nm (more preferably not less than 30 nm and not more than 80 nm).

Figure 7:
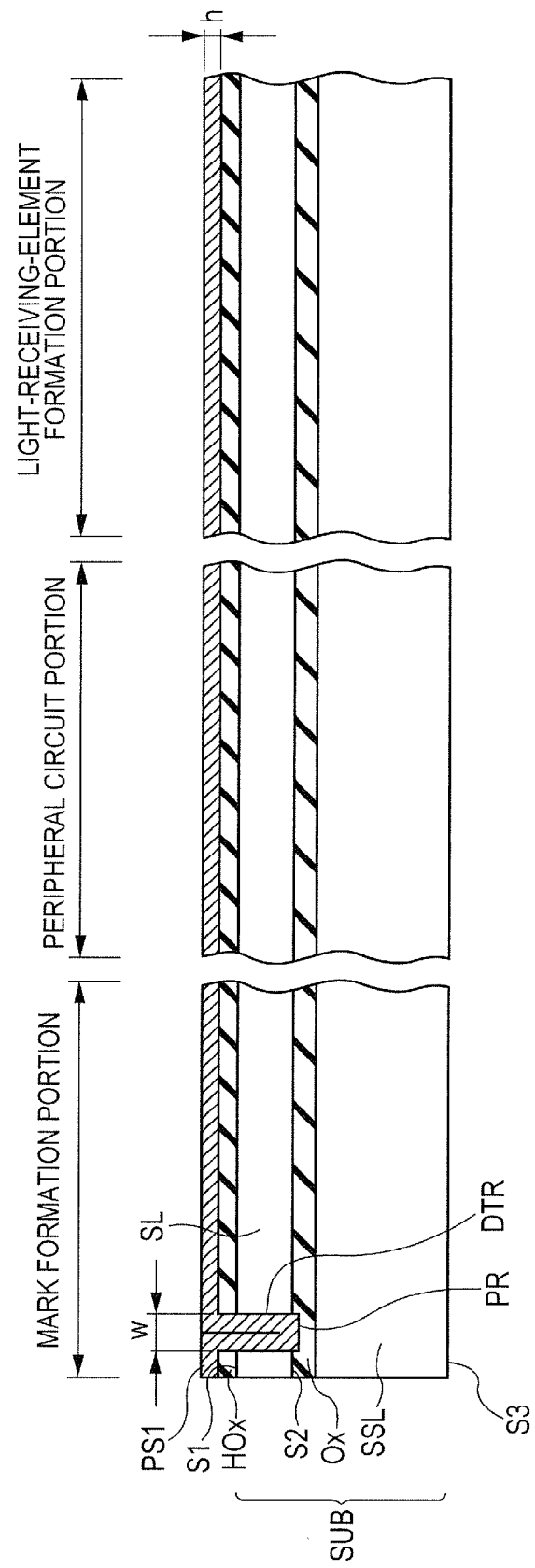
FIG. 7 is a schematic cross-sectional view showing the second step of the manufacturing method of the semiconductor device in the first example of Embodiment 1 shown in FIG. 5.

As shown in FIG. 7, a conductive film or a semiconductor film (first layer) such as, e.g., the polysilicon layer PS1 is formed by, e.g., a CVD method so as to cover the inner peripheral wall surface of the trench portion DTR and the upper surface of the silicon oxide film HOx. Note that, here, the conductive film is assumed to include both of a semiconductor film containing an impurity and a conductive film made of a metal material or the like other than the semiconductor film, and the semiconductor film is assumed to include a thin film of a semiconductor not containing an impurity.

The thickness of the polysilicon layer PS1 is preferably controlled to be not less than 100 nm and not more than 400 nm, and more preferably controlled to be 250 nm (not less than 200 nm and not more than 300 nm) by way of example. Preferably, the polysilicon layer PS1 covers the inner wall surface of the trench portion DTR to thereby fill the inside of the trench portion DTR (particularly the bottom surface and vicinity thereof). To achieve this, if the width (in the left-right direction of the drawing) of the trench portion DTR is w and the thickness of the polysilicon layer PS1 is h by way of example, it is preferable that w≤2h is satisfied, i.e., the foregoing width is not more than double the foregoing thickness. By thus filling the inside of the trench portion DTR, it is possible to inhibit a problem such that, e.g., a part of the inner bottom surface or side surface of the polysilicon layer PS1 deposited in the trench portion DTR is exposed, and the exposed region is unintentionally etched in the subsequent silicon etching step.

At the time of treatment for forming the polysilicon layer PS1 performed by a CVD method, by introducing, e.g., a phosphine ($PH_3$) gas, it is possible to introduce phosphorus (P) as an n-type impurity into the polysilicon layer PS1 and form the polysilicon layer PS1 having the n-type impurity. Alternatively, it may also be possible that, at the time of forming a thin film of the polysilicon layer PS1, the foregoing impurity is not introduced, but the impurity is introduced into the polysilicon layer PS1 by, e.g., using a typical ion implantation technique in the subsequent step.

Note that, here, instead of the polysilicon layer PS1 made of polysilicon, a thin film of, e.g., amorphous silicon or the like may also be formed. Thus, the first layer is preferably made of a material containing silicon even when the first layer is a conductive film or a semiconductor film.

Figure 8:
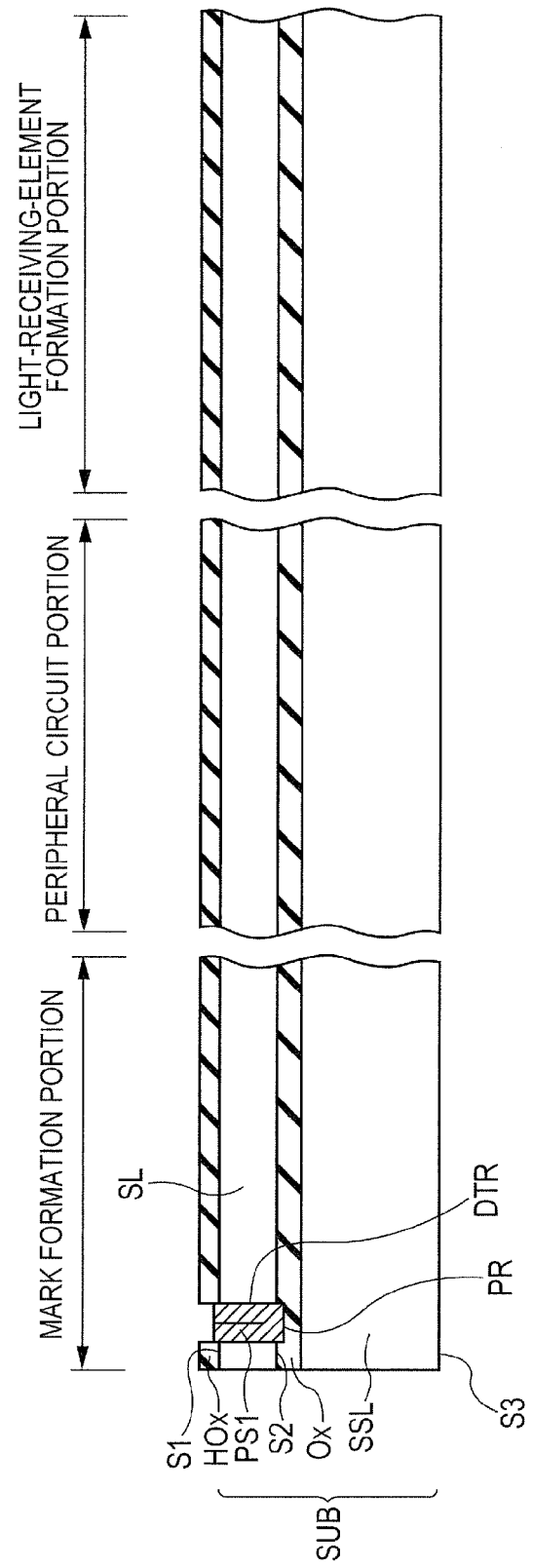
FIG. 8 is a schematic cross-sectional view showing the third step of the manufacturing method of the semiconductor device in the first example of Embodiment 1 shown in FIG. 5.

As shown in FIG. 8, using, a technique such as, e.g., a RIE method, the polysilicon layer PS1 over the silicon oxide film HOx is etched back. Specifically, by being etched back, the polysilicon layer PS1 embedded inside the trench portion DTR is left and the polysilicon layer PS1 outside the trench portion DTR (particularly the polysilicon layer PS1 located over the main surface S1 and immediately above the inside of the trench portion DTR here) is removed. Here, the polysilicon layer PS1 and an insulating layer I1 over the main surface S1 may entirely be removed. Here, by way of example, the polysilicon layer PS1 is etched back such that the height of the front main surface S1 of the semiconductor layer SL is substantially equal to the height of the uppermost surface of the polysilicon layer PS1 after the etch-back process (i.e., such that the polysilicon layer PS1 remains only inside the trench portion DTR and the inside of the trench portion DTR is filled with the polysilicon layer PS1).

Figure 9:
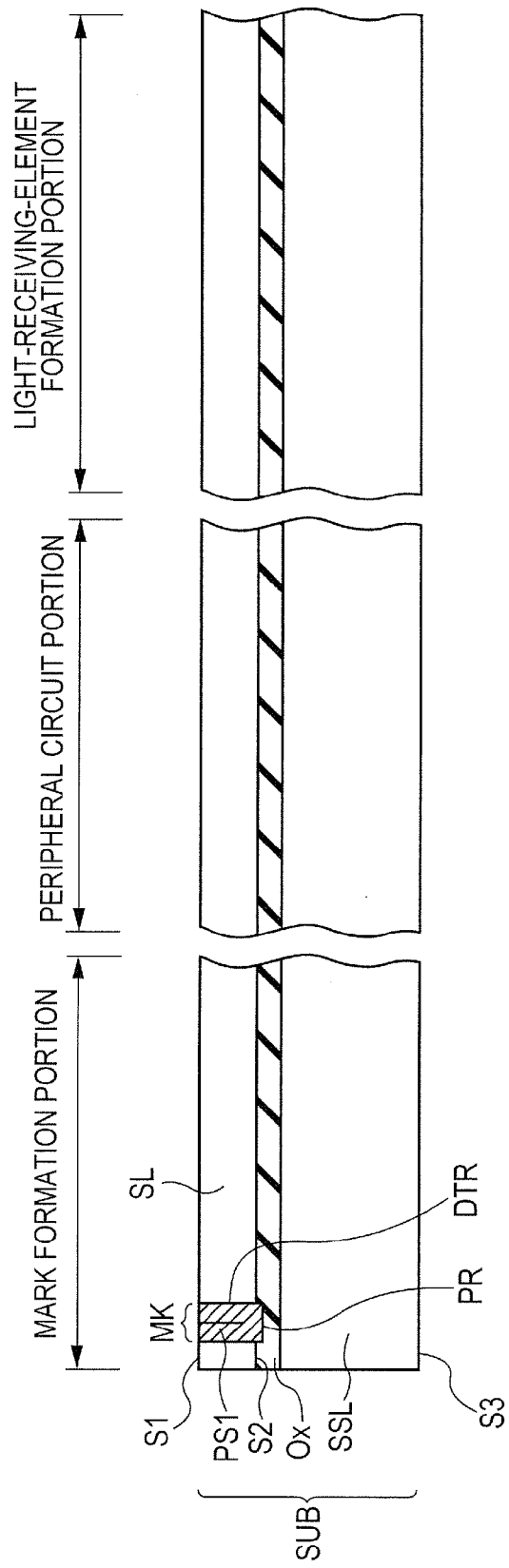
FIG. 9 is a schematic cross-sectional view showing the forth step of the manufacturing method of the semiconductor device in the first example of Embodiment 1 shown in FIG. 5.

As shown in FIG. 9, the silicon oxide film HOx is removed by etching using a chemical solution of, e.g., a hydrofluoric acid or the like. In this manner, the alignment mark MK comprised of the polysilicon layer PS1 inside the trench portion DTR is formed.

Figure 10:
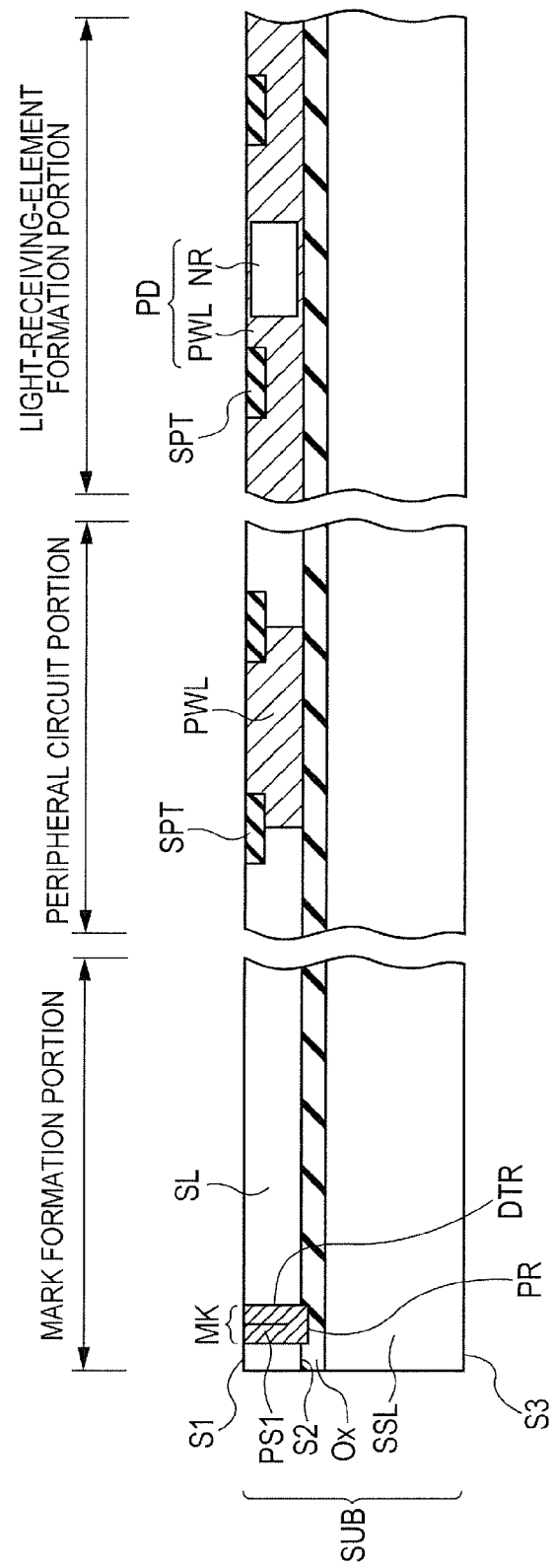
FIG. 10 is a schematic cross-sectional view showing the fifth step of the manufacturing method of the semiconductor device in the first example of Embodiment 1 shown in FIG. 5.

As shown in FIG. 10, particularly in, e.g., the light-receiving-element formation portion and the peripheral circuit portion of the semiconductor substrate SUB, a plurality of isolation regions SPT are formed in the main surface S1 to be spaced from each other. Each of the isolation regions SPT may be formed by, e.g., a so-called junction isolation method or a LOCOS (Local Oxidation of Silicon) method or may also be a so-called STI (Shallow Trench Isolation).

After the isolation regions SPT are formed, a p-type well region PWL of the light-receiving-element formation portion is formed by implanting, e.g., boron (B) or the like using a typical ion implantation technique. Note that the p-type well region PWL may be formed before the isolation regions SPT are formed or, alternatively, the isolation regions SPT may be formed after the p-type well region PWL is formed and then the p-type well region PWL may also be implanted again. At this time, the p-type well region PWL may be formed simultaneously (or in a different step) also in the region of the peripheral circuit portion where the NMOS transistor is formed.

Next, to form an n-type region NR of each of the photodiodes PD in the light-receiving-element formation portion, e.g., phosphorus (P) ions as an n-type impurity are introduced using a typical ion implantation technique into a predetermined region of the p-type well region PWL in the light-receiving-element formation portion. In this manner, in the light-receiving-element formation portion, the (plurality of) photodiodes PD are formed. Also, an impurity for adjusting the threshold voltage of the NMOS transistor formed in the peripheral circuit portion is implanted, though not shown. Furthermore, in the region (peripheral circuit portion of FIG. 10) where a PMOS transistor for forming a CMOS circuit is to be formed, an impurity for forming an n-type well region or adjusting the threshold voltage of the PMOS transistor is implanted.

Figure 11:
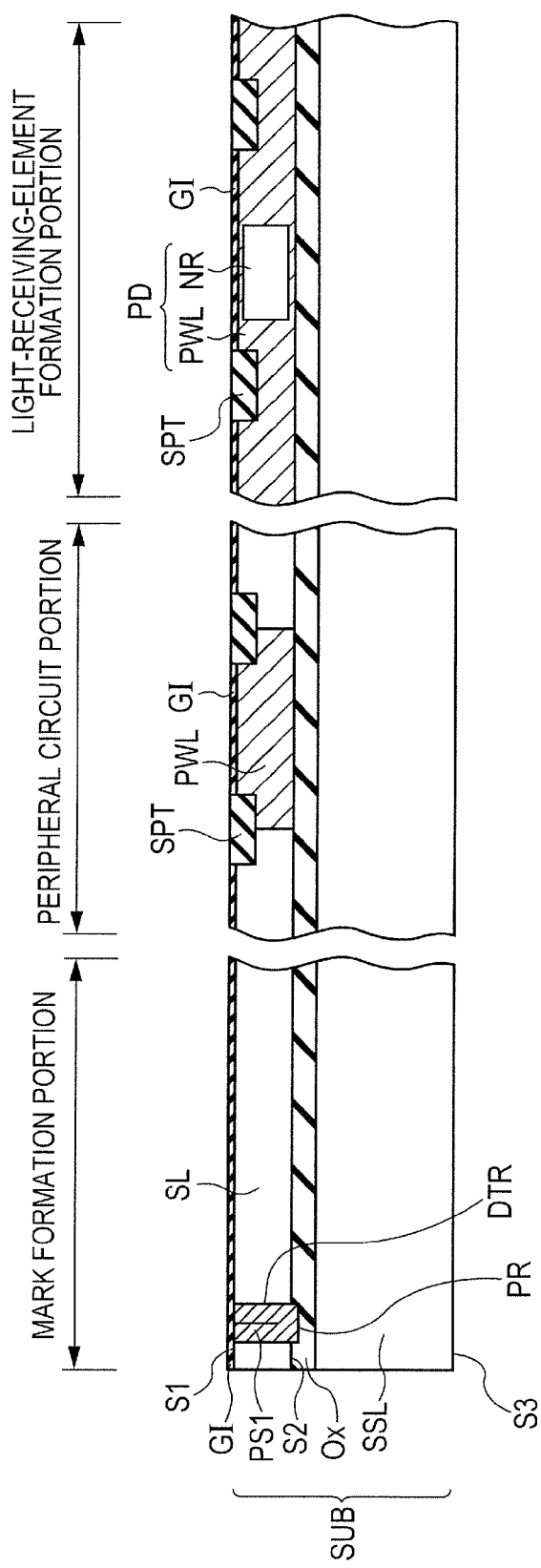
FIG. 11 is a schematic cross-sectional view showing the sixth step of the manufacturing method of the semiconductor device in the first example of Embodiment 1 shown in FIG. 5.

As shown in FIG. 11, by, e.g., a typical thermal oxidation method, over the front main surface S1, an insulating film GI comprised of a silicon oxide film is formed.

Figure 12:
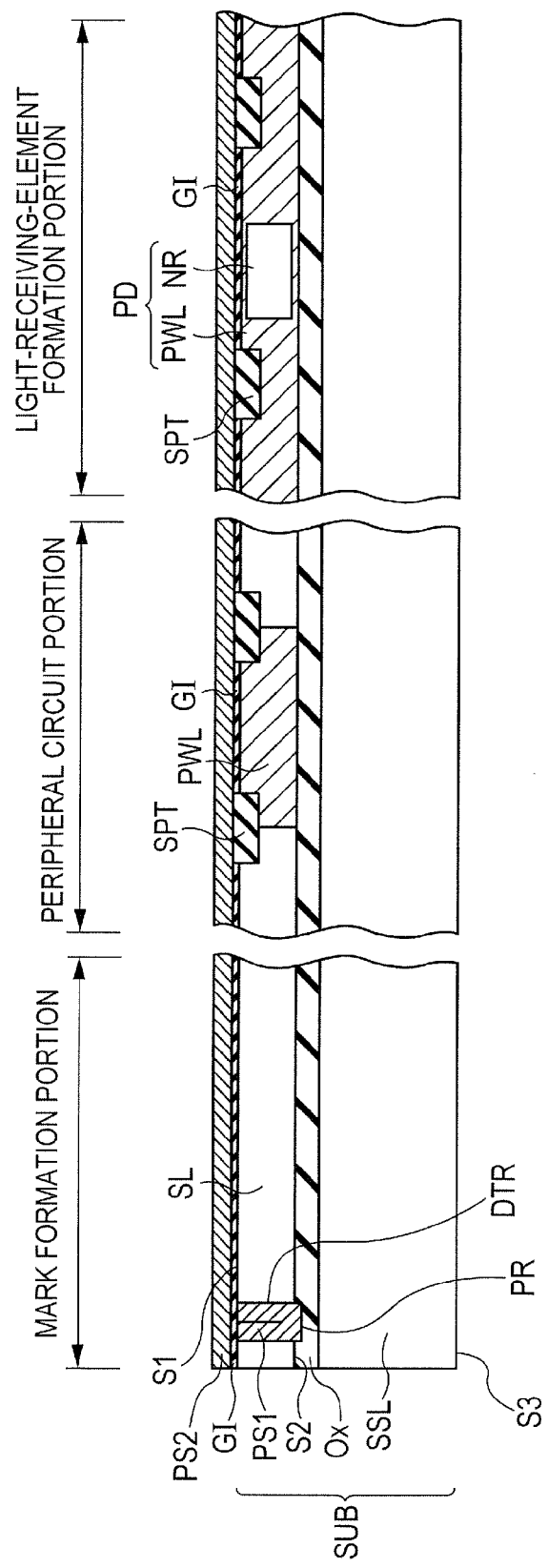
FIG. 12 is a schematic cross-sectional view showing the seventh step of the manufacturing method of the semiconductor device in the first example of Embodiment 1 shown in FIG. 5.

As shown in FIG. 12, by, e.g., a CVD method, a thin film of, e.g., polysilicon is formed so as to cover the front main surface S1 formed with the insulating film GI. Here, it is preferable to introduce, e.g., a phosphine ($PH_3$) gas, and then perform CVD treatment. Thus, a polysilicon layer PS2 containing an n-type impurity is formed. Note that, instead of the polysilicon layer PS2, a so-called amorphous silicon film may also be formed. Alternatively, it may also be possible to use a method in which the polysilicon layer PS2 or an amorphous silicon film not containing an impurity is formed, and then the thin film is doped with an impurity using a typical ion implantation technique. That is, a method of forming the polysilicon layer PS2 formed here is the same as the method of forming the polysilicon layer PS1 as the first layer in the step of FIG. 7.

Figure 13:
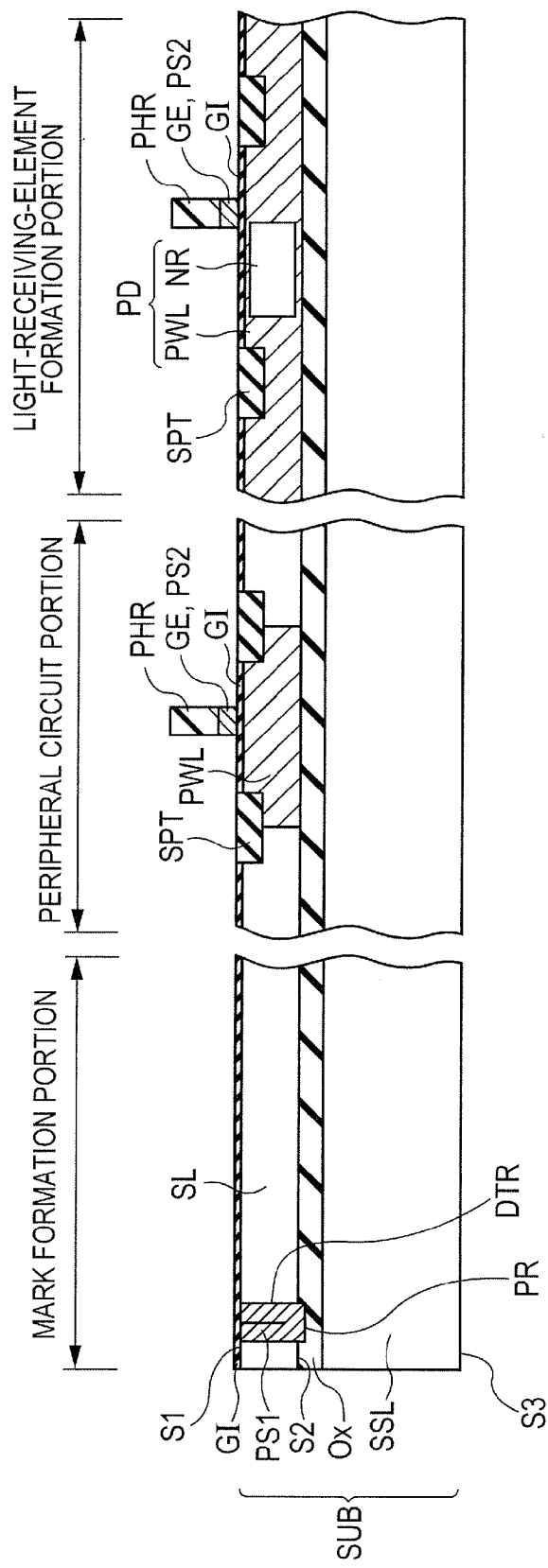
FIG. 13 is a schematic cross-sectional view showing the eighth step of the manufacturing method of the semiconductor device in the first example of Embodiment 1 shown in FIG. 5.

As shown in FIG. 13, according to a typical photoengraving technique, a pattern of a photoresist PHR using a known photosensitive agent is formed. Using the photoresist PHR as a mask, the polysilicon layer PR2 (or amorphous silicon film) is etched to form the gate electrodes GE. The etching of the polysilicon layer PS2 is performed by, e.g., a typical RIE method. Thereafter, the photoresist PHR is removed, though not shown. As a result, the insulating film GI in the region except immediately under the gate electrodes GE is removed, while the remaining insulating film GI serves as the gate insulating films GI.

Next, using a photoresist formed by a typical photoengraving technique as a mask, an impurity for forming a source region, a drain region, and the like in predetermined regions in the semiconductor layer SL is introduced by, e.g., an ion implantation method. In some cases, so-called LDD (lightly Doped Drain) regions may also be formed as parts of the source/drain regions of the NMOS transistor. Further, using a CVD method, the sidewall spacers of the transistor and a protective film for the photodiodes PD are formed.

Then, by typical heat treatment, the implanted impurities are activated to form the source/drain regions. These source/drain regions, sidewall spacers, and the like are not shown.

The photodiodes PD (source regions), the drain regions, the gate electrodes GE, and the gate insulating films GI form the plurality of transfer transistors TG (see FIG. 5) in the light-receiving-element formation portion.

Figure 14:
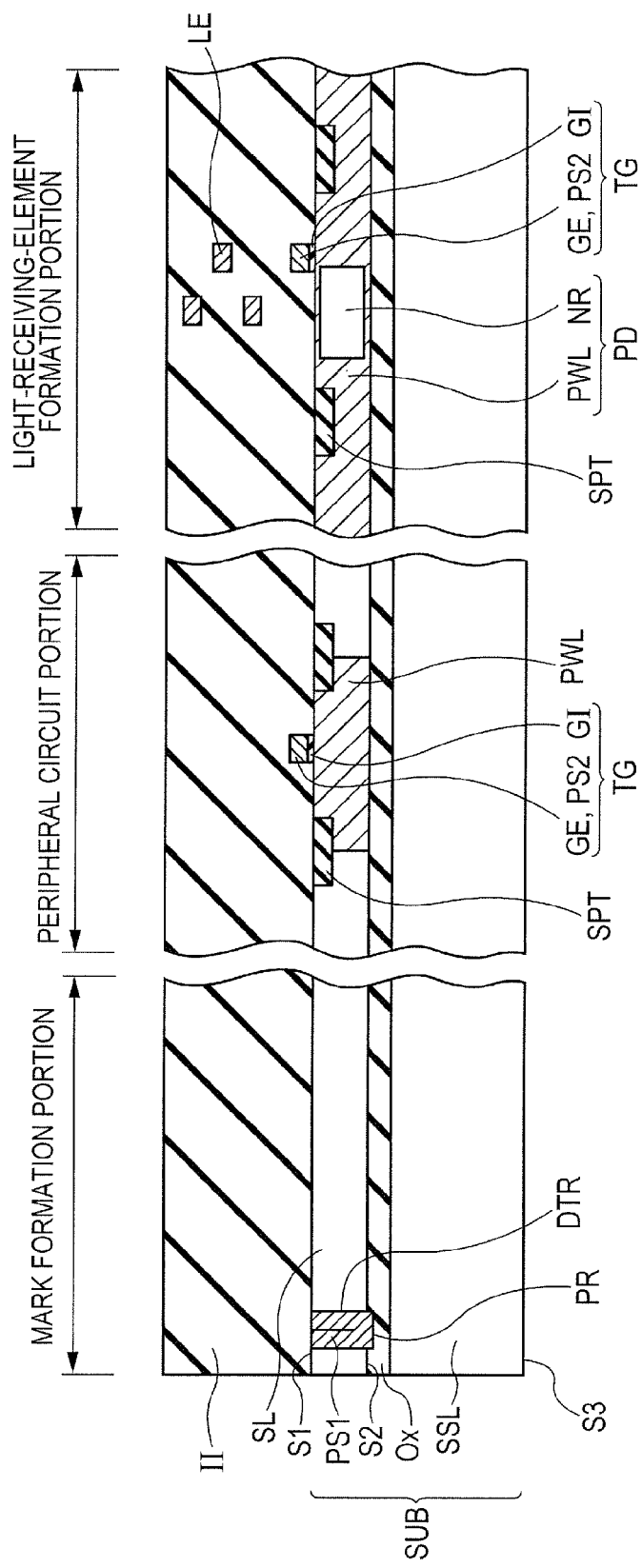
FIG. 14 is a schematic cross-sectional view showing the ninth step of the manufacturing method of the semiconductor device in the first example of Embodiment 1 shown in FIG. 5.

As shown in FIG. 14, using a typical multilevel wiring layer formation process, the metal wires LE and the interlayer insulating layer II are formed at predetermined positions. The metal wires LE are formed as, e.g., a thin film of a metal such as, e.g., aluminum, and the interlayer insulating layer II is comprised of, e.g., a silicon oxide film. The uppermost surface of the interlayer insulating layer II is polished by, e.g., CMP (Chemical Mechanical Polishing) to be planarized.

Figure 15:
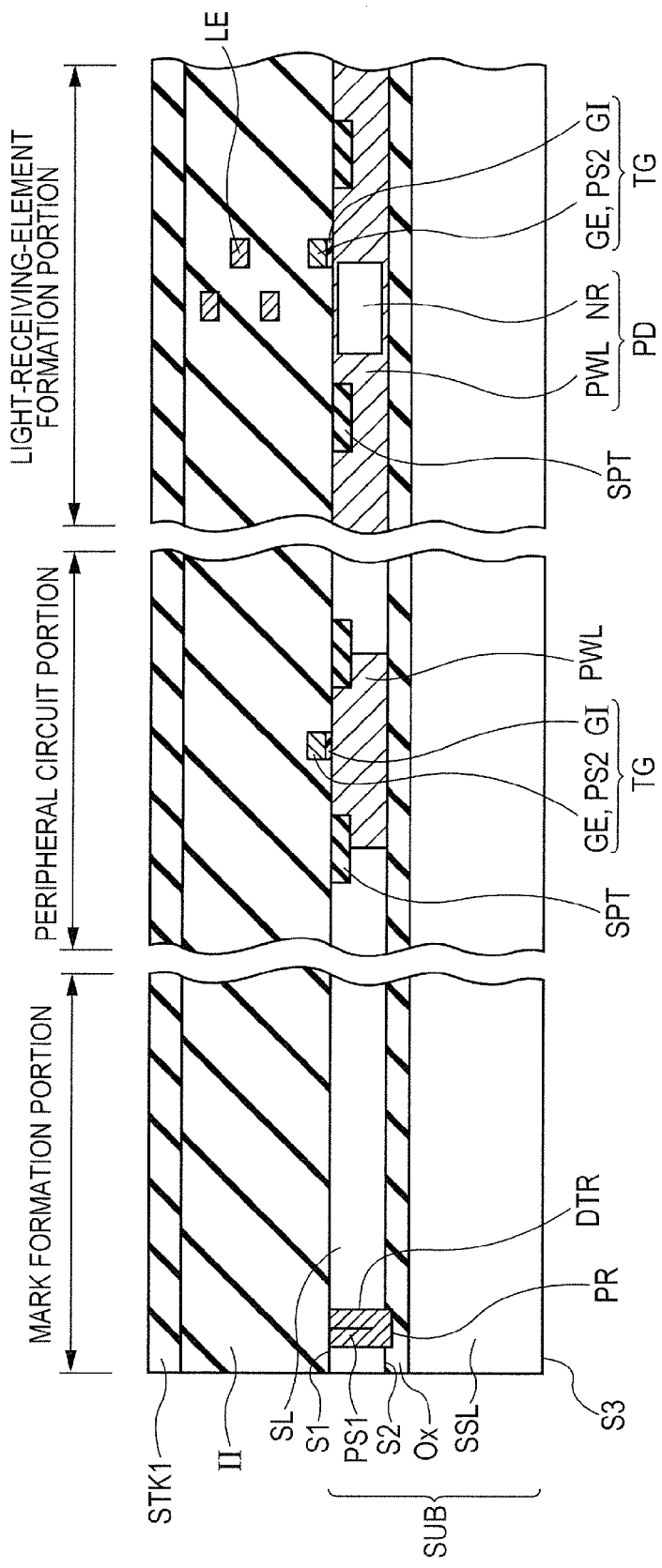
FIG. 15 is a schematic cross-sectional view showing the tenth step of the manufacturing method of the semiconductor device in the first example of Embodiment 1 shown in FIG. 5.

As shown in FIG. 15, over the uppermost surface of the interlayer insulating layer II polished by, e.g., CMP to be planarized, the adhesive layer STK1 comprised of, e.g., a silicon oxide film is formed. The adhesive layer STK1 is a silicon oxide film formed over the uppermost surface of the interlayer insulating layer II using, e.g., a plasma CVD method.

Figure 16:
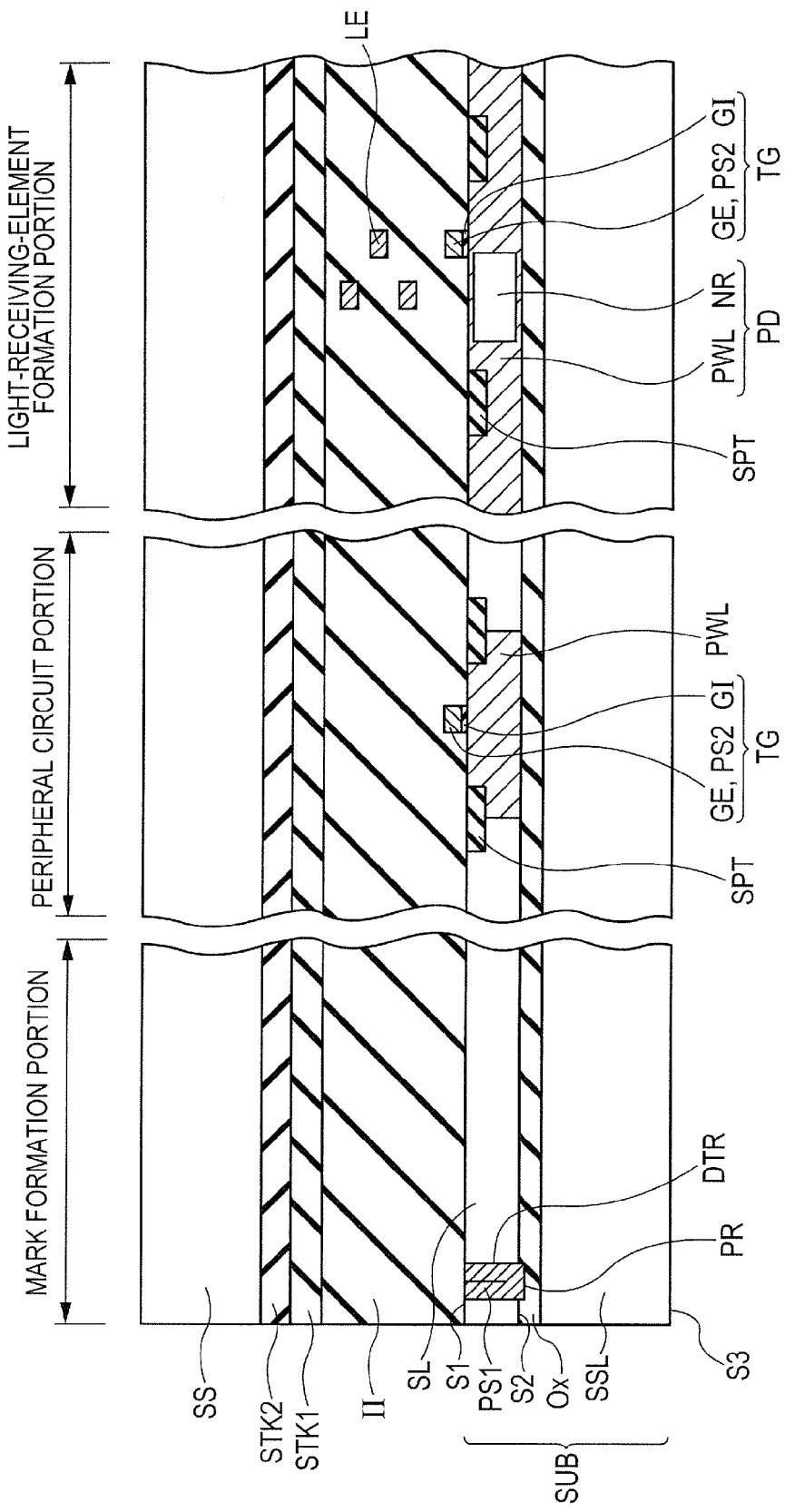
FIG. 16 is a schematic cross-sectional view showing the eleventh step of the manufacturing method of the semiconductor device in the first example of Embodiment 1 shown in FIG. 5.

As shown in FIG. 16, the supporting substrate SS made of, e.g., single-crystal silicon containing an n-type impurity, which is different from the semiconductor substrate SUB, is prepared. Over one of the main surfaces of the supporting substrate SS, the adhesive layer STK2 comprised of, e.g., a silicon oxide film is formed by the same procedure as used to form the adhesive layer STK1. Then, the adhesive layers STK1 and STK2 are brought into a state where they are in contact with and opposing each other, and bonded to each other using a typical bonding technique.

Figure 17:
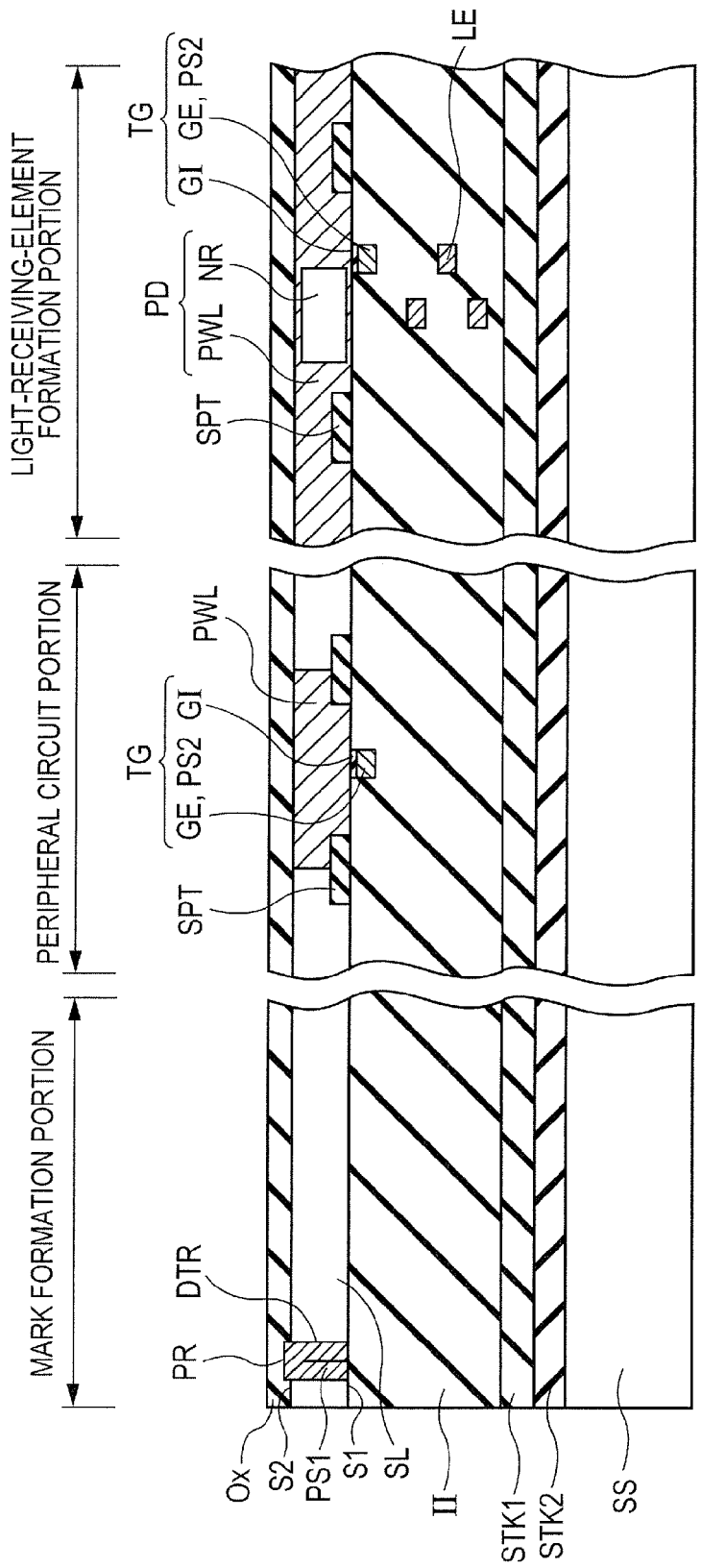
FIG. 17 is a schematic cross-sectional view showing the twelfth step of the manufacturing method of the semiconductor device in the first example of Embodiment 1 shown in FIG. 5.

As shown in FIG. 17, the laminate structure of FIG. 16 is vertically inverted, and the sub-substrate SSL is removed by polishing starting at the main surface S3 (in other words, from the main surface S3 to the upper surface of the insulating film layer Ox) so as to expose at least the upper surface of the insulating film layer Ox. Here, the removal by polishing is preferably performed by, e.g., a CMP method, a RIE method, or a back-grind method, but may also be performed by appropriately combining these individual methods. Here, the upper surface of the insulating film layer Ox means the surface of the insulating film layer Ox closest to the main surface S3 (the lowermost surface in FIG. 17).

Thereafter, while using the alignment mark MK formed to have the protruding portion PR protruding in the direction of the planarizing layer Ox for alignment relative to the back main surface S2 of the semiconductor layer SL, the color filters FLT and the on-chip lenses LNS are formed at predetermined positions (e.g., positions two-dimensionally overlapping the photodiodes PD) over the planarizing layer Ox. By the foregoing process, the semiconductor device DEV having a form as shown in, e.g., FIG. 5 is formed.

Note that, after the sub-substrate SSL is removed by polishing so as to expose the insulating film layer Ox in the step of FIG. 17, an extra insulating film layer Ox may also be formed by a generally known method so as to cover the upper surface of the exposed insulating film layer Ox. Alternatively, in the step of FIG. 17, the insulating film layer Ox may also be removed or, after the insulating film layer Ox is removed, an extra insulating film layer Ox may be formed by a generally known method so as to cover the alignment mark MK.

Here, in FIG. 5, the depiction of the gate insulating films GI and the isolation regions SPT shown in, e.g., FIG. 17 is omitted. Also, the photodiodes PD are schematically illustrated by omitting the p-type well region PWL and diagrammatically showing the n-type region NR. For example, in the region interposed between the gate electrodes GE and the front main surface S1 shown in FIG. 5, the gate insulating films GI of FIG. 17 are actually formed and, between the adjacent gate electrodes GE of FIG. 5, the isolation regions SPT are formed.

Figure 18:
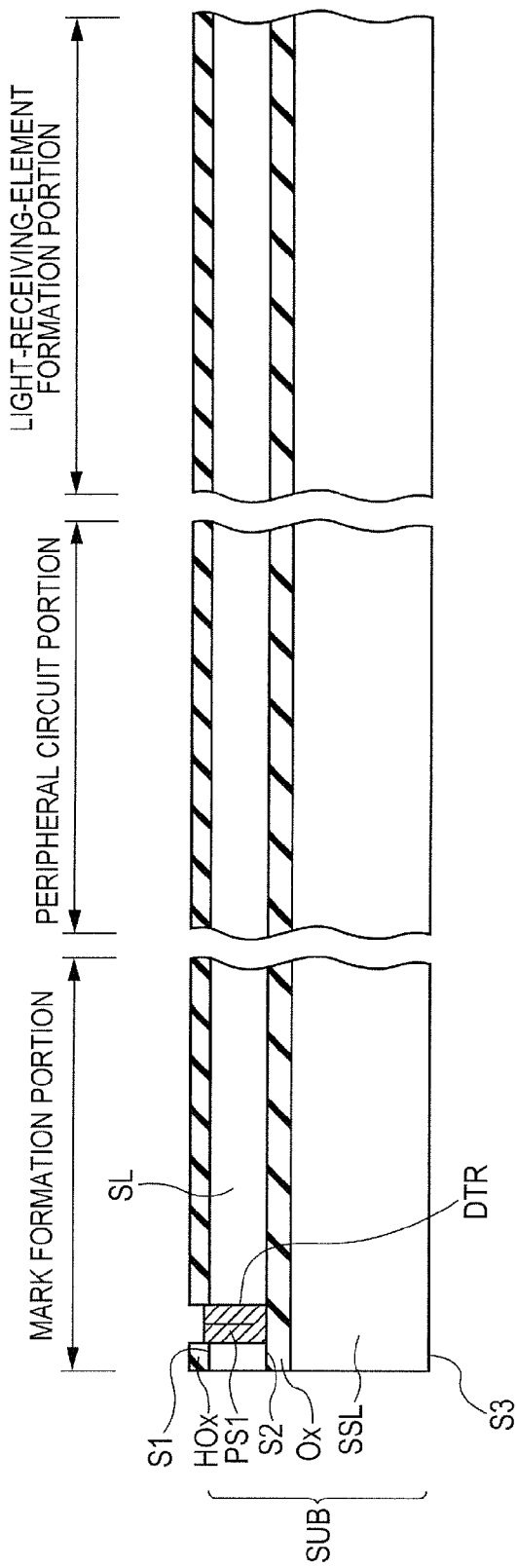
FIG. 18 is a schematic cross-sectional view showing a step for reference to be compared to the step of FIG. 8.

As shown in FIG. 18, the step shown in FIG. 18 is basically the same as the step shown in FIG. 8, but is different from the step of FIG. 8 in that the trench portion DTR is formed to extend through the semiconductor layer SL and reach the insulating film layer Ox, but not to reach the inside of the insulating film layer Ox. In this case, if the same treatment as in FIGS. 9 to 17 described above is performed after the step of FIG. 18, the semiconductor device DEV which is the same as in FIG. 5 except that the alignment mark MK does not have the protruding portion PR is formed.

Figure 19:
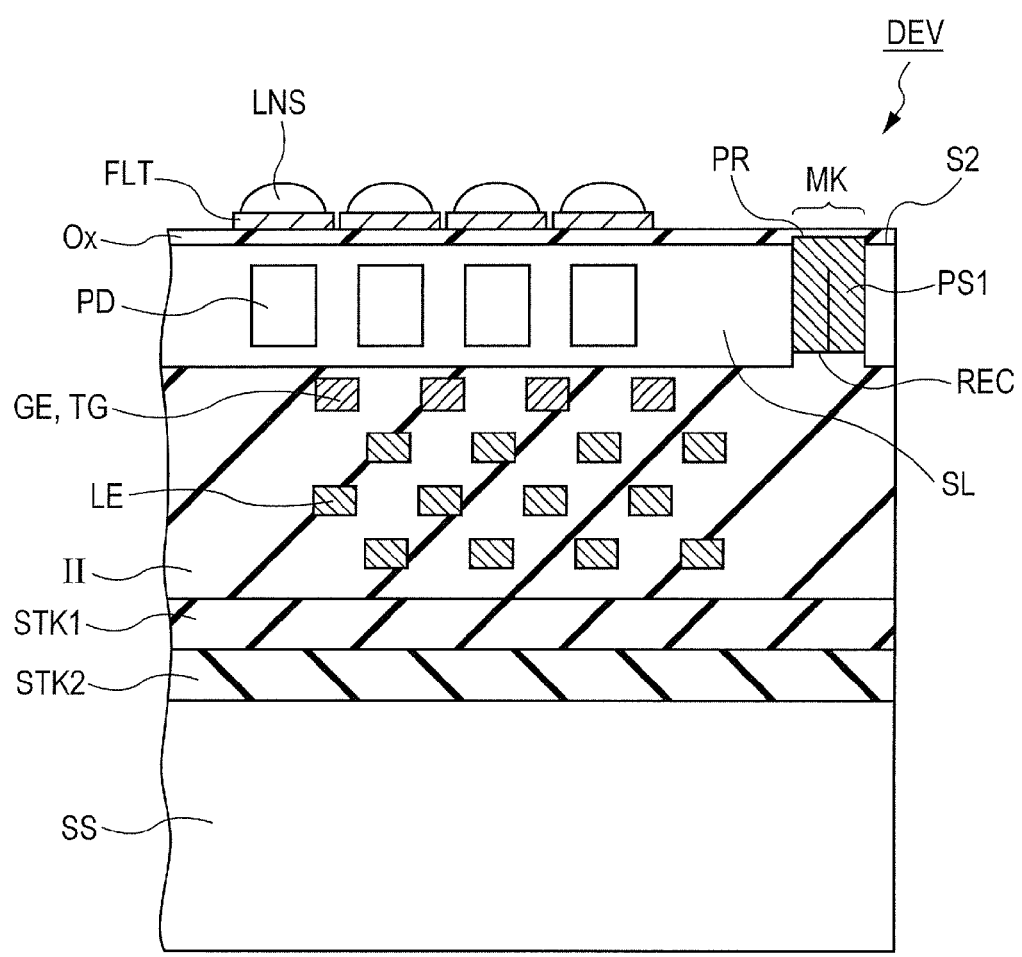
FIG. 19 is a schematic cross-sectional view showing a form of the light-receiving-element formation portion in which the photodiodes, the transistors, and the second example of the form of the alignment mark are formed in the semiconductor device according to Embodiment 1.

As shown in FIG. 19, the semiconductor device DEV according to the second example of Embodiment 1 has substantially the same configuration as that of the semiconductor device DEV of the first example of FIG. 5, but is different from the semiconductor device DEV of the first example in that the alignment mark MK has a recessed portion REC formed so as to be recessed from the front main surface S1 toward where the on-chip lenses LNS are disposed (toward the upper side of the drawing).

Figure 20:
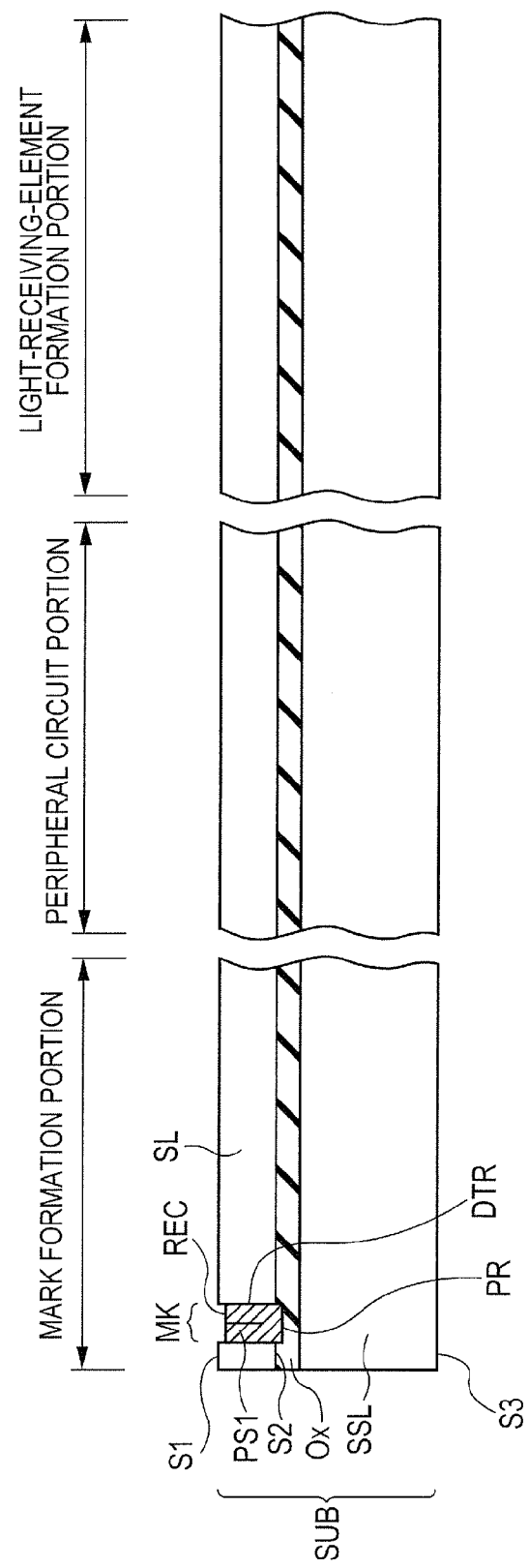
FIG. 20 is a schematic cross-sectional view showing a step of a manufacturing method of the semiconductor device in the second example of Embodiment 1 shown in FIG. 19.

As shown in FIG. 20, during the etching back of the polysilicon layer PS1 shown in FIG. 8 in the first example, a depressed portion may be formed such that the polysilicon layer PS1 is recessed from the front main surface S1 toward the back main surface S2 (toward the lower side of the drawing). Consequently, in a finally formed product, the interlayer insulating layer II of, e.g., FIG. 14 is formed so as to cover the recessed portion REC to eventually result in the form shown in FIG. 19.

In this case, inside the trench portion DTR, a stepped portion (recessed portion REC) is formed between the uppermost surface (uppermost surface of the polysilicon layer PS1 in FIG. 20) of the first layer forming the alignment mark MK and the front main surface S1. The alignment mark MK having the shape shown in FIG. 20 is formed by more excessively etching the polysilicon layer PS1 (in the downward direction of the drawing) in the step of etching back the polysilicon layer PS1 shown in, e.g., FIG. 8 than in the case of FIG. 8.

For example, in the etch-back step of FIG. 8, the uppermost surface of the thin film forming the alignment mark MK after the etch-back process is not necessarily processed to have the same height as that of the main surface S1 (to be flush with the main surface S1). In particular, as shown in FIG. 20, instead of being formed into the form of FIG. 9, the alignment mark MK (polysilicon layer PS1) may also be formed such that the uppermost surface of the polysilicon layer PS1 is recessed from the front main surface S1 of the semiconductor layer SL. In this case, in the steps including and subsequent to the step of FIG. 10, by visually recognizing the recess in the uppermost surface of the alignment mark MK, the alignment mark MK can also be used for, e.g., alignment during the formation of the isolation regions SPT and the photodiodes PD. That is, the recess in the front main surface S1 of the alignment mark MK allows the alignment mark MK to be used for alignment during processing on the main surface S1 side in the steps subsequent to the step of forming the alignment mark MK. Therefore, the alignment mark MK can be used for each of processing on the back main surface S2 side and processing on the front main surface S1 side.

Figure 21:
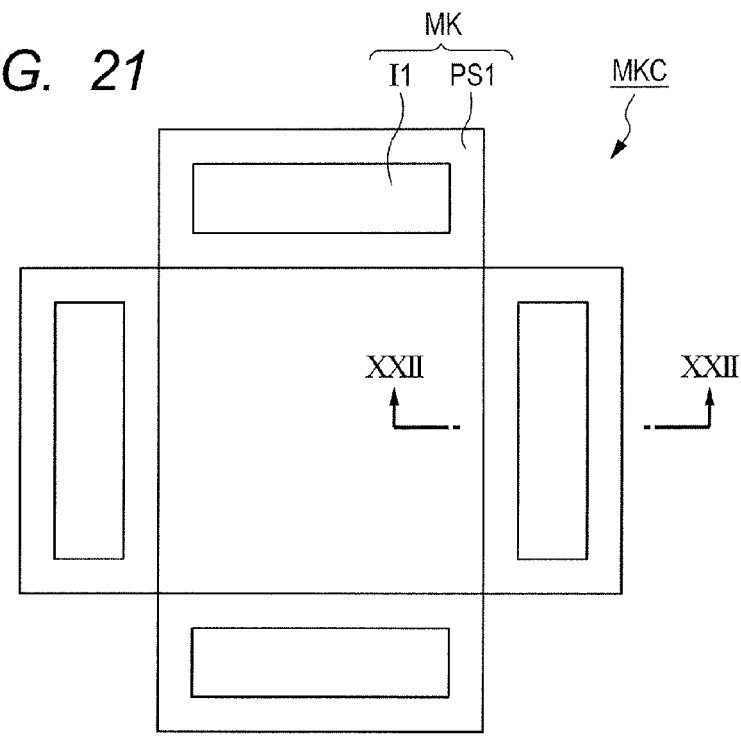
FIG. 21 is a schematic enlarged view showing the third example of the two-dimensional form of the alignment mark in Embodiment 1.
Figure 22:
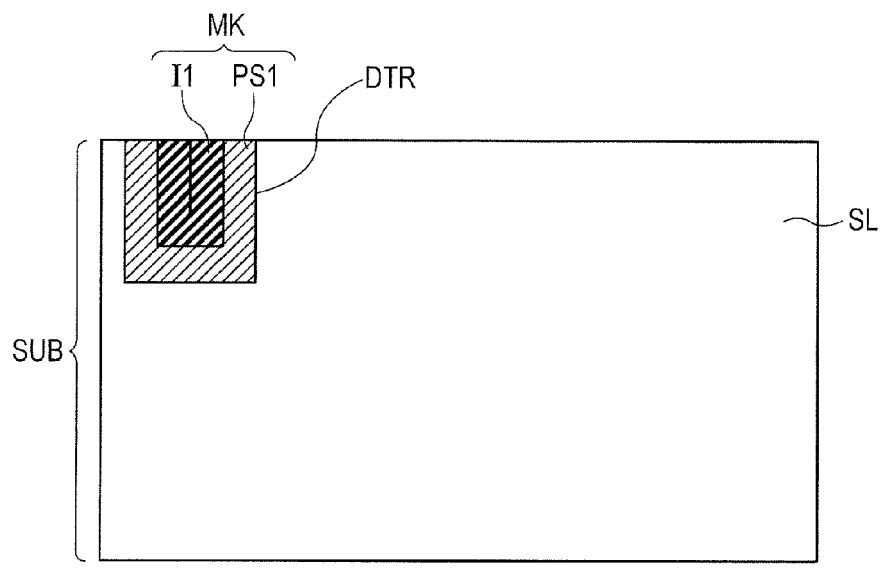
FIG. 22 is a schematic cross-sectional view showing the third example of the form of the alignment mark in Embodiment 1 in the portion along the line XXII-XXII of FIG. 21.

As shown in FIGS. 21 and 22, in the third example of Embodiment 1, the alignment marks MK (individual alignment marks MK included in the alignment mark set MKC) are each formed of two layers including the first layer embedded in at least a part of the inside of the trench portion DTR, such as the polysilicon layer PS1, and a second layer, such as the insulating layer I1. Thus, each of the alignment marks MK may also include the foregoing first and second layers. In this case, the second layer I1 is formed inwardly of the first layer PS1.

In this case, it is preferable that the first layer (polysilicon layer PS1) is made of a material containing silicon or a metal material, and the second layer (insulating layer I1) is comprised of an insulating film such as, e.g., a silicon oxide film or a silicon nitride film. Thus, FIGS. 21 and 22 are different from FIGS. 3 and 4 in that the alignment mark MK is formed of the polysilicon layer PS1 and the insulating layer I1 inward thereof.

Note that, in FIG. 22, the cross-sectional shape of the alignment mark of FIG. 21 is particularly emphatically shown so that the semiconductor substrate SUB of FIG. 22 does not necessarily correspond to the form of the semiconductor substrate of FIG. 21.

Figure 23:
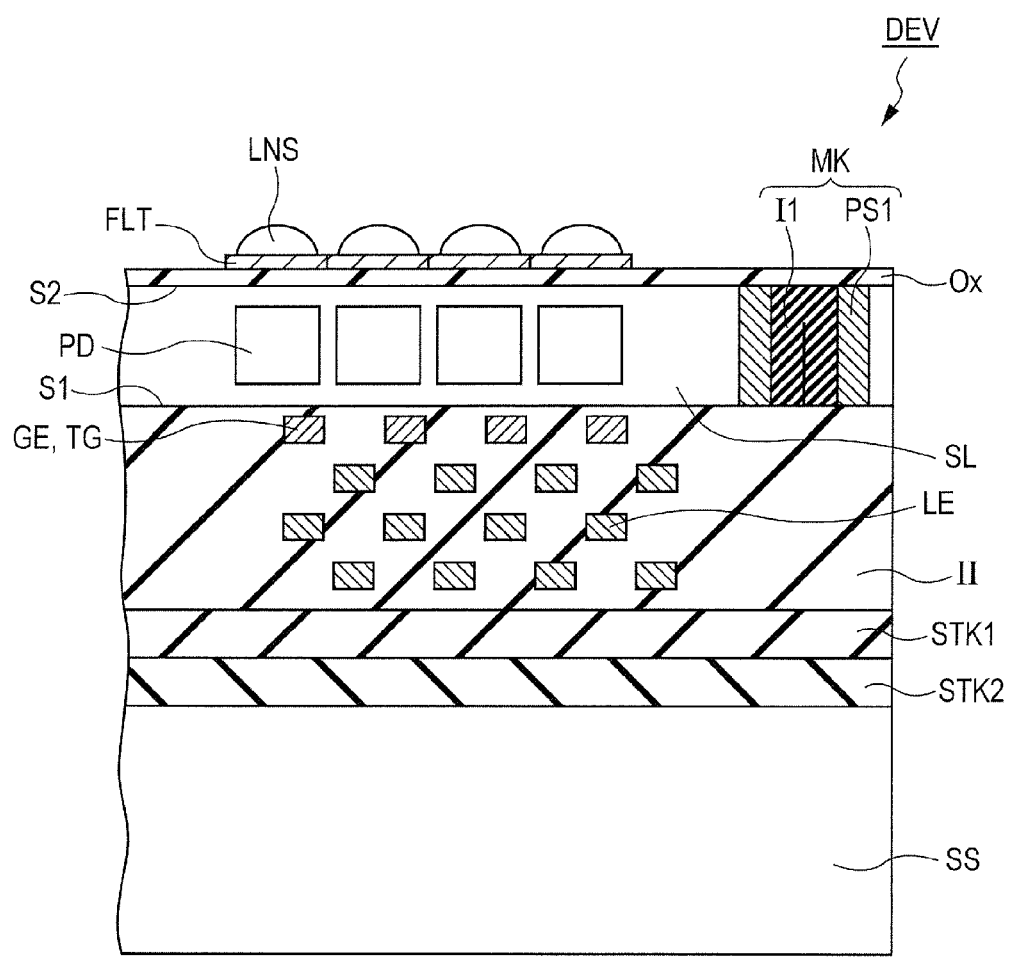
FIG. 23 is a schematic cross-sectional view showing a form of the light-receiving-element formation portion in which the photodiodes, the transistors, and the third example of the form of the alignment mark are formed in the semiconductor device according to Embodiment 1.

As shown in FIG. 23, the alignment mark MK in the semiconductor device DEV according to the foregoing third example is formed to extend from the front main surface S1 of the semiconductor layer SL through the semiconductor layer SL in the thickness direction of the semiconductor layer SL and reach the back main surface S2 such that the bottom surface (uppermost surface in FIG. 23) of the alignment mark MK and the back main surface S2 are in the same plane. Here, the polysilicon layer PS1 and the insulating layer I1 each included in the alignment mark MK are formed such that the bottom surfaces (uppermost surfaces in FIG. 23) thereof and the back main surface S2 are in the same plane.

In addition, the alignment mark MK of FIG. 23 has substantially the same height (i.e., there is no level difference between the alignment mark MK and the main surface S1) as that of the front main surface S1 of the semiconductor layer SL. If it is possible to visually recognize the mark MK from above (from over the back main surface S2 of the semiconductor layer SL), as shown in FIG. 23, the alignment mark MK may also be formed such that the alignment mark MK and the back main surface S2 have no level difference therebetween and are in the same plane.

The configuration of FIG. 23 is different from the configuration of FIG. 5 only in the form of the foregoing alignment mark MK and otherwise the same as the configuration of FIG. 5. Therefore, the description of the same components will not be repeated by providing them with the same reference numerals.

Figure 24:
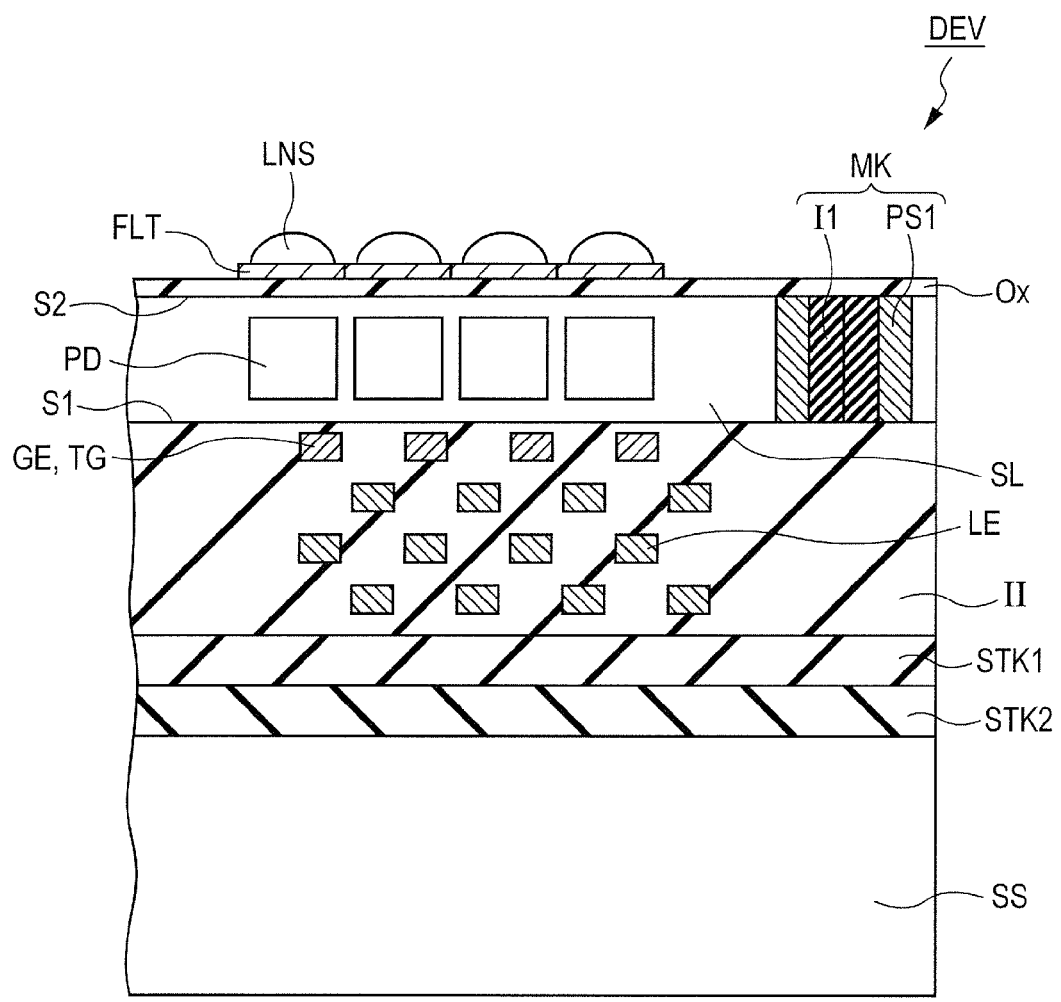
FIG. 24 is a schematic cross-sectional view showing another form of the light-receiving-element formation portion in which the photodiodes, the transistors, and the third example of the form of the alignment mark are formed in the semiconductor device according to Embodiment 1, which is different from the form of FIG. 23.

As shown in FIG. 24, as a modification of the alignment mark MK of the foregoing third example, the insulating layer I1 may also have a form in which the whole insulating layer I1 is divided from the front main surface S1 to the back main surface S2. The difference between the configurations of FIGS. 23 and 24 will be described later.

Next, with reference to FIGS. 25 to 29, a description will be given of a manufacturing method of the alignment mark MK particularly according to the third example (shown in FIG. 23) in the semiconductor device of Embodiment 1.

Figure 25:
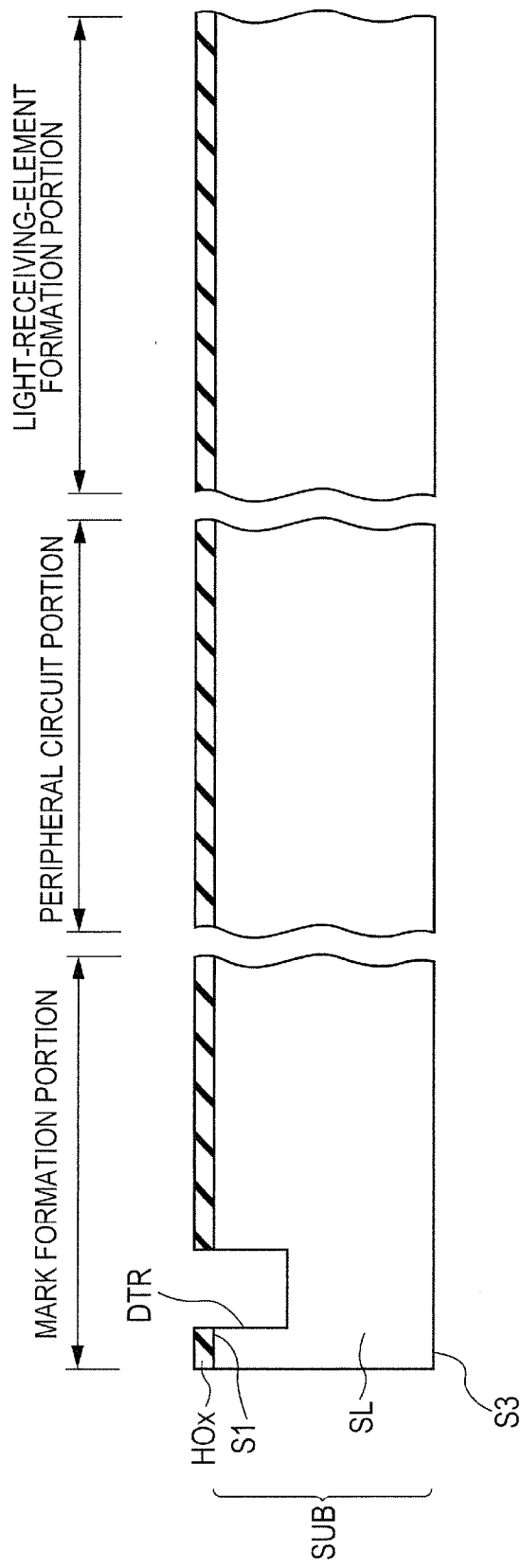
FIG. 25 is a schematic cross-sectional view showing the first step of a manufacturing method of the semiconductor device in the third example of Embodiment 1 shown in FIG. 23.

As shown in FIG. 25, the semiconductor substrate SUB is prepared first. The semiconductor substrate SUB has the front main surface S1 (first main surface), and the main surface S3 (third main surface) opposing the main surface S1. By way of example, the semiconductor substrate SUB is made of single-crystal silicon having an n-type impurity.

Next, in the same manner as in the step of FIG. 6, an insulating film such as, e.g., the silicon oxide film HOx is formed by, e.g., a CVD (Chemical Vapor Deposition) method so as to cover the main surface S1 (front main surface S1 of the semiconductor layer SL) of the semiconductor substrate SUB, and then patterned in the same manner as in the step of FIG. 6. Preferably, the silicon oxide film HOx has a thickness of not less than 200 nm and not more than 400 nm. More preferably, by way of example, the silicon oxide film HOx has a thickness of 300 nm (not less than 250 nm and not more than 350 nm).

By performing typical etching on the semiconductor substrate SUB using the patterned silicon oxide film HOx as a hard mask (trench processing mask), the trench portion DTR is formed so as to extend from the uppermost main surface of the silicon oxide film HOx through the silicon oxide film HOx and reach the inside of the semiconductor substrate SUB. Preferably, the trench portion DTR is formed such that the depth (in the vertical direction of the drawing) thereof from the main surface S1 of the semiconductor substrate SUB is not less than 2 μm and not more than 5 μm and the width (in the left-right direction of the drawing) thereof is not less than 0.2 μm and not more than 1.0 μm, an example of which is 0.5 μm (not less than 0.5 μm and not more than 0.8 μm).

Figure 26:
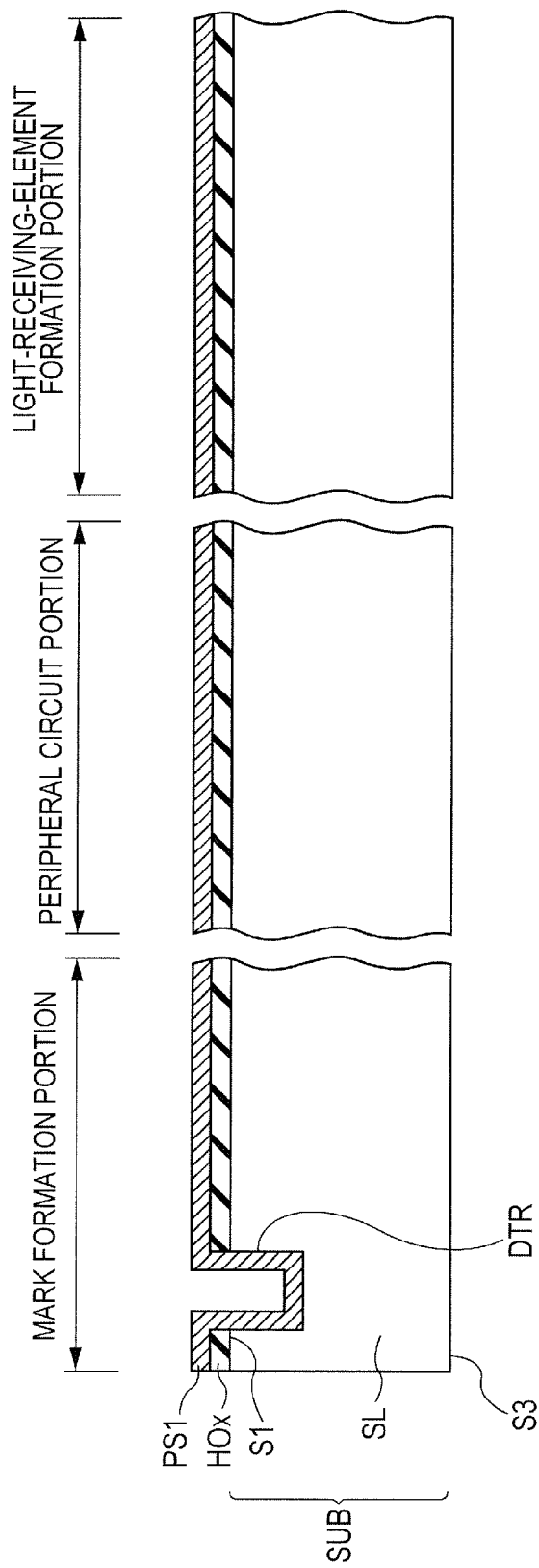
FIG. 26 is a schematic cross-sectional view showing the second step of the manufacturing method of the semiconductor device in the third example of Embodiment 1 shown in FIG. 23.

As shown in FIG. 26, a conductive film or a semiconductor film (first layer) such as, e.g., the polysilicon layer PS1 is formed over the main surface S1 (so as to cover the inner peripheral wall surface of the trench portion DTR and the upper surface of the hard mask oxide film HOx) by, e.g., a CVD method. The first layer formed here is the same as the first layer in the step of FIG. 7.

Figure 27:
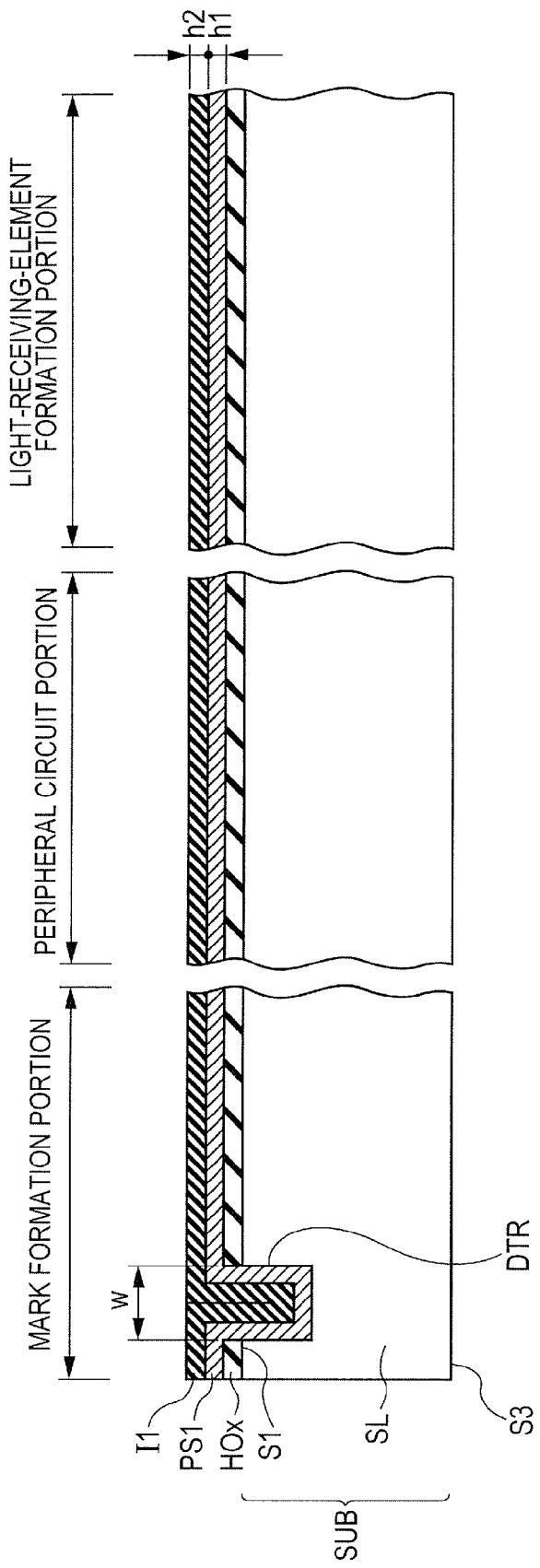
FIG. 27 is a schematic cross-sectional view showing the third step of the manufacturing method of the semiconductor device in the third example of Embodiment 1 shown in FIG. 23.

As shown in FIG. 27, the insulating layer I1 (second layer) comprised of, e.g., a silicon oxide film or a silicon nitride film is formed so as to cover the upper surface of the polysilicon layer PS1 formed in FIG. 26. In the case of using, e.g., a silicon oxide film, a so-called TEOS oxide film is deposited using a CVD method. At this time, the thickness thereof is preferably controlled to be not less than 200 nm and not more than 400 nm, and more preferably controlled to be 300 nm (not less than 250 nm and not more than 350 nm) by way of example.

By the foregoing process, the upper surface of the front main surface S1 of the semiconductor substrate SUB and the inner peripheral wall surface of the trench portion DTR are covered with the polysilicon layer PS1 and the insulating layer I1. The insulating layer I1 is formed subsequently to the polysilicon layer PS1. Here also, in the same manner as in the step of FIG. 7, the inside of the trench portion DTR (particularly the bottom surface and vicinity thereof) is preferably filled with the polysilicon layer PS1 and the insulating layer I1. To achieve this, if the width of the trench portion DTR (the width of the trench portion DTR in the left-right direction of the drawing) is w, the thickness of the polysilicon layer PS1 is h1, and the thickness of the insulating layer I1 is h2 by way of example, it is preferable that $w \leq 2(h1+h2)$ is satisfied, i.e., the foregoing width w is not more than double the sum of the foregoing thicknesses h1 and h2.

Figure 28:
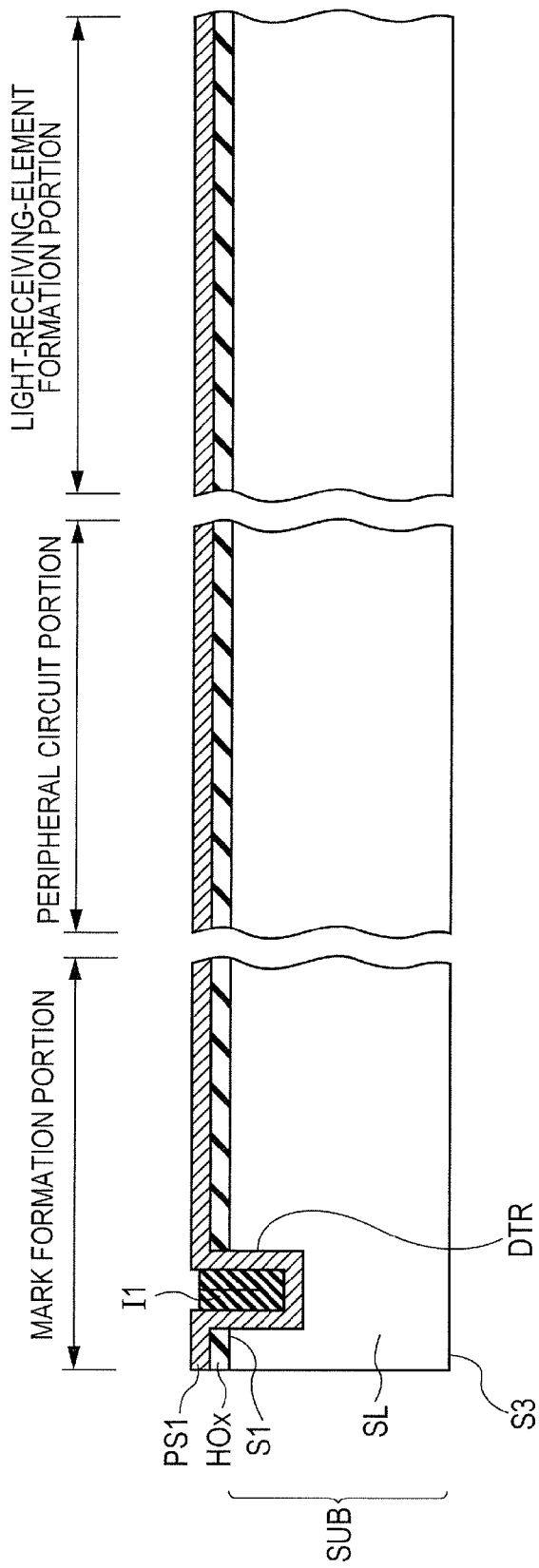
FIG. 28 is a schematic cross-sectional view showing the fourth step of the manufacturing method of the semiconductor device in the third example of Embodiment 1 shown in FIG. 23.

As shown in FIG. 28, the insulating layer I1 is etched back so that a pattern of the insulating layer I1 is formed. Specifically, by being etched back, the polysilicon layer PS1 and the insulating layer I1 each embedded inside the trench portion DTR are left and the polysilicon layer PS1 and the insulating layer I1 each located outside the trench portion DTR (particularly the polysilicon layer PS1 and the insulating layer I1 each located over the main surface S1 and parts of the polysilicon layer PS1 and the insulating layer I1 each located immediately above the inside of the trench portion DTR here) are removed. Here, the polysilicon layer PS1 and the insulating layer I1 each located over the main surface S1 may also be entirely removed. Preferably, the pattern of the insulating layer I1 is formed so as to include a part of the space immediately over the inside of the trench portion DTR. The insulating layer I1 is etched back to a position slightly below the uppermost surface of the polysilicon layer PS1.

Figure 29:
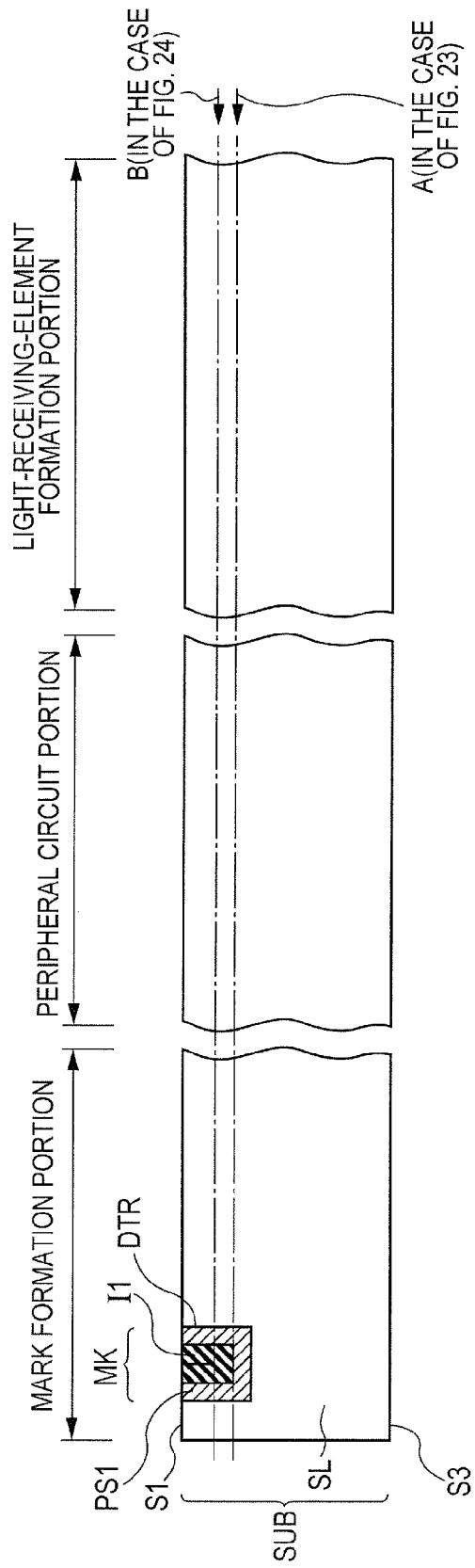
FIG. 29 is a schematic cross-sectional view showing the fifth step of the manufacturing method of the semiconductor device in the third example of Embodiment 1 shown in FIG. 23.

As shown in FIG. 29, the insulating layer I11 and the polysilicon layer PS1 each located outside the trench portion DTR are removed by the etch-back process. As a result, the polysilicon layer PS1 and the insulating layer I1 inward thereof are disposed inside the trench portion DTR to thus form the alignment mark MK. At this time, the silicon oxide film HOx is also removed by etching.

Subsequently, the same treatment as in the steps of FIGS. 10 to 17 is performed in the same manner as in the foregoing first example. That is, here also, the region of the semiconductor substrate SUB extending from the main surface S3 to the bottom portion of the alignment mark MK is removed in the same manner as in the step of FIG. 17. After the step of FIG. 17, the planarizing layer Ox is formed by a generally known method.

In the semiconductor substrate SUB used in the steps of FIGS. 25 to 29, the insulating film layer Ox as formed in the semiconductor substrate SUB in the steps of FIGS. 6 to 17 is not formed. However, the alignment mark MK formed in the steps of FIGS. 25 to 29 includes not only the polysilicon layer PS1 as the first layer, but also the insulating layer I1. Therefore, in the step of removing the region of the semiconductor substrate SUB extending from the main surface S3 to the bottom portion of the alignment mark MK by polishing (forming the semiconductor layer SL), which is performed after the step of FIG. 29, a part of the semiconductor substrate SUB is more preferably removed by polishing to, e.g., expose the insulating layer I1 of the alignment mark (using the insulating layer I1 as a stopper). By doing so, the removal of the semiconductor substrate SUB by polishing ends upon reaching the insulating layer I1 to allow easy control of the amount of the removal by polishing.

Here, in the same treatment as in the step shown in FIG. 17, if the semiconductor substrate SUB is removed to the region shown by the dot-dash line A of FIG. 29, the semiconductor device DEV having the alignment mark MK in the form shown in FIG. 23 is finally formed by the subsequent steps. Likewise, if the semiconductor substrate SUB is removed to the region shown by the dot-dash line B of FIG. 29 in the same treatment as in the step shown in FIG. 17, the semiconductor device DEV having the alignment mark MK in the form shown in FIG. 24 is finally formed. That is, the bottom portion of the alignment mark MK which is the end point of the removal by polishing here may be the lowermost portion of the insulating layer I1 of FIG. 29 or the lowermost portion of a linear region (linear boundary region formed through contact with the outermost growth surface of the insulating layer I1) formed through the turning back of the insulating layer I1.

However, even in the case where the semiconductor substrate SUB not having the insulating film layer Ox is used, when, e.g., the edge (boundary portion between the semiconductor layer SL and the alignment mark MK, which is a portion identical to the trench portion DTR) of the alignment mark MK is clearly visually recognizable, the semiconductor substrate SUB need not necessarily be removed by polishing so as to expose the insulating layer I1. In particular, when the alignment mark MK is formed of two layers including the polysilicon layer PS1 and the insulating layer I1, the presence of the insulating layer I1 allows easier visual recognition of the alignment mark MK than in the case where the alignment mark MK includes only one layer which is the polysilicon layer PS1.

For example, when the alignment mark MK including only the polysilicon layer PS1 as in the foregoing first example is viewed from the back main surface S2 side, the protruding portion PR as the stepped portion between the back main surface S2 and the bottom surface of the mark in the edge portion of the alignment mark MK is visually recognized. This is because, since the material of the polysilicon layer PS1 is the same as that of the semiconductor layer SL, if there is no level difference, visual recognition of the mark would be difficult.

On the other hand, in the alignment mark MK having a configuration in which, e.g., the same polysilicon layer PS1 as in the foregoing first example and the insulating layer I1 comprised of a silicon oxide film or a silicon nitride film are stacked as in the foregoing third example, the material of the insulating layer I1 is different from that of the semiconductor layer SL. Accordingly, even when there is no level difference, visual recognition of the mark is possible. Therefore, in the foregoing third example (FIG. 23), even when the protruding portion PR is not provided between the back main surface S2 and the bottom surface of the alignment mark MK (the uppermost surface of the alignment mark MK in FIG. 23), the alignment mark MK can be easily visually recognized.

For example, in the case where the alignment mark MK is formed only of the polysilicon layer PS1 as in the foregoing first and second examples, the semiconductor substrate SUB in which the alignment mark MK is formed preferably has a SOI structure having the insulating film layer Ox. If the semiconductor substrate SUB has the SOI structure, by removing the sub-substrate SSL by polishing so as to reach the inside of the insulating film layer Ox (such that the removal by polishing ends upon reaching the inside of the insulating film layer Ox), a configuration (having the protruding portion PR) in which the bottom surface of the alignment mark MK is embedded in the planarizing layer Ox can be easily formed.

If the trench portion DTR is formed so as to reach the inside of the insulating film layer Ox as in the step of FIG. 6, the alignment mark MK can be formed with the protruding portion PR. Accordingly, even if the width of the alignment mark MK is considerably small, the alignment mark MK can be easily visually recognized from the main surface S2 side using the protruding portion PR.

When the alignment mark MK formed only of the polysilicon layer PS1 is formed, since each of the alignment mark MK and the semiconductor layer SL is made of silicon, the semiconductor substrate SUB having a SOI structure is preferably used in terms of facilitating the ending of the removal by polishing shown in FIG. 17 at a desired point.

On the other hand, when the alignment mark MK has the polysilicon layer PS1 and the insulating layer I1, the semiconductor substrate SUB in which the alignment mark MK is formed need not have the insulating film layer Ox. In this case, as described above, in the step of, e.g., removing the sub-substrate SSL described above by polishing, the semiconductor substrate SUB is removed by polishing (using the insulating layer I1 as a stopper film for polishing treatment) so as to reach the insulating layer I1 forming the alignment mark MK. This allows the semiconductor layer SL in which the bottom surface of the alignment mark MK and the back main surface S2 have no level difference therebetween and are in the same plane to be formed.

On the other hand, in the case of forming the alignment mark MK including only the polysilicon layer PS1 as in the first example described above, the insulating layer I1 for forming the alignment mark MK is not needed. Therefore, compared to the case where the alignment mark MK having the polysilicon layer PS1 and the insulating layer I1 is formed, the manufacturing steps of the semiconductor substrate SUB can be further reduced to allow a cost reduction.

Figure 30:
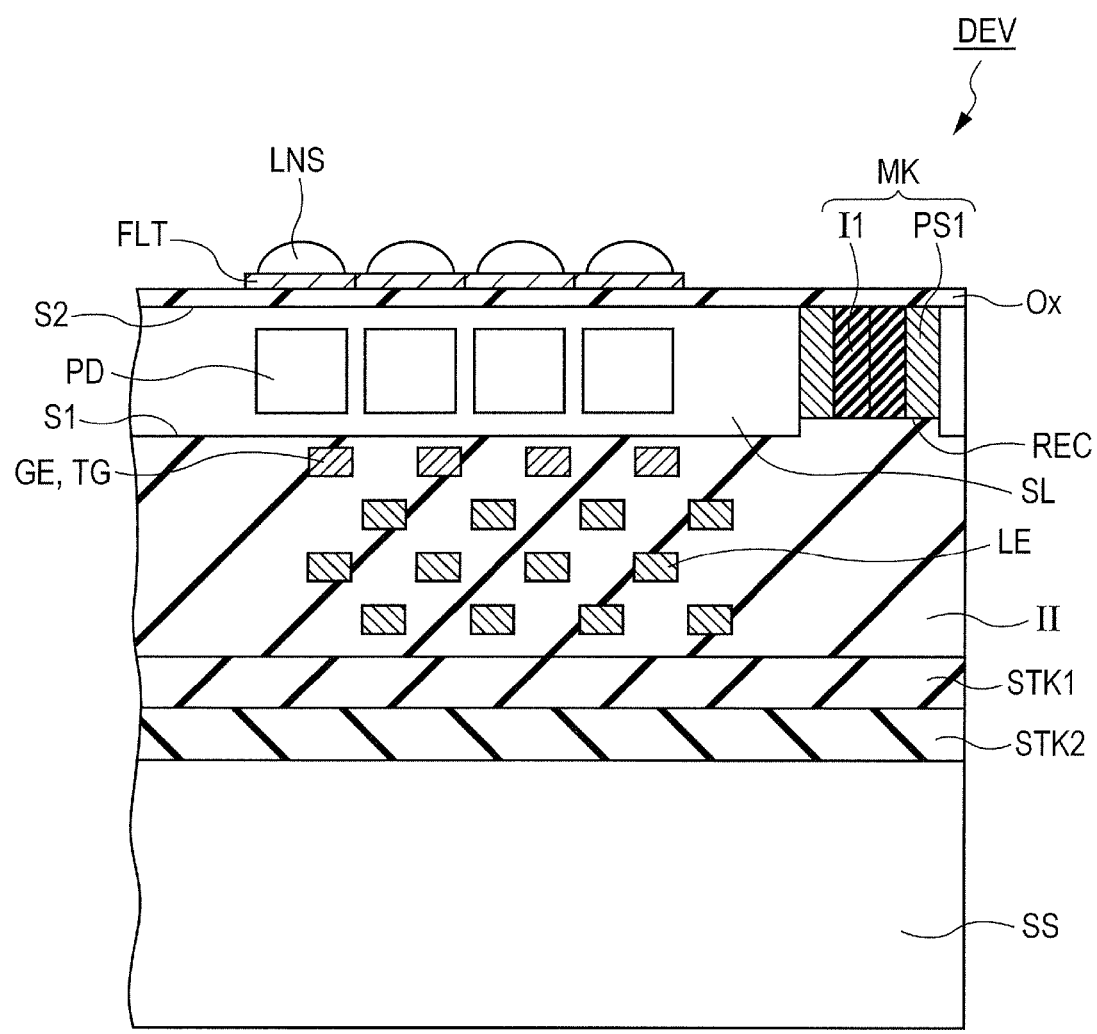
FIG. 30 is a schematic cross-sectional view showing a form of the light-receiving-element formation portion in which the photodiodes, the transistors, and the fourth example of the form of the alignment mark are formed in the semiconductor device according to Embodiment 1.

As shown in FIG. 30, the semiconductor device DEV according to the fourth example of Embodiment 1 has basically the same configuration as that of the semiconductor device DEV of the third example, but is different therefrom in that the alignment mark MK has the recessed portion REC in the same manner as in, e.g., the second example. Note that the alignment mark MK of FIG. 30 has the same form as in FIG. 23, but may also have the same form as in FIG. 24.

Figure 31:
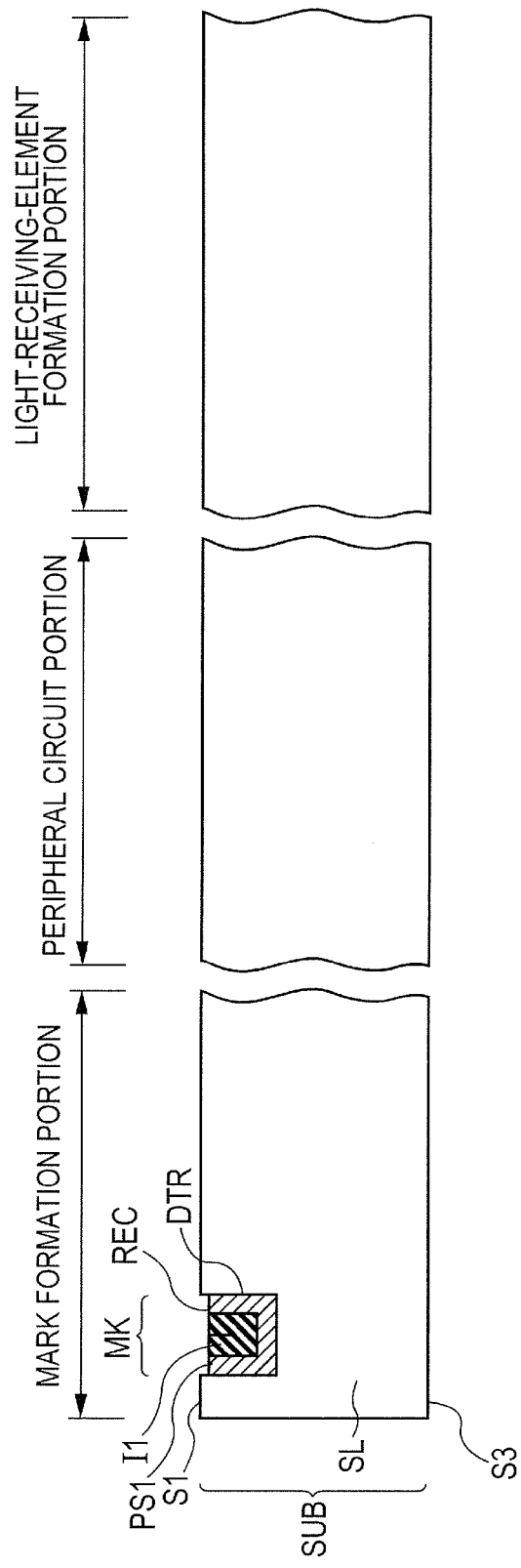
FIG. 31 is a schematic cross-sectional view showing a step of a manufacturing method of the semiconductor device in the fourth example of Embodiment 1 shown in FIG. 30.

As shown in FIG. 31, a step of the manufacturing method in the fourth example of Embodiment 1 is basically the same as the step (FIG. 29) of the manufacturing method in the third example. However, even when the alignment mark MK has the first and second layers, in the same manner as in the second example of FIG. 20, the insulating layer I11 and the polysilicon layer PS1 may also be formed to be recessed from the front main surface S1 (over which the on-chip lenses LNS and the like are eventually disposed) of the semiconductor layer SL toward the back main surface S2. However, since the alignment mark MK in the fourth example shown in FIG. 31 has the insulating layer I1, the alignment mark MK is visually recognizable from the front side even when a recess as shown in FIG. 31 is not provided. The function/effect achieved thereby is the same as in the second example of FIGS. 19 and 20.

Figure 32:
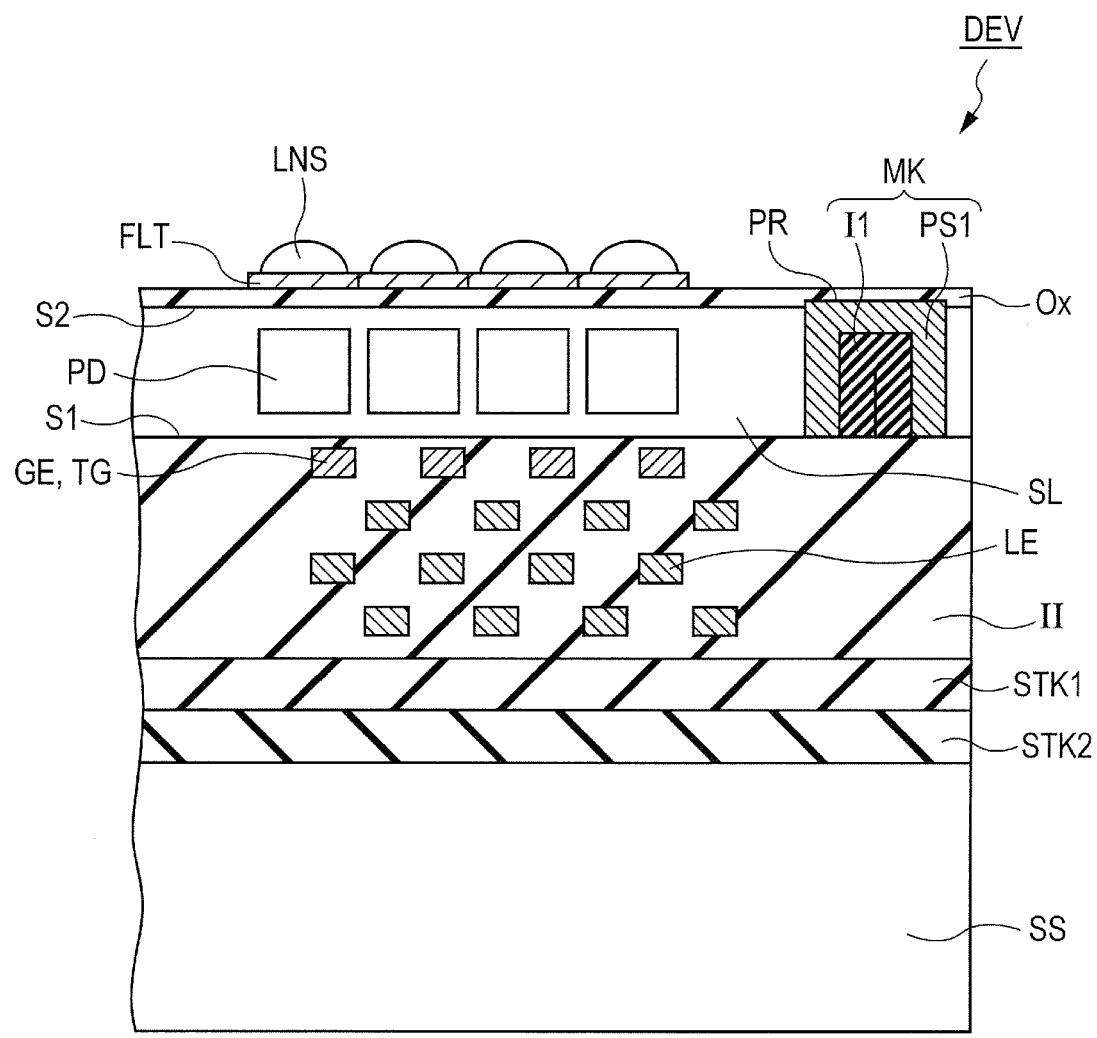
FIG. 32 is a schematic cross-sectional view showing a form of the light-receiving-element formation portion in which the photodiodes, the transistors, and the fifth example of the form of the alignment mark are formed in the semiconductor device according to Embodiment 1.

Next, a description will be given further of the fifth to eighth examples of Embodiment 1 as other modifications. As shown in FIG. 32, the semiconductor device DEV according to the fifth example of Embodiment 1 is basically the same as in FIG. 23 showing the third example. However, the fifth example is different from the third example in that the alignment mark MK has the protruding portion PR, and the polysilicon layer PS1 of the alignment mark MK covers the inner wall surfaces (both bottom surface and side surface) of the trench portion in the semiconductor layer SL.

Next, a description will be given of a manufacturing method of the semiconductor device DEV in the foregoing fifth example with reference to FIGS. 33 to 35.

Figure 33:
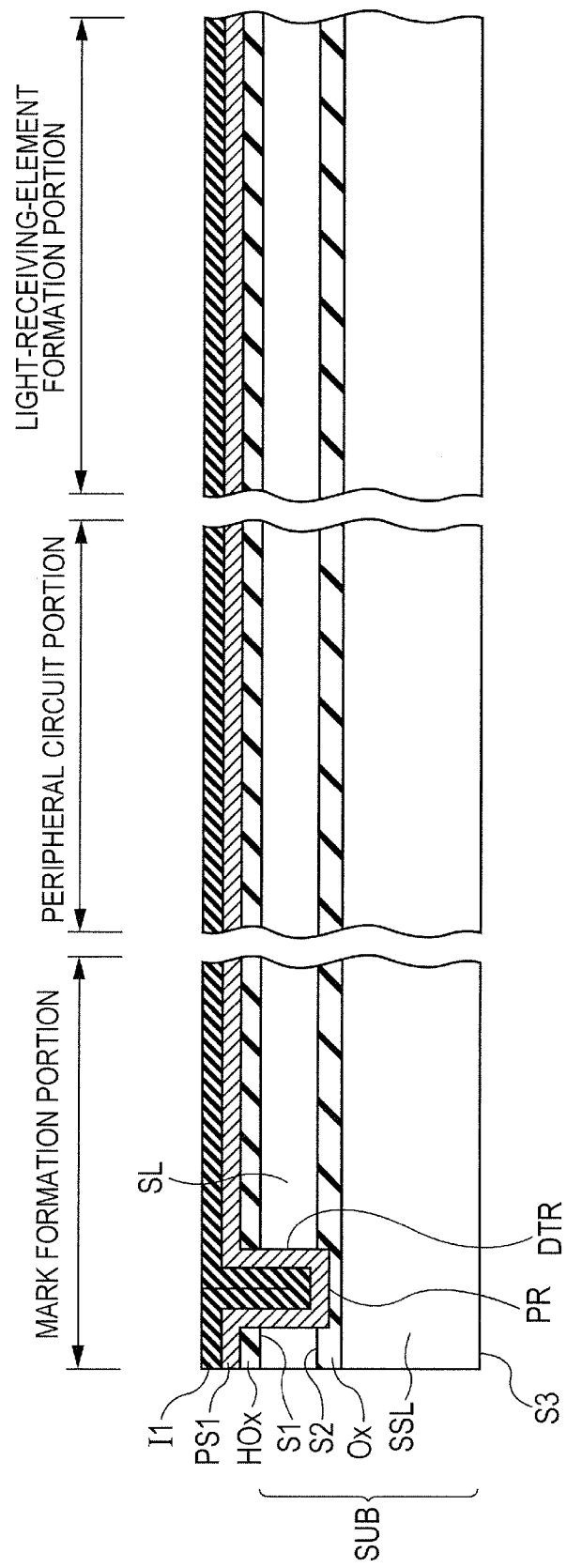
FIG. 33 is a schematic cross-sectional view showing the first step of a manufacturing method of the semiconductor device in the fifth example of Embodiment 1 shown in FIG. 32.

As shown in FIG. 33, the semiconductor substrate SUB having the insulating film layer Ox embedded in the inside thereof is subjected to the same treatment as in the steps of FIGS. 25 to 27. Here, in the same manner as in FIG. 6, the trench portion DTR is formed so as to reach the inside of the insulating film layer Ox and have the protruding portion PR.

Figure 34:
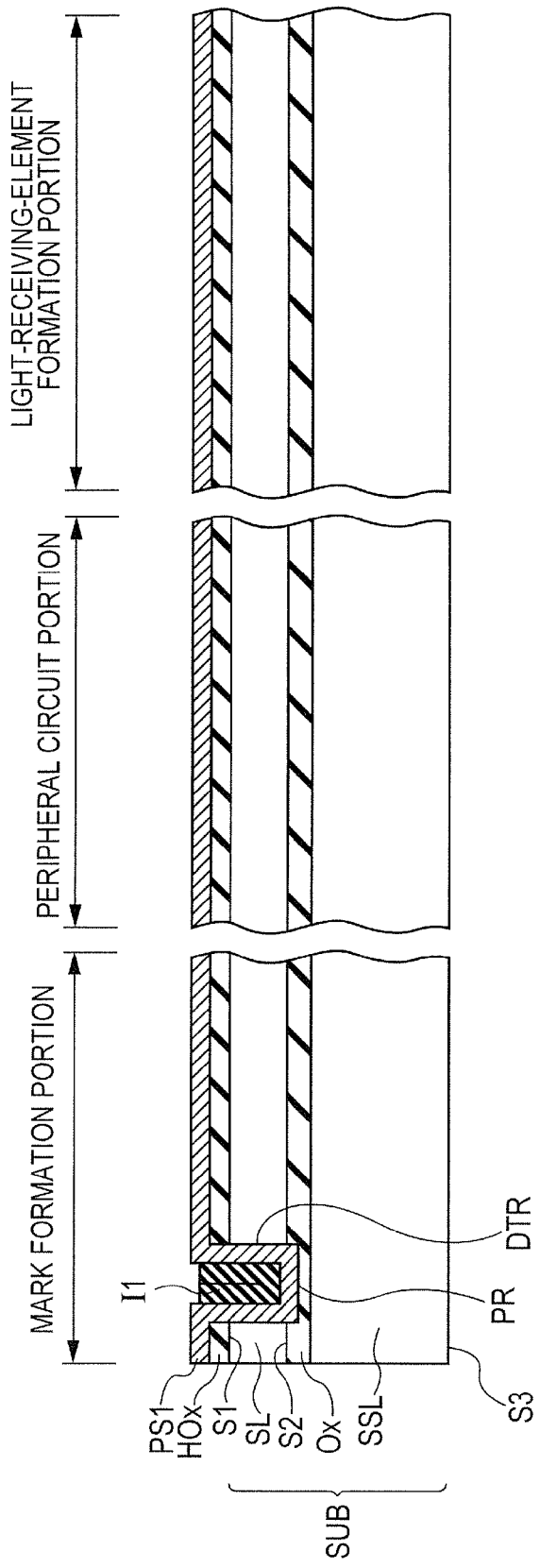
FIG. 34 is a schematic cross-sectional view showing the second step of the manufacturing method of the semiconductor device in the fifth example of Embodiment 1 shown in FIG. 32.
Figure 35:
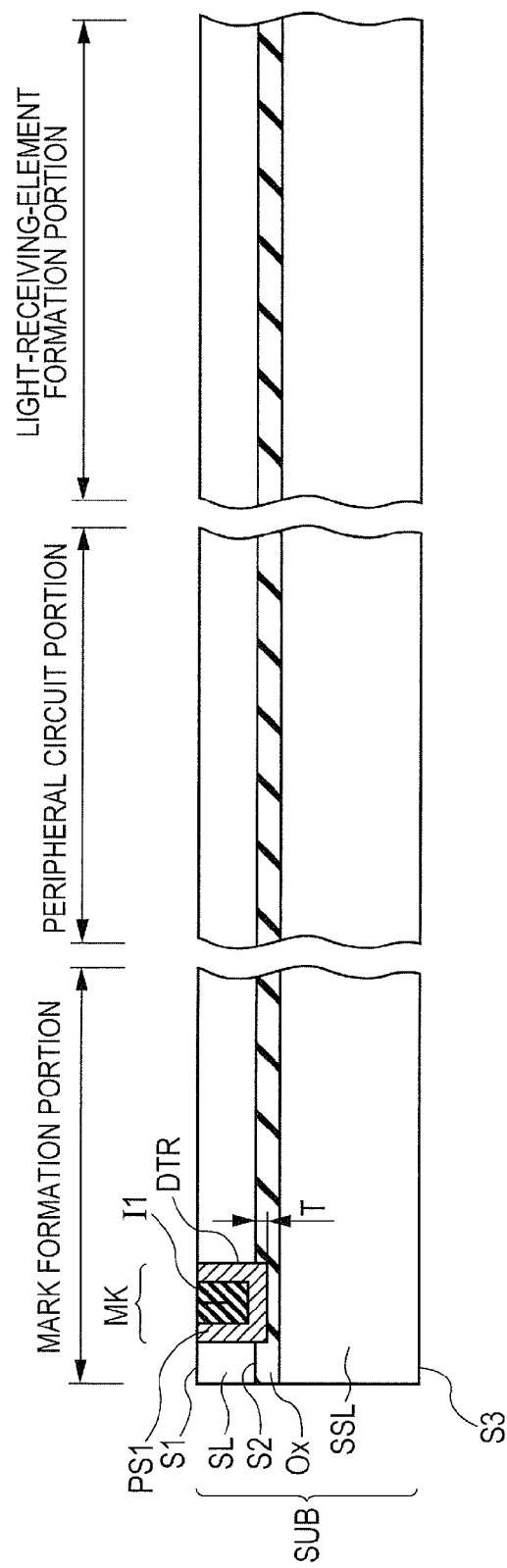
FIG. 35 is a schematic cross-sectional view showing the third step of the manufacturing method of the semiconductor device in the fifth example of Embodiment 1 shown in FIG. 32.

As shown in FIGS. 34 and 35, the same treatment as in the steps of FIGS. 28 and 29 is performed. Thereafter, in the same manner as in the step of FIG. 17, the sub-substrate SSL extending from the main surface S3 to the upper surface of the insulating film layer Ox is removed by polishing.

Thus, even in the case where the alignment mark MK having the polysilicon layer PS1 and the insulating layer I1 is formed, the semiconductor substrate SUB having a SOI structure can be used. The alignment mark MK formed as in the fifth example described above achieves each of the effect of improving the visual recognizability by having the two layers including the polysilicon layer PS1 and the insulating layer I1 and the effect of improving back-side visual recognizability by having the protruding portion PR. In addition, an improvement in visual recognizability achieved by forming the alignment mark MK of the insulating layer I1 can also be expected.

Figure 36:
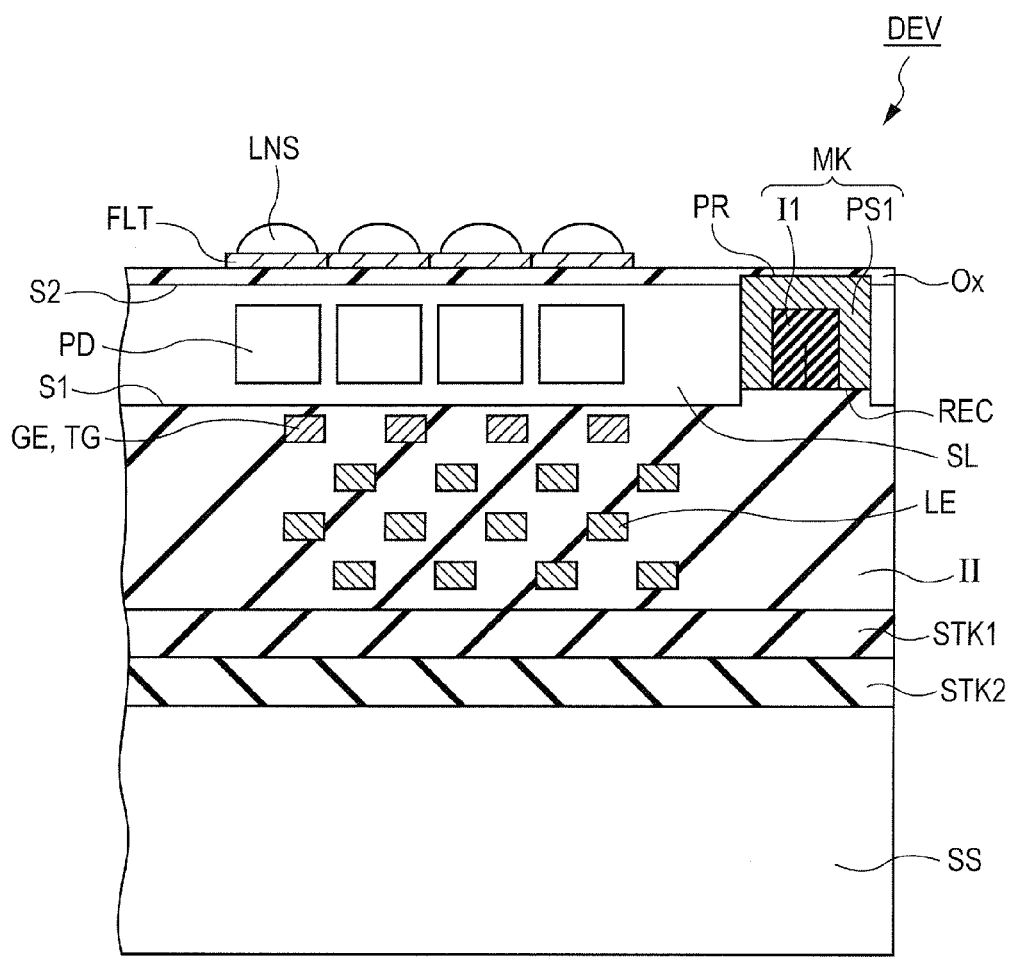
FIG. 36 is a schematic cross-sectional view showing a form of the light-receiving-element formation portion in which the photodiodes, the transistors, and the sixth example of the form of the alignment mark are formed in the semiconductor device according to Embodiment 1.

As shown in FIG. 36, the semiconductor device DEV according to the sixth example of Embodiment 1 has basically the same configuration as that of the semiconductor device DEV of the fifth example, but is different therefrom in that the alignment mark MK has the recessed portion REC in the same manner as in, e.g., the second example.

Figure 37:
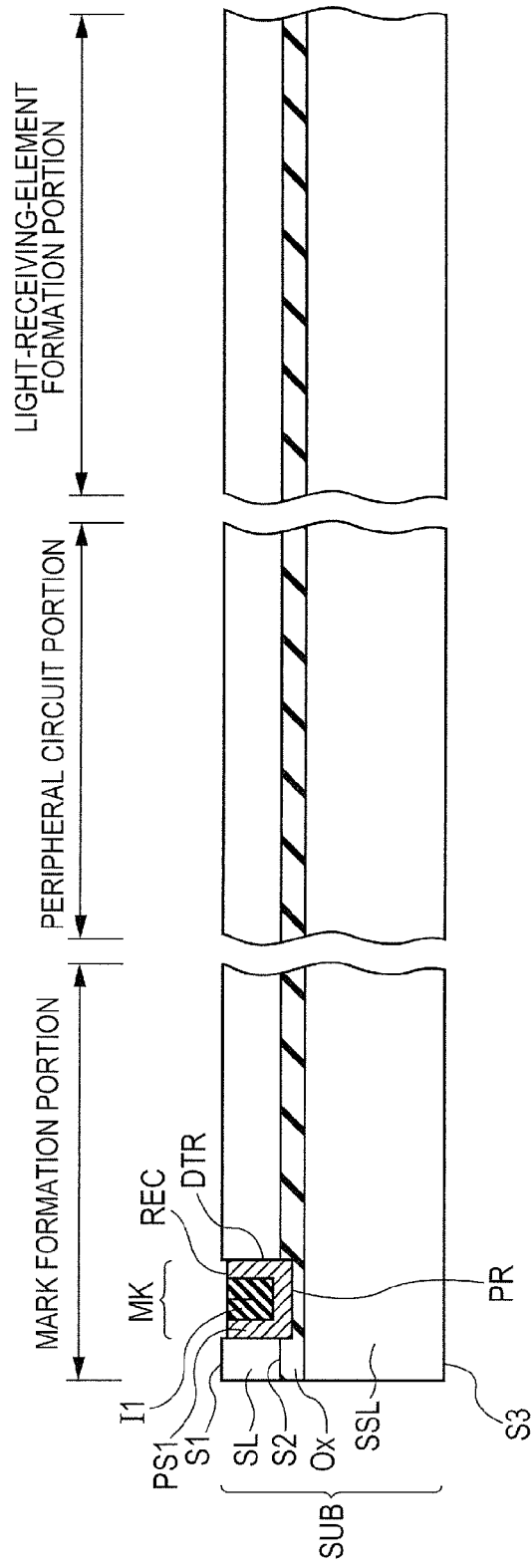
FIG. 37 is a schematic cross-sectional view showing a step of a manufacturing method of the semiconductor device in the sixth example of Embodiment 1 shown in FIG. 36.

As shown in FIG. 37, a manufacturing method of the sixth example of Embodiment 1 is the same as the manufacturing method of the fifth example (FIG. 35). However, in the same manner as in the manufacturing methods in the second example (FIG. 20) and the fourth example (FIG. 31), the recessed portion REC may also be formed.

Figure 38:
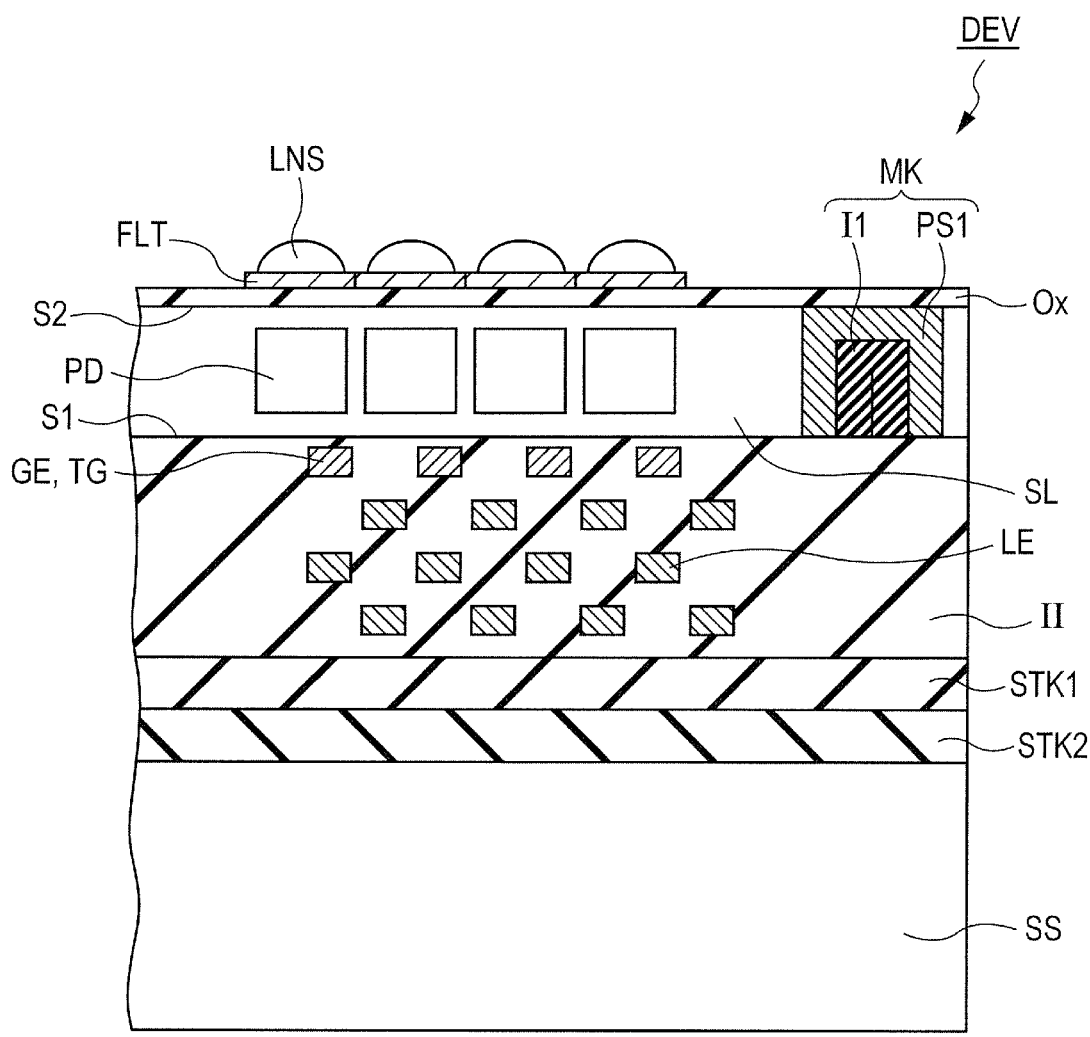
FIG. 38 is a schematic cross-sectional view showing a form of the light-receiving-element formation portion in which the photodiodes, the transistors, and the seventh example of the form of the alignment mark are formed in the semiconductor device according to Embodiment 1.

As shown in FIG. 38, the semiconductor device DEV according to the seventh example of Embodiment 1 has basically the same configuration as that the semiconductor device DEV of the fifth example, but is different therefrom in that the alignment mark MK does not have the protruding portion PR. When the alignment mark MK does not have the protruding portion PR, the alignment mark MK may also be formed to have such a form.

Figure 39:
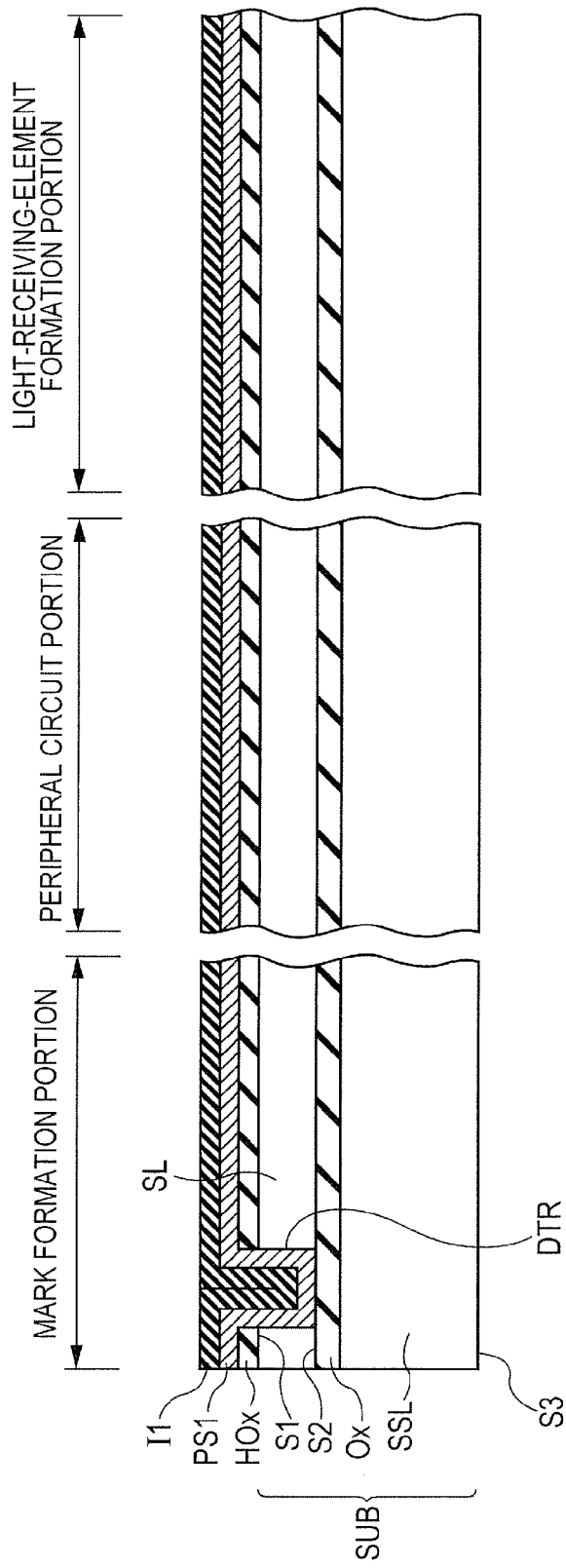
FIG. 39 is a schematic cross-sectional view showing the first step of a manufacturing method of the semiconductor device in the seventh example of Embodiment 1 shown in FIG. 38.
Figure 40:
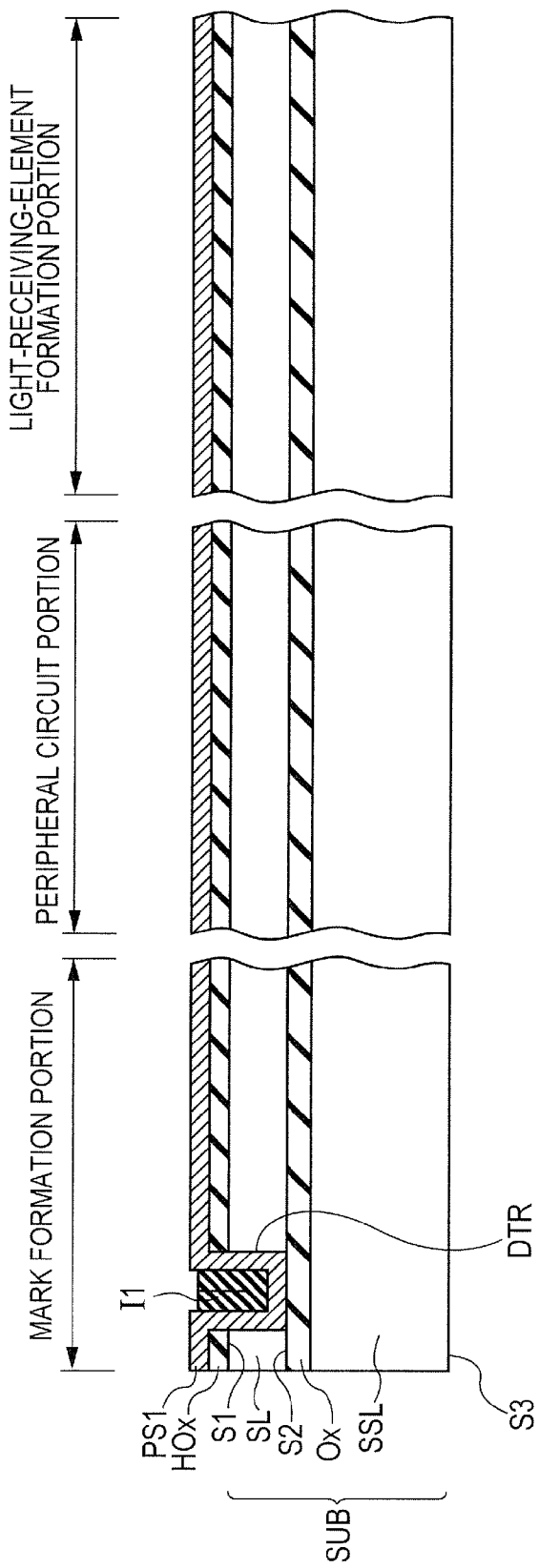
FIG. 40 is a schematic cross-sectional view showing the second step of the manufacturing method of the semiconductor device in the seventh example of Embodiment 1 shown in FIG. 38.
Figure 41:
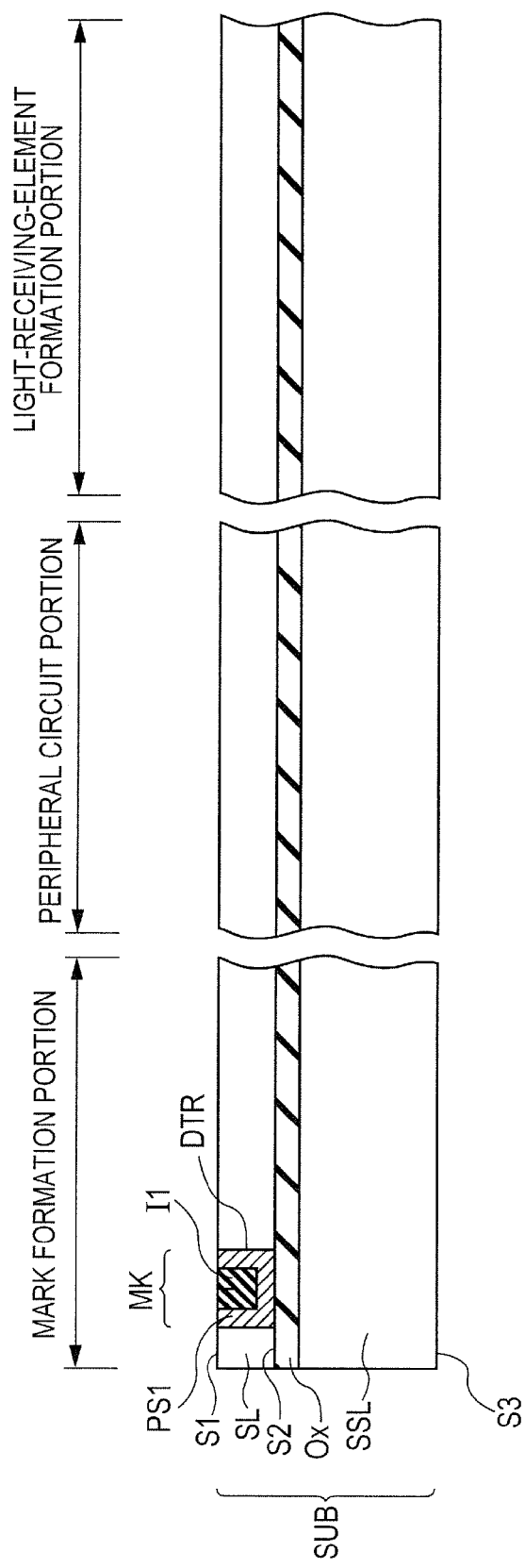
FIG. 41 is a schematic cross-sectional view showing the third step of the manufacturing method of the semiconductor device in the seventh example of Embodiment 1 shown in FIG. 38.

As shown in FIGS. 39 to 41, the manufacturing method of the foregoing seventh example is the same as in the steps of the foregoing fifth example shown in FIGS. 33 to 35, but is different in that the trench portion DTR for forming the alignment mark MK does not enter the insulating film layer Ox but stops at the uppermost surface (back main surface S2) of the insulating film layer Ox. Accordingly, in the manufacturing method, the protruding portion PR is not formed. The manufacturing method of the foregoing seventh example is otherwise the same as that of the foregoing fifth example.

Figure 42:
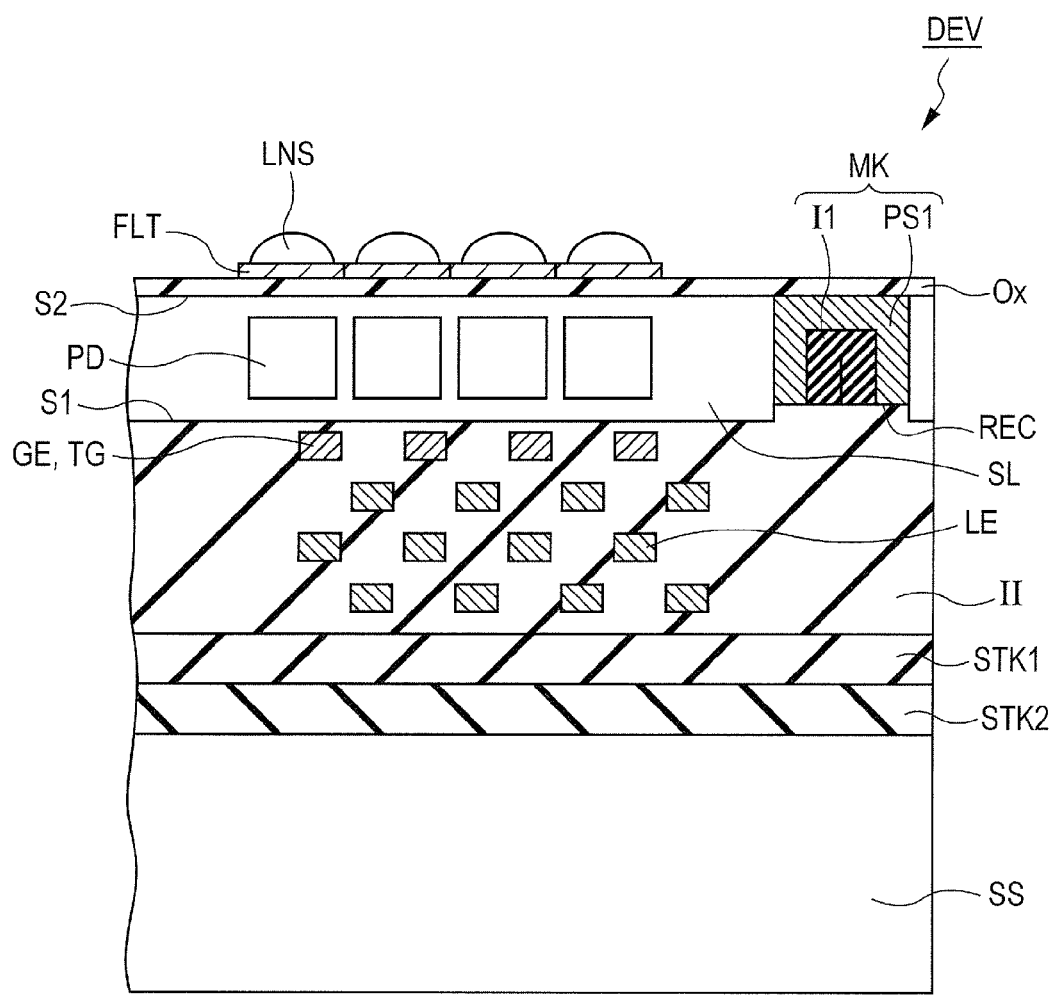
FIG. 42 is a schematic cross-sectional view showing a form of the light-receiving-element formation portion in which the photodiodes, the transistors, and the eight example of the form of the alignment mark are formed in the semiconductor device according to Embodiment 1.

As shown in FIG. 42, the semiconductor device DEV according to the eighth example of Embodiment 1 has basically the same configuration as that of the semiconductor device DEV of the seventh example, but is different therefrom in that the alignment mark MK has the recessed portion REC in the same manner as in, e.g., the second example.

Figure 43:
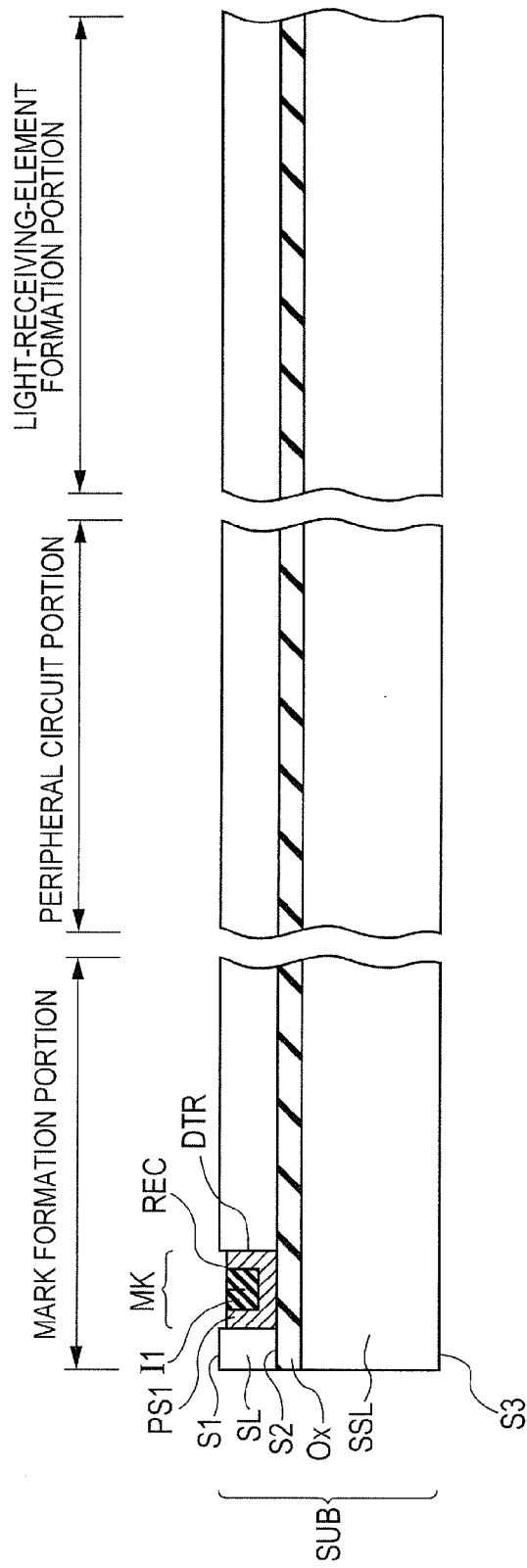
FIG. 43 is a schematic cross-sectional view showing a step of a manufacturing method of the semiconductor device in the eighth example of Embodiment 1 shown in FIG. 42.

As shown in FIG. 43, the manufacturing method of the eighth example of Embodiment 1 is the same as the manufacturing method of the seventh example (FIG. 41). However, in the same manner as in, e.g., the manufacturing methods in the second example (FIG. 20) and the fourth example (FIG. 31), the recessed portion REC may also be formed.

Next, a description will be given of the function/effect of the present embodiment as a whole. For example, according to the related-art technology, when an alignment mark used during processing for forming on-chip lenses or the like over a so-called back surface for a back-side-illumination solid-state image sensor is formed, a silicon oxide film and a silicon nitride film are formed first over one of the main surfaces of the semiconductor substrate SUB. A photoresist is applied onto the silicon nitride film and subjected to a typical photoengraving technique to form a mask for processing a laminate of the silicon oxide film and the silicon nitride film. By further performing typical etching using the foregoing mask for laminate processing, a trench portion is formed in the semiconductor substrate SUB. Then, a conductive film or a semiconductor film (first layer) for forming the alignment mark or a laminate structure including the foregoing first layer and an insulating film (second layer) for forming the alignment mark is formed so as to cover the upper surface of the silicon nitride film and the inner peripheral wall surface of the trench portion (so as to fill the inside of the trench portion). Thereafter, the first layer is (or the first and second layers are) etched back so as to remain inside the trench portion. Thereafter, the silicon oxide film and the silicon nitride film each formed first are removed.

Thus, in the related-art technique, the two layers including the silicon oxide film and the silicon nitride film as the hard mask for forming the trench portion are stacked and removed. Accordingly, the number of steps for forming the alignment mark is large, which is troublesome and complicated.

However, in Embodiment 1, the silicon oxide film HOx formed as the hard mask (trench processing mask) for forming the alignment mark MK used for back-side processing includes, e.g., only the single silicon oxide film (one layer). Therefore, compared to the case where a hard mask including a two-layer insulating film is formed as in the foregoing related-art technique, the steps of forming and removing the silicon nitride film can be reduced to allow a reduction in manufacturing cost.

Also, as shown in, e.g., FIG. 7, if the trench processing mask of the silicon oxide film HOx is formed and then the polysilicon layer PS1 is formed so as to cover the upper surface thereof without removing the trench processing mask, the number of steps is accordingly smaller because there is no step of removing the trench processing mask. As a result, processing can be performed more easily using a pattern of the trench processing mask of the silicon oxide film HOx.

Note that, in the foregoing alignment mark MK for back-side processing, the trench portion DTR extends from the front main surface S1 through the semiconductor layer SL to reach the back main surface S2. Accordingly, the alignment mark MK can be used not only for back-side processing (e.g., disposing the lenses LNS), but also for alignment in front-side processing (e.g., forming the isolation insulating films SPT from the front main surface S1). The effect can be further enhanced particularly when the alignment mark MK in which the recessed portion REC is formed in the front main surface S1 of the semiconductor layer SL is used as in the foregoing second and fourth examples. This is because, by visually recognizing the recessed portion REC, the alignment mark MK can be used as a mark for alignment during the processing on the front main surface S1 side.

Thus, the manufacturing method of the alignment mark MK of Embodiment 1 can simplify the steps and reduce manufacturing cost. In addition, by using the alignment mark MK used for processing on the back main surface S2 side for processing on the front main surface S1 side, the efficiency of manufacturing the semiconductor device DEV can further be enhanced.

In each of the examples of Embodiment 1 described above, as shown in, e.g., FIG. 7, the polysilicon layer PS1 is formed so as to cover the upper surface of the silicon oxide film HOx, and the silicon oxide film HOx is removed in the subsequent step. However, it may also be possible that, after the silicon oxide film HOx is removed, the polysilicon layer PS1 is formed so as to cover the main surface S1. When the polysilicon layer PS1 is formed after the silicon oxide film HOx is removed, the silicon oxide film HOx may also be a photoresist in place of the silicon oxide film.

Embodiment 2

Compared to Embodiment 1, Embodiment 2 is different therefrom in the relationship between the polysilicon layer PS1 forming the alignment mark MK and the gate electrodes GE of the transfer transistors TG. Hereinbelow, using FIGS. 44 to 61, a description will be given of Embodiment 2.

Figure 44:
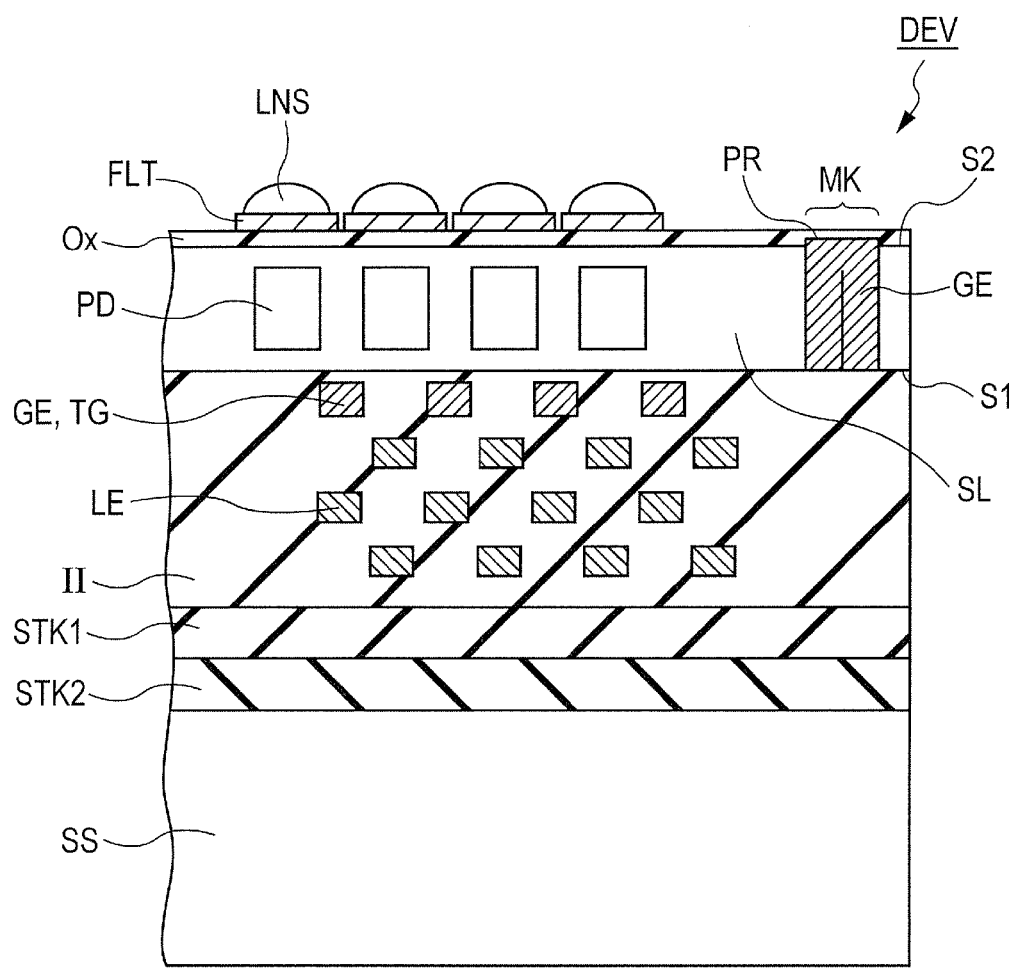
FIG. 44 is a schematic cross-sectional view showing a form of a light-receiving-element formation portion in which photodiodes, transistors, and the first example of a form of an alignment mark are formed in a semiconductor device according to Embodiment 2.

As shown in FIG. 44, the semiconductor device DEV according to the first example of Embodiment 2 has basically the same outer form as that of the semiconductor device DEV shown in FIG. 5. However, in Embodiment 2, the conductive film or semiconductor film (first layer) filling the alignment mark MK is in the same layer as that of the conductive film forming the gate electrodes GE of the transfer transistors TG.

In other words, e.g., the polysilicon layer GE forming the alignment mark MK in the first example of Embodiment 2 (corresponding to the polysilicon layer PS1 forming the alignment mark MK in Embodiment 1) is simultaneously formed with the conductive film forming the gate electrodes GE of the transistors TG into the same layer. The polysilicon layer GE forming the alignment mark MK and the conductive film forming the gate electrodes GE are initially formed as the same conductive film (first layer). In the subsequent step, a part of the first layer is removed by etching, resulting in the form of the patterned polysilicon layer GE and the gate electrodes GE shown in FIG. 5.

Note that, as will be described later, when the alignment mark MK is formed of the semiconductor film, after the gate electrodes GE are formed in the same layer as that of the semiconductor film of the alignment mark MK, an impurity is introduced into each of the gate electrodes GE in a different step. In this manner, the gate electrode GE is changed to a conductive film.

In the first example of Embodiment 2, the polysilicon layer GE as the first layer forming the alignment mark MK is preferably formed so as to fill the inside of the trench portion formed in the semiconductor layer SL to form the alignment mark MK. This can inhibit such a problem that, e.g., a part of the bottom surface or side surface of the trench portion is exposed and the exposed region is unintentionally etched.

When it is assumed that, e.g., the width (in the left-right direction of FIG. 5 along the main surfaces S1 and S2) of the trench portion formed in the semiconductor layer SL to form the alignment mark is w and the thickness of the polysilicon layer PS1 for forming the gate electrodes GE (for forming the alignment mark MK) is h, it is preferable that $w \leq 2h$ is satisfied, i.e., the foregoing width is not more than double the foregoing thickness. This allows the polysilicon layer PS1 to fill the trench portion particularly in the widthwise direction thereof.

The configuration in the first example of Embodiment 2 is different from the configuration in the first example of Embodiment 1 (FIG. 5) in the foregoing point and otherwise the same. Therefore, the description of the same components will not be repeated by providing them with the same reference numerals.

Next, referring to FIGS. 45 to 50, a description will be given of a manufacturing method of the alignment mark MK particularly according to the first example in the semiconductor device of Embodiment 2. Note that, in FIGS. 45 to 50, in the same manner as in FIGS. 6 to 17, the mark formation portion, the peripheral circuit portion, and the light-receiving-element formation portion are shown side by side.

Figure 45:
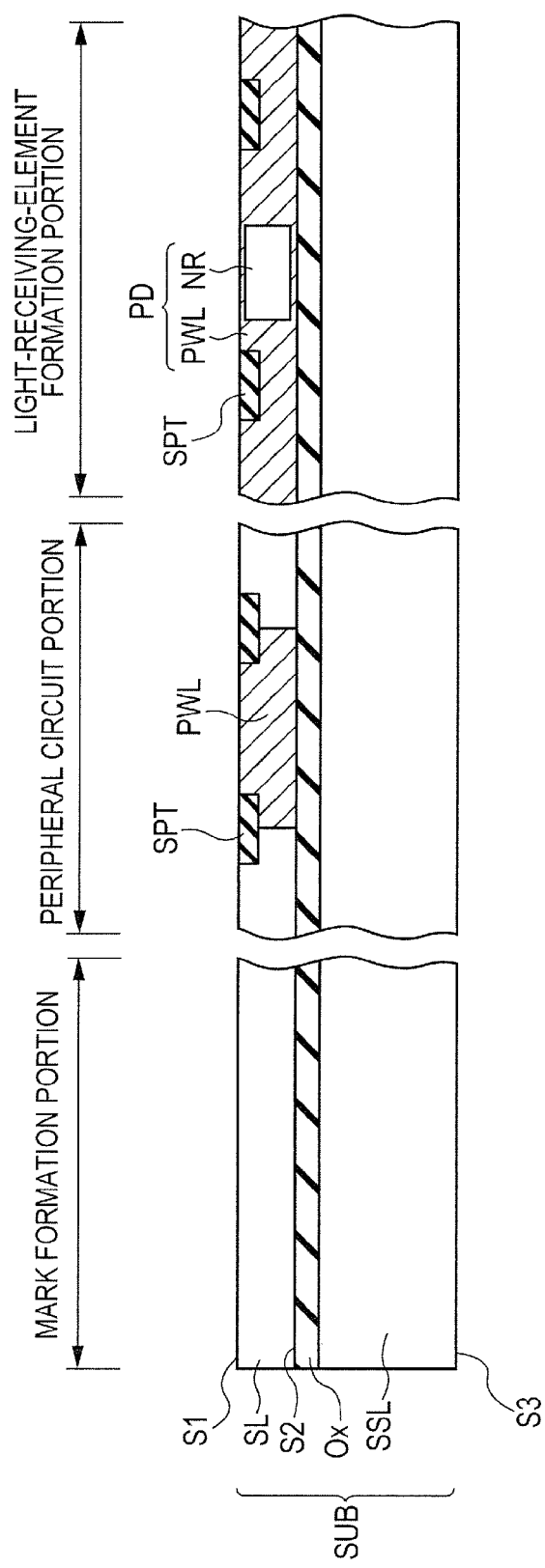
FIG. 45 is a schematic cross-sectional view showing the first step of a manufacturing method of the semiconductor device in the first example of Embodiment 2 shown in FIG. 44.

As shown in FIG. 45, the semiconductor substrate SUB as a so-called SOI substrate having a structure in which the sub-substrate SSL, the insulating film layer Ox, and the semiconductor layer SL are stacked in this order, which is the same as in the step of FIG. 6, is prepared first. Also, in the same manner as in the step of FIG. 10, in the light-receiving-element formation portion and the peripheral circuit portion, the plurality of isolation regions SPT and the p-type well region PWL are formed to thus form the photodiodes PD. Here also, the p-type well region PWL may be formed first after the isolation regions SPT are formed or, alternatively, the isolation regions SPT may be formed after the p-type well region is formed. It may also be possible that, after the p-type well region PWL is formed, the isolation regions SPT are formed and, thereafter, the p-type well region PWL is formed again.

Figure 46:
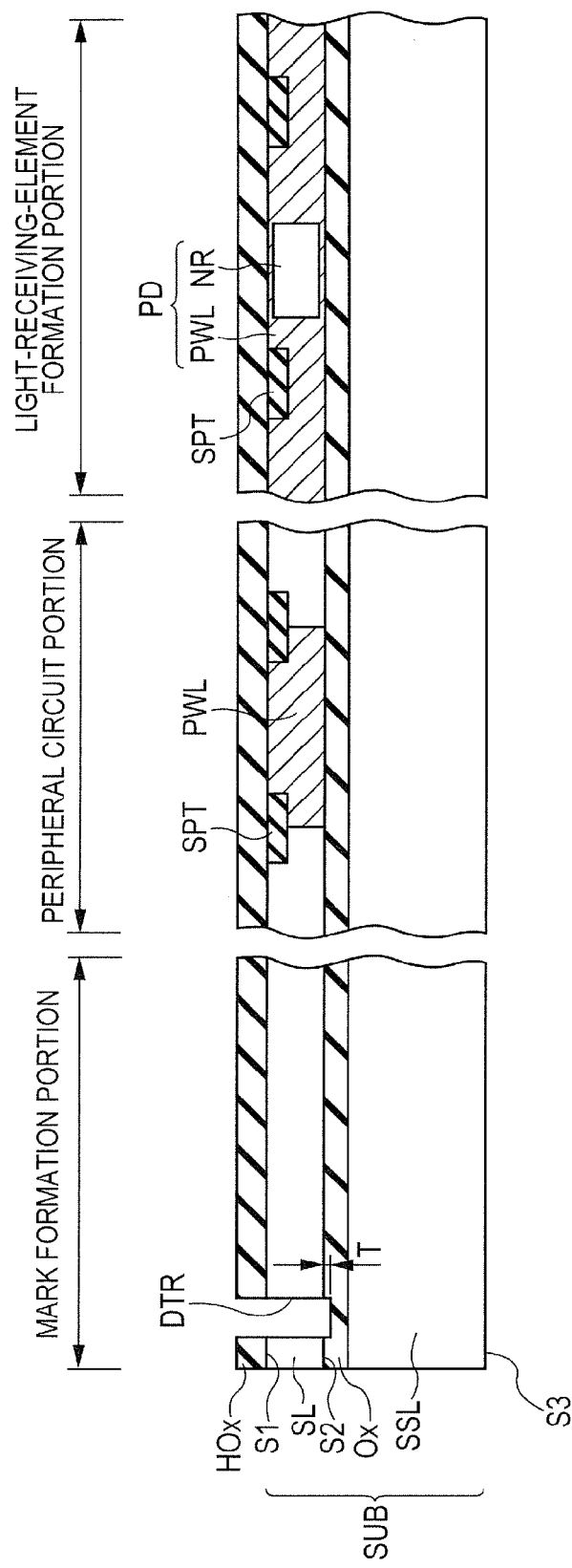
FIG. 46 is a schematic cross-sectional view showing the second step of the manufacturing method of the semiconductor device in the first example of Embodiment 2 shown in FIG. 44.

Then, as shown in FIG. 46, in the same manner as in the step of FIG. 6, an insulating film such as the silicon oxide film HOx is formed by, e.g., a CVD method so as to cover the main surface S1 (front main surface S1 of the semiconductor layer SL) of the semiconductor substrate SUB.

Next, in the same manner as in FIG. 6, the silicon oxide film HOx is patterned and, using the patterned silicon oxide film HOx as a hard mask (trench processing mask), the semiconductor substrate SUB is subjected to typical etching to be formed with the trench portion DTR having the protruding portion PR extending from the main surface S1 and reaching the inside of the insulating film layer Ox. The level difference T shown in FIG. 46 is preferably not less than 10 nm and not more than 150 nm (more preferably not less than 30 nm and not more than 80 nm).

Figure 47:
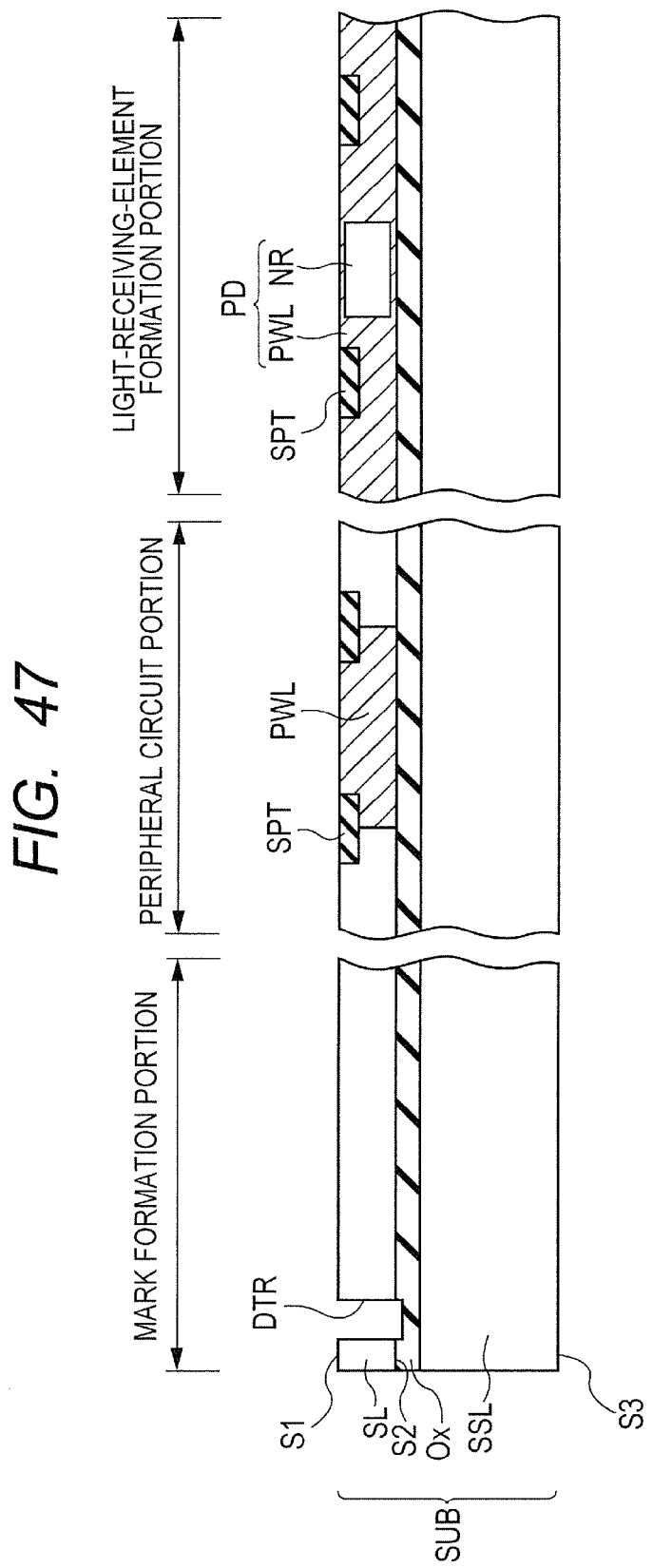
FIG. 47 is a schematic cross-sectional view showing the third step of the manufacturing method of the semiconductor device in the first example of Embodiment 2 shown in FIG. 44.
Figure 48:
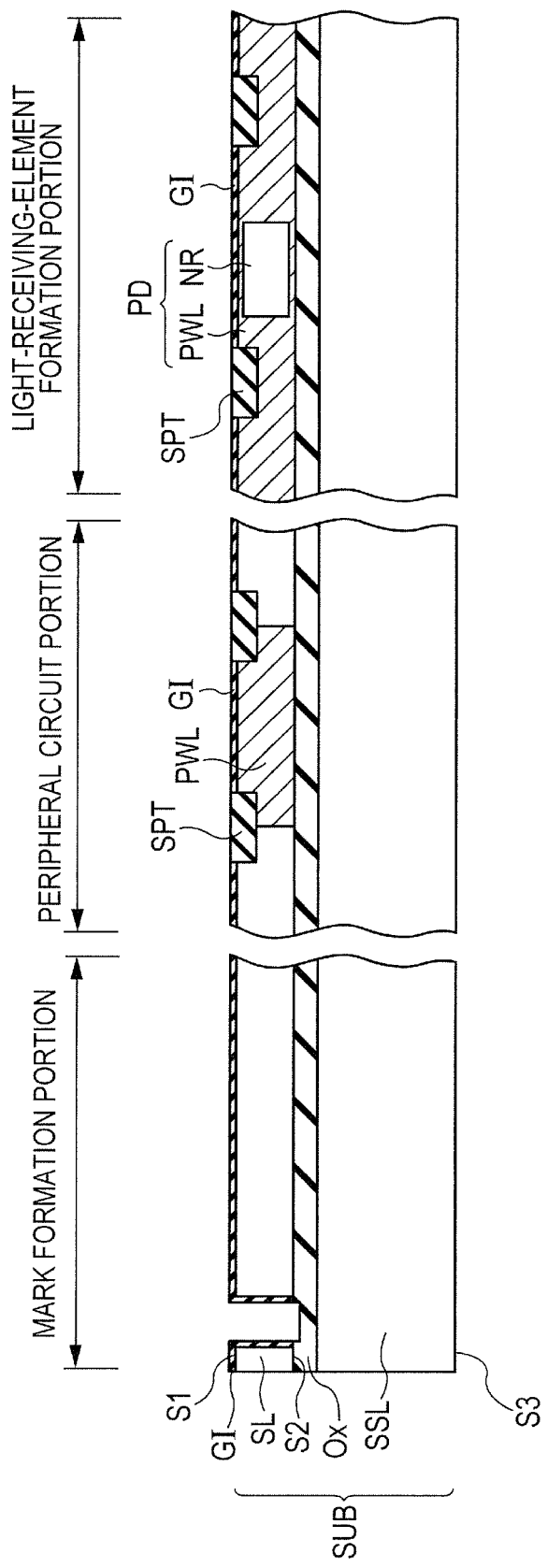
FIG. 48 is a schematic cross-sectional view showing the fourth step of the manufacturing method of the semiconductor device in the first example of Embodiment 2 shown in FIG. 44.

As shown in FIG. 47, the silicon oxide film HOx is removed by etching using a chemical solution of, e.g., a hydrofluoric acid or the like. As shown in FIG. 48, by, e.g., a typical thermal oxidation method, the insulating film GI comprised of a silicon oxide film is formed over the front main surface S1. The insulating film GI is formed also over the inner side surface of the trench portion DTR at which the semiconductor layer SL is exposed.

Figure 49:
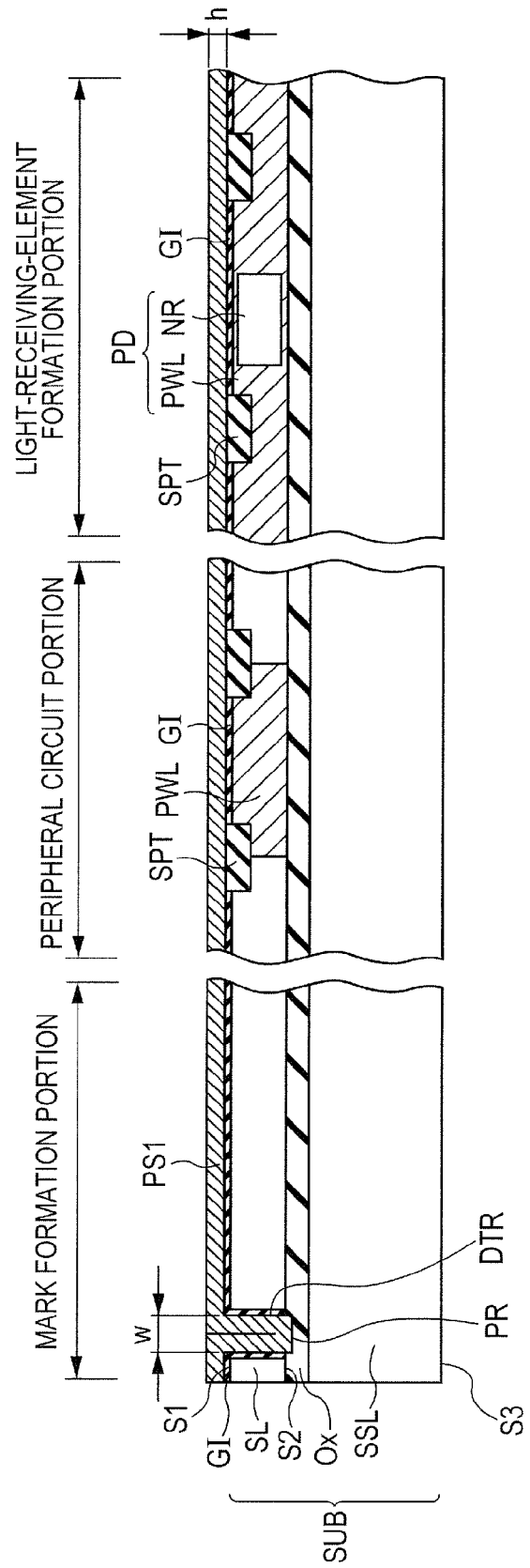
FIG. 49 is a schematic cross-sectional view showing the fifth step of the manufacturing method of the semiconductor device in the first example of Embodiment 2 shown in FIG. 44.

As shown in FIG. 49, a conductive film or a semiconductor film (first layer) such as, e.g., the polysilicon layer PS1 is formed by the same CVD method as in the step of, e.g., FIG. 12 so as to cover the inner peripheral wall surface of the trench portion DTR and the upper surface of the front main surface S1 formed with the insulating film GI. The first layer formed here is the same as the first layer in the step of FIG. 7. When the polysilicon layer PS1 formed here is a semiconductor film not containing an impurity, into at least the regions of the formed polysilicon layer PS1 which serve as the gate electrodes GE, a conductive impurity is implanted. Alternatively, a thin film containing, e.g., a metal material may also be formed as the first layer PS1.

Preferably, the polysilicon layer PS1 covers the inner wall surface of the trench portion DTR to fill the inside of the trench portion DTR (particularly the bottom surface thereof and the vicinity thereof). To achieve this, if the width (in the left-right direction of the drawing) of the trench portion DTR is w and the thickness of the polysilicon layer PS1 is h by way of example, it is preferable that w≤2h is satisfied, i.e., the foregoing width is not more than double the foregoing thickness. By thus filling the inside of the trench portion DTR, it is possible to inhibit a problem such that, e.g., a part of the inner bottom surface or side surface of the trench portion DTR is exposed and the exposed region is unintentionally etched.

Figure 50:
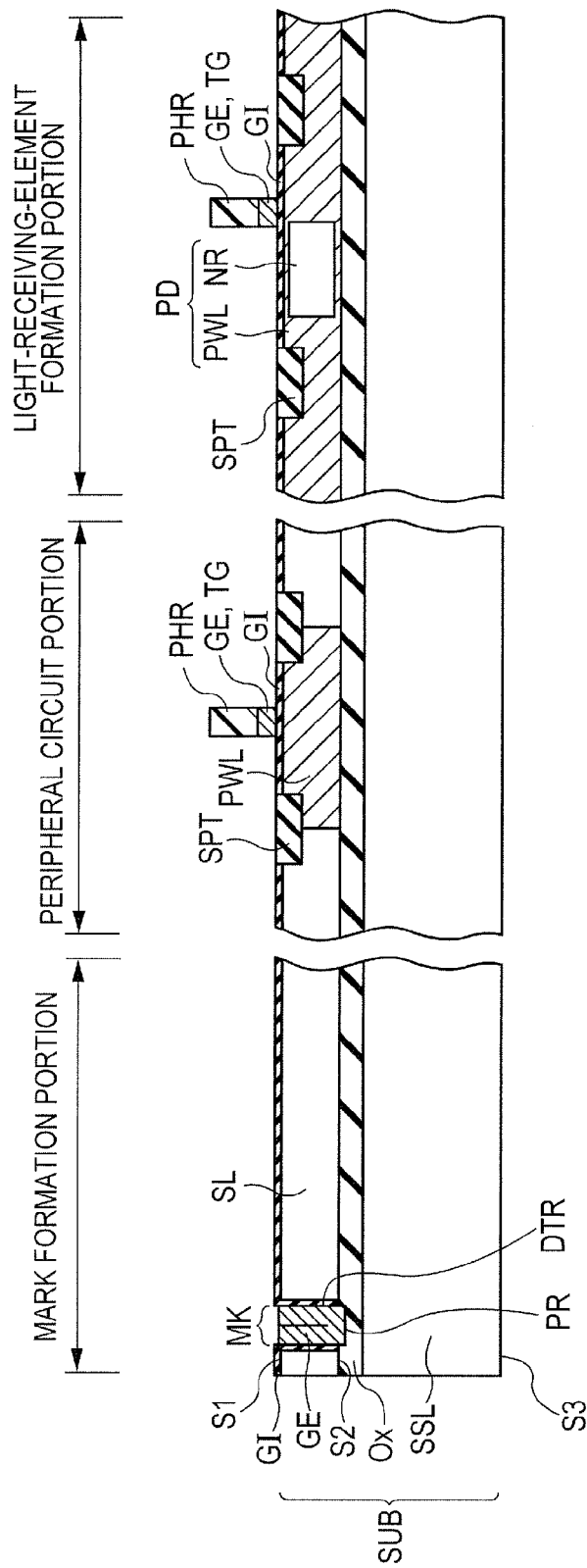
FIG. 50 is a schematic cross-sectional view showing the sixth step of the manufacturing method of the semiconductor device in the first example of Embodiment 2 shown in FIG. 44.

As shown in FIG. 50, in the same manner as in the step of FIG. 13, the photoresist PHR is applied onto the polysilicon layer PS1 formed in the step of FIG. 49 and patterned using a typical photoengraving technique. Then, using a pattern of the photoresist PHR as a mask, the polysilicon layer PS1 is etched. Specifically, by the etching performed here, the polysilicon layer PS1 and the insulating layer I1 each embedded inside the trench portion DTR are left and the polysilicon layer PS1 outside the trench portion DTR (particularly a part of the polysilicon layer PS1 located over the main surface S1 (except for the gate electrodes GE) and a part of the polysilicon layer PS1 located immediately above a part of the inside of the trench portion DTR here) is removed.

As a result, the polysilicon layer PS1 is etched to fill the inside of the trench portion DTR as the polysilicon layer GE (identical to the polysilicon layer PS1) of the alignment mark MK and be disposed as the gate electrodes GE over the insulating film GI. In this manner, the alignment mark MK as the polysilicon layer GE filling the inside of the trench portion DTR and the gate electrodes GE for forming the transistors TR are formed.

After the photoresist PHR is removed, the same treatment (for forming the source/drain regions or the like) as the treatment performed immediately after the step of FIG. 13 is performed, and the same treatment as in the steps of FIGS. 14 to 17 is further performed to form the semiconductor device DEV having the same form as in FIG. 44. That is, the alignment mark MK is used for the alignment of, e.g., the color filters, the on-chip lenses LNS, and the like during processing on the back surface (back main surface S2) side. Note that, in the same manner as in Embodiment 1, the depiction of the gate insulating film GI (including the insulating film GI over the inner peripheral side surface of the trench portion DTR), the isolation regions SPT, and the p-type wells PWL each shown in FIGS. 45 to 50 illustrating the foregoing steps is omitted in FIG. 44.

Figure 51:
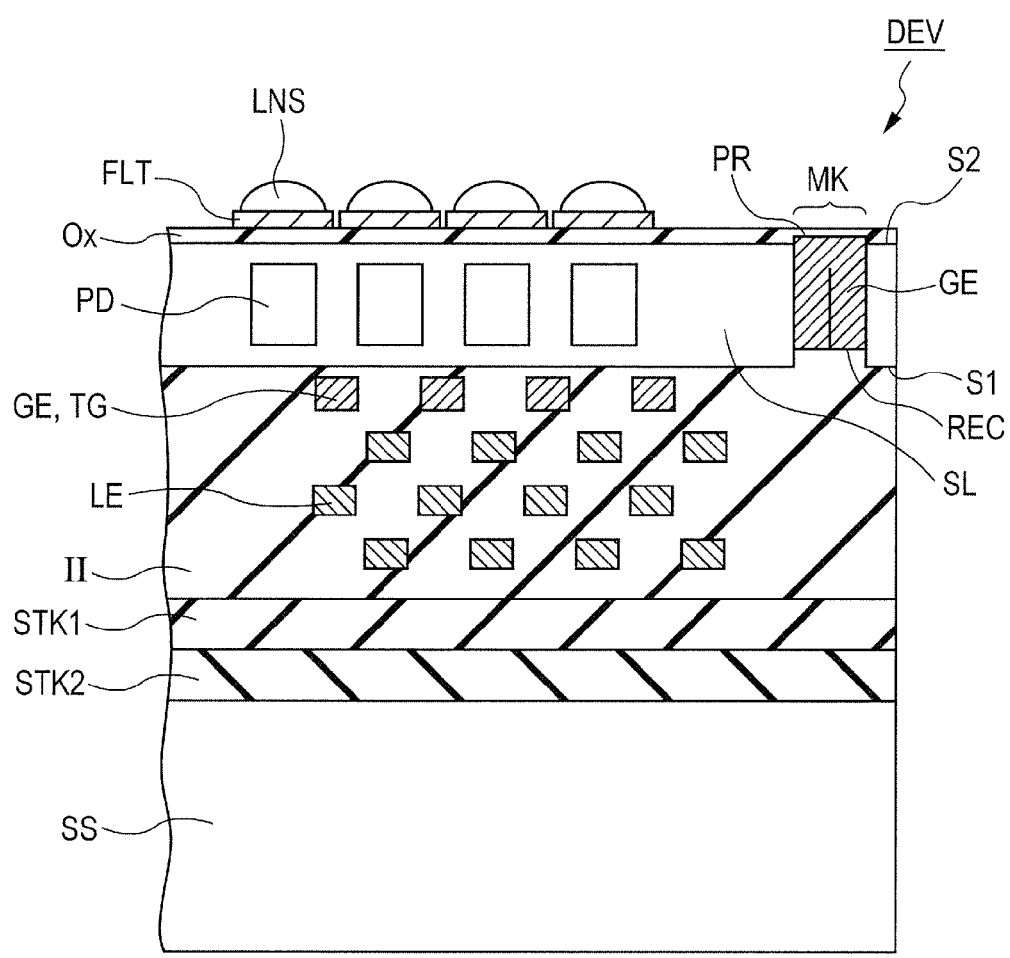
FIG. 51 is a schematic cross-sectional view showing a form of the light-receiving-element formation portion in which the photodiodes, the transistors, and the second example of the form of the alignment mark are formed in the semiconductor device according to Embodiment 2.

As shown in FIG. 51, the semiconductor device DEV according to the second example of Embodiment 2 has basically the same configuration as that of the semiconductor device DEV of the first example of Embodiment 2, but is different therefrom in that, in the same manner as in, e.g., the second example of Embodiment 1 (FIG. 20), the alignment mark MK has the recessed portion REC.

Figure 52:
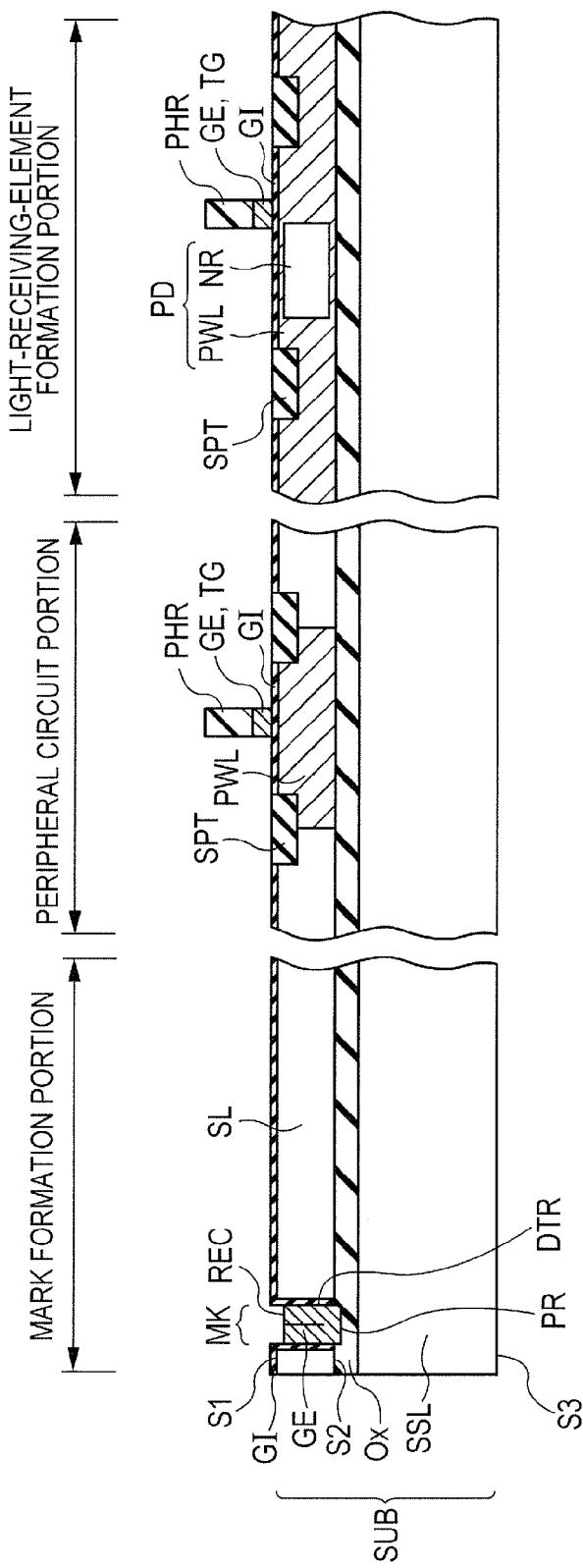
FIG. 52 is a schematic cross-sectional view showing a step of a manufacturing method of the semiconductor device in the second example of Embodiment 2 shown in FIG. 51.

As shown in FIG. 52, as a manufacturing method of the second example of Embodiment 2, the same manufacturing method as that of the first example (FIG. 50) is used. However, in the same manner as in the manufacturing method of the other examples described above, the recessed portion REC may also be formed.

Figure 53:
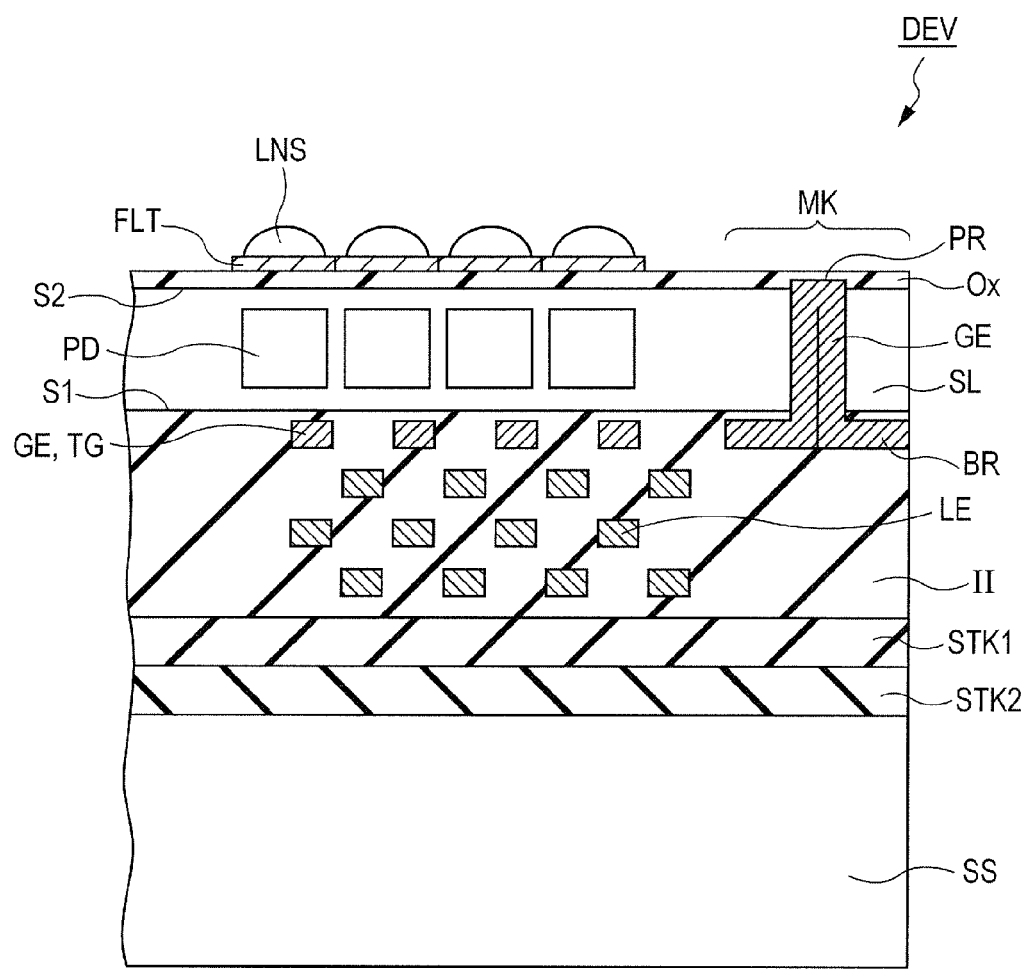
FIG. 53 is a schematic cross-sectional view showing a form of the light-receiving-element formation portion in which the photodiodes, the transistors, and the third example of the form of the alignment mark are formed in the semiconductor device according to Embodiment 2.

As shown in FIG. 53, the alignment mark MK as the third example of Embodiment 2 is formed in the same layer as that of the polysilicon layer PS1 forming the gate electrode GE, similarly to the alignment mark MK of the first example of Embodiment 2. However, in the alignment mark MK of the foregoing third example, the polysilicon layer GE protrudes from the front main surface S1 (from inside the trench portion inside the semiconductor layer SL in which the alignment mark MK is formed) in a downward direction of the drawing which is opposite to the direction in which the on-chip lenses LNS are arranged so that the alignment mark MK has a brim portion BR as a stepped portion between the uppermost layer thereof and the front main surface S1. The brim portion BR has a form continued to the polysilicon layer GE as a part of the alignment mark inside the semiconductor layer SL, and is disposed outside the semiconductor layer SL.

The brim portion BR may have a width in a direction along the front main surface S1 which is larger than that of the polysilicon layer GE forming the alignment mark MK within the semiconductor layer SL. This can improve the visual recognizability of the mark MK from the front main surface S1 side.

Note that, in the configuration of FIG. 53, if the width of the portion (formed of a trench portion) of the alignment mark MK other than the protruding portion is w and the thickness of the polysilicon layer GE is h, the relationship given by w≤2h is preferably satisfied.

Actually, in the region between each of the side surface at which the alignment mark MK is in contact with the semiconductor layer SL and the front main surface S1 and the alignment mark MK (extending in a direction along the front main surface S1 in the same plane as that of the gate electrode GE), the insulating films GI are formed.

The configuration of FIG. 53 is different from the configuration of FIG. 44 in that the alignment mark MK has the brim portion BR as described above and is otherwise the same as the configuration of FIG. 44. Therefore, the description of the same components will not be repeated by providing them with the same reference numerals.

Figure 54:
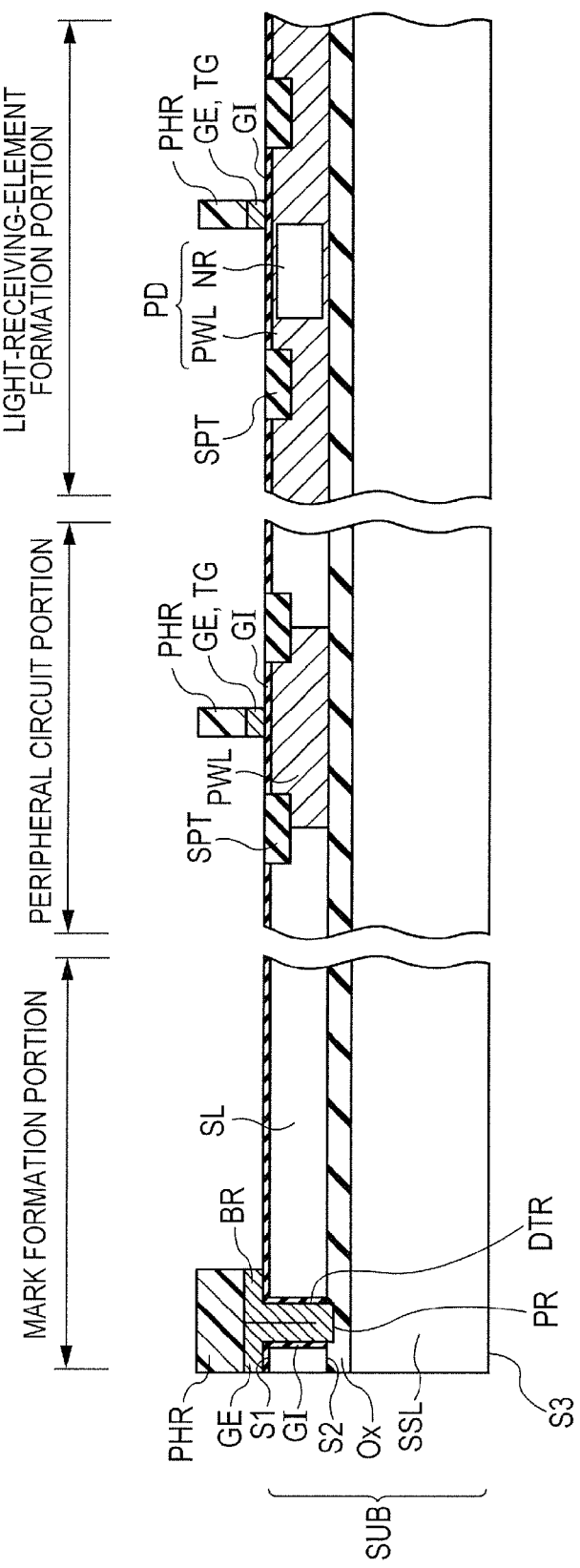
FIG. 54 is a schematic cross-sectional view showing a step of a manufacturing method of the semiconductor device in the third example of Embodiment 2 shown in FIG. 53.

Next, as shown in FIG. 54, a description will be given of a manufacturing method of the alignment mark MK particularly according to the third example in the semiconductor device of Embodiment 2. In these drawings, the mark formation portion, the peripheral circuit portion, and the light-receiving-element formation portion are shown in the same manner as in the drawings showing the foregoing individual steps.

As shown in FIG. 54, after the same treatment as in, e.g., FIGS. 45 to 49 is performed, a photoresist PHR is applied onto the polysilicon layer PS1 and patterned using a typical photoengraving technique. At this time, the photoresist PHR is formed into a pattern covering a region located immediately above the gate insulating film GI (where the gate electrodes GE are formed) and a region located immediately above the trench portion DTR and also including the periphery (vicinity) of the trench portion DTR. The pattern of the photoresist PHR immediately above the trench portion DTR may also have a width in the direction along the front main surface S1 which is larger than that of the trench portion DTR.

Using the photoresist PHR patterned as described above as a mask, typical etching is performed to pattern the polysilicon layer PS1. As a result, the gate electrode GE and the polysilicon layer GE forming the alignment mark MK are simultaneously formed. Here, the polysilicon layer GE forming the alignment mark MK is formed to have the brim portion BR protruding upwardly above the trench portion DTR (above the main surface S1, i.e., on a side opposite to the side on which the on-chip lenses are disposed).

Thereafter, the same treatment as the treatment performed after the step shown in FIG. 50 described above is performed to form the semiconductor device DEV having the same form as in, e.g., FIG. 53.

Figure 55:
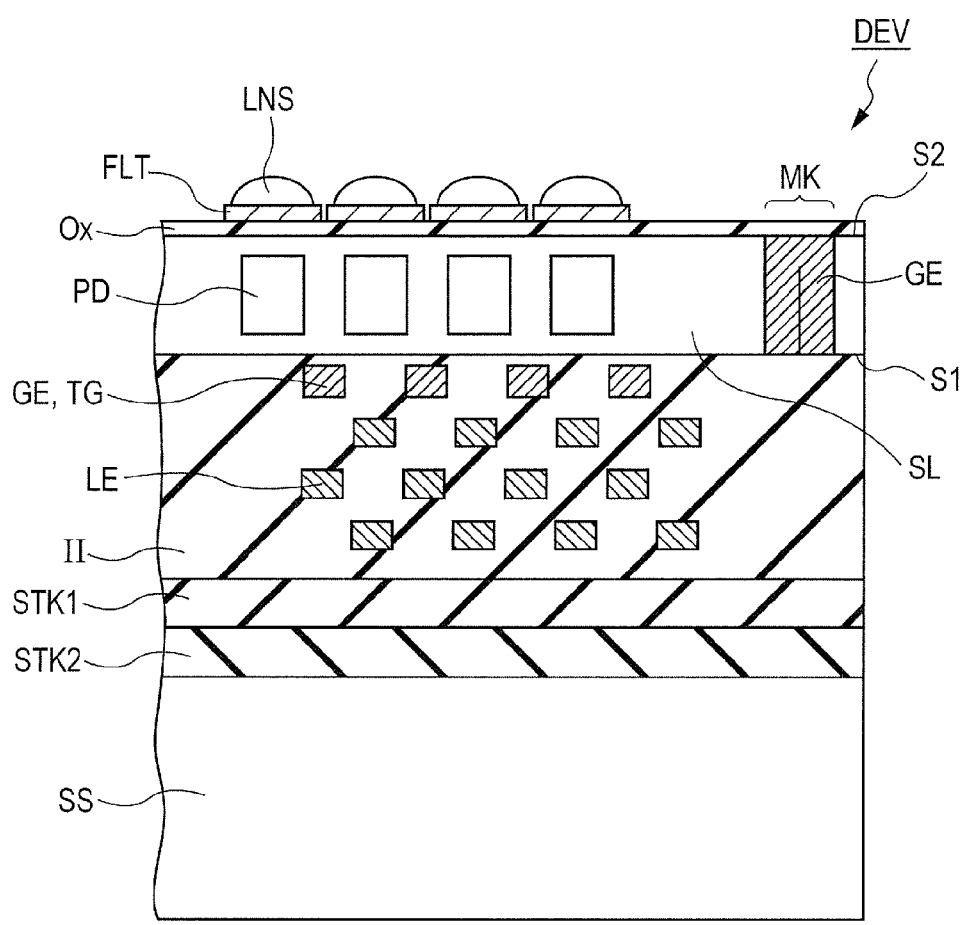
FIG. 55 is a schematic cross-sectional view showing a form of the light-receiving-element formation portion in which the photodiodes, the transistors, and the fourth example of the form of the alignment mark are formed in the semiconductor device according to Embodiment 2.

Next, as another modification, the fourth to sixth examples of Embodiment 2 will be described. As shown in FIG. 55, the semiconductor device DEV according to the fourth example of Embodiment 2 is basically the same as the semiconductor device DEV of the first example of Embodiment 2. However, the fourth example is different from the foregoing first example in that the alignment mark MK does not have the protruding portion PR.

Figure 56:
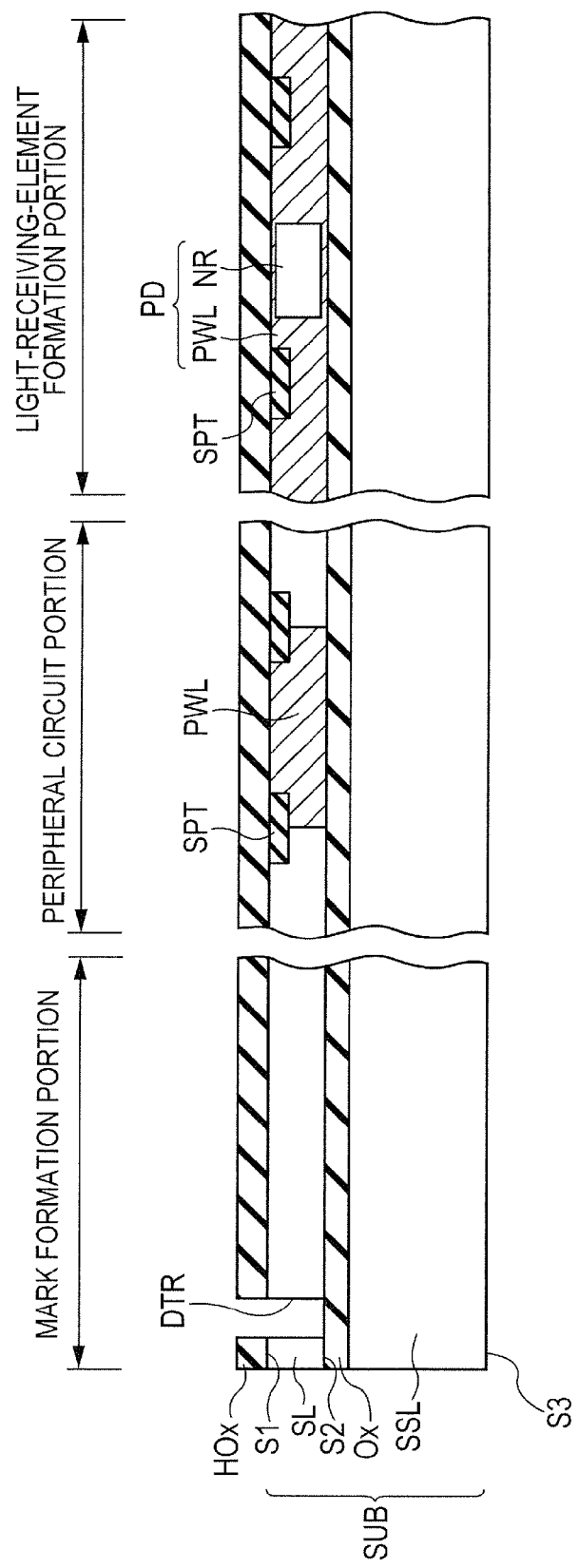
FIG. 56 is a schematic cross-sectional view showing the first step of a manufacturing method of the semiconductor device in the fourth example of Embodiment 2 shown in FIG. 55.
Figure 57:
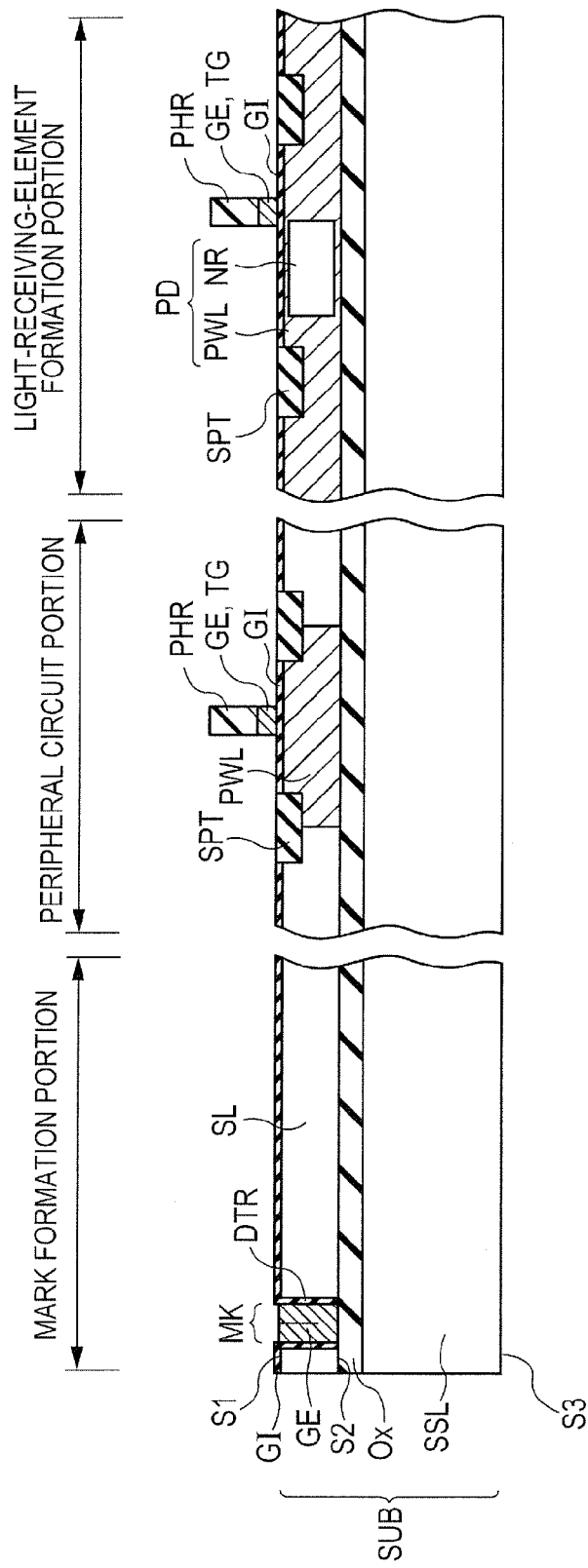
FIG. 57 is a schematic cross-sectional view showing the second step of the manufacturing method of the semiconductor device in the fourth example of Embodiment 2 shown in FIG. 55.

As shown in FIGS. 56 to 57, a manufacturing method of the fourth example of Embodiment 2 is basically the same as the manufacturing method of the first example of Embodiment 2. FIGS. 56 and 57 are the same as FIGS. 46 and 50, respectively. However, FIGS. 56 and 57 are different from FIGS. 46 and 50 in that the semiconductor layer SL is etched such that the trench portion DTR does not enter the insulating film layer Ox but stops at the uppermost surface (back main surface S2) of the insulating film layer Ox. The form is the same as in the steps of FIGS. 39 to 41. Therefore, in the manufacturing method, the protruding portion PR is not formed. The manufacturing method of the fourth example is otherwise the same as that of the foregoing first example.

Figure 58:
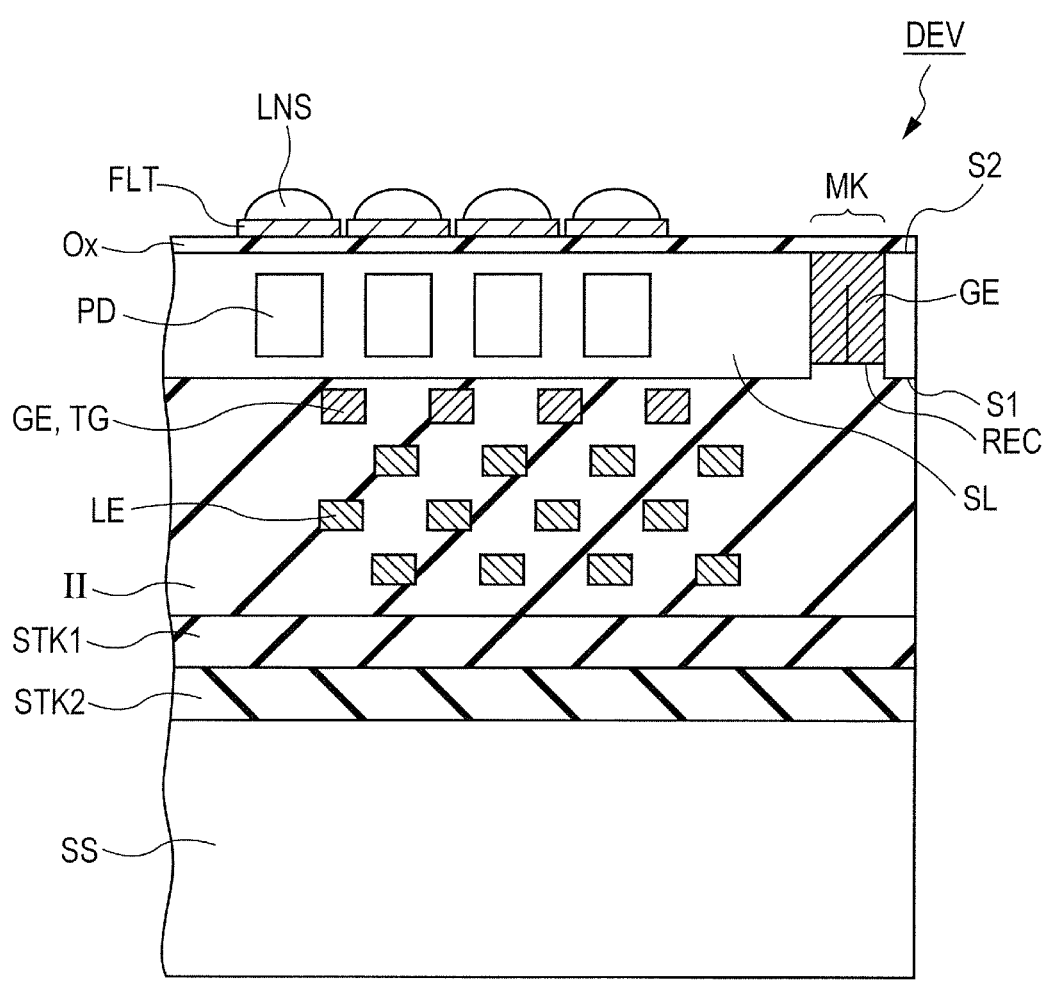
FIG. 58 is a schematic cross-sectional view showing a form of the light-receiving-element formation portion in which the photodiodes, the transistors, and the fifth example of the form of the alignment mark are formed in the semiconductor device according to Embodiment 2.

As shown in FIG. 58, the semiconductor device DEV according to the fifth example of Embodiment 2 has basically the same configuration as that of the semiconductor device DEV of the fourth example, but is different therefrom in that, in the same manner as in, e.g., the second example, the alignment mark MK has the recessed portion REC.

Figure 59:
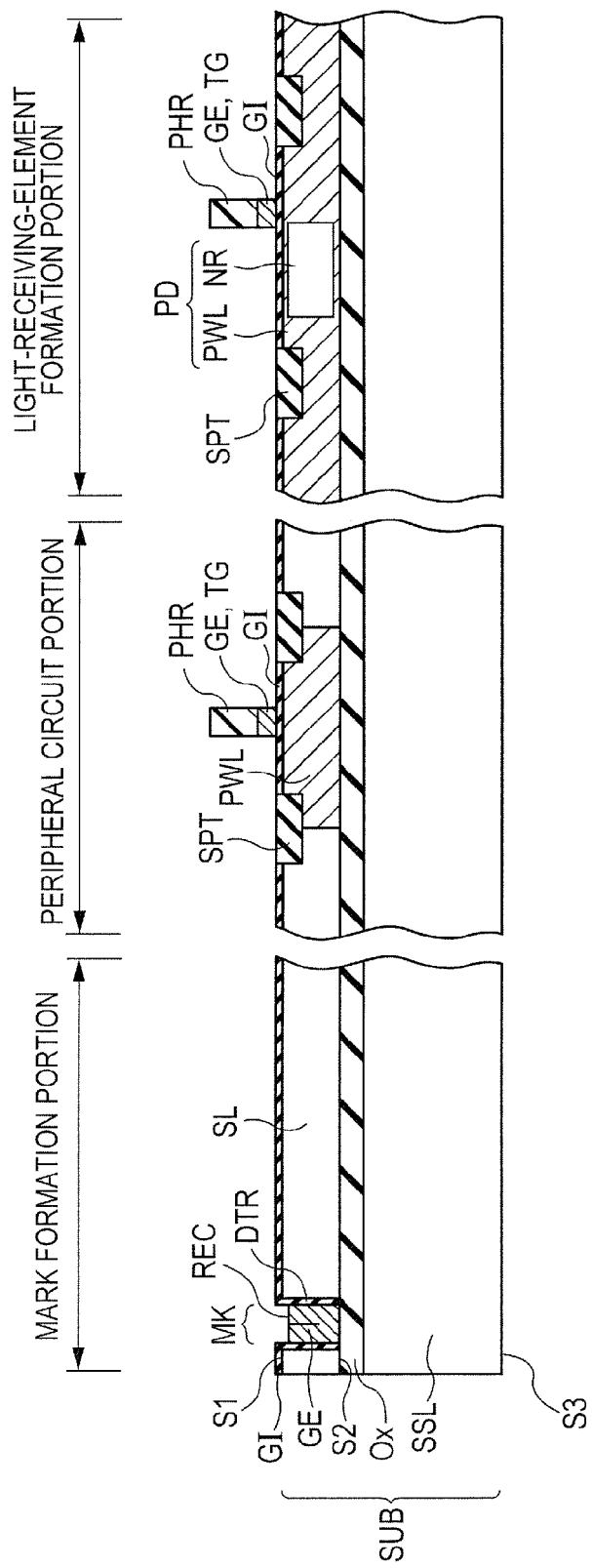
FIG. 59 is a schematic cross-sectional view showing a step of a manufacturing method of the semiconductor device in the fifth example of Embodiment 2 shown in FIG. 58.

As shown in FIG. 59, the manufacturing method of the fifth example of Embodiment 2 is the same as the manufacturing method of the fourth example (FIG. 57) but, similarly to, e.g., the manufacturing method of the second example (FIG. 52), the recessed portion REC is formed.

Figure 60:
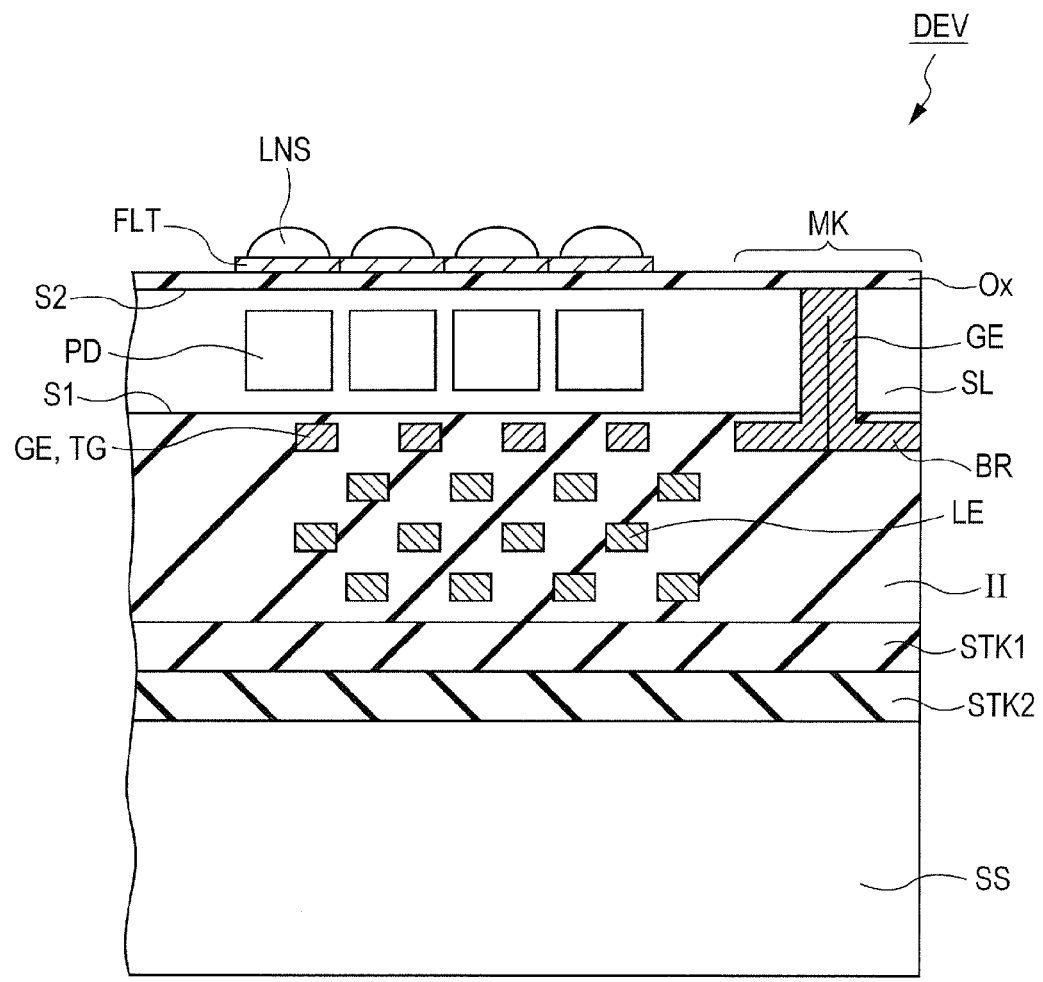
FIG. 60 is a schematic cross-sectional view showing a form of the light-receiving-element formation portion in which the photodiodes, the transistors, and the sixth example of the form of the alignment mark are formed in the semiconductor device according to Embodiment 2.

As shown in FIG. 60, the semiconductor device DEV according to the sixth example of Embodiment 2 has basically the same configuration as that of the semiconductor device DEV of the fourth example, but is different therefrom in that, in the same manner as in the third example, the alignment mark MK has the brim portion BR.

Figure 61:
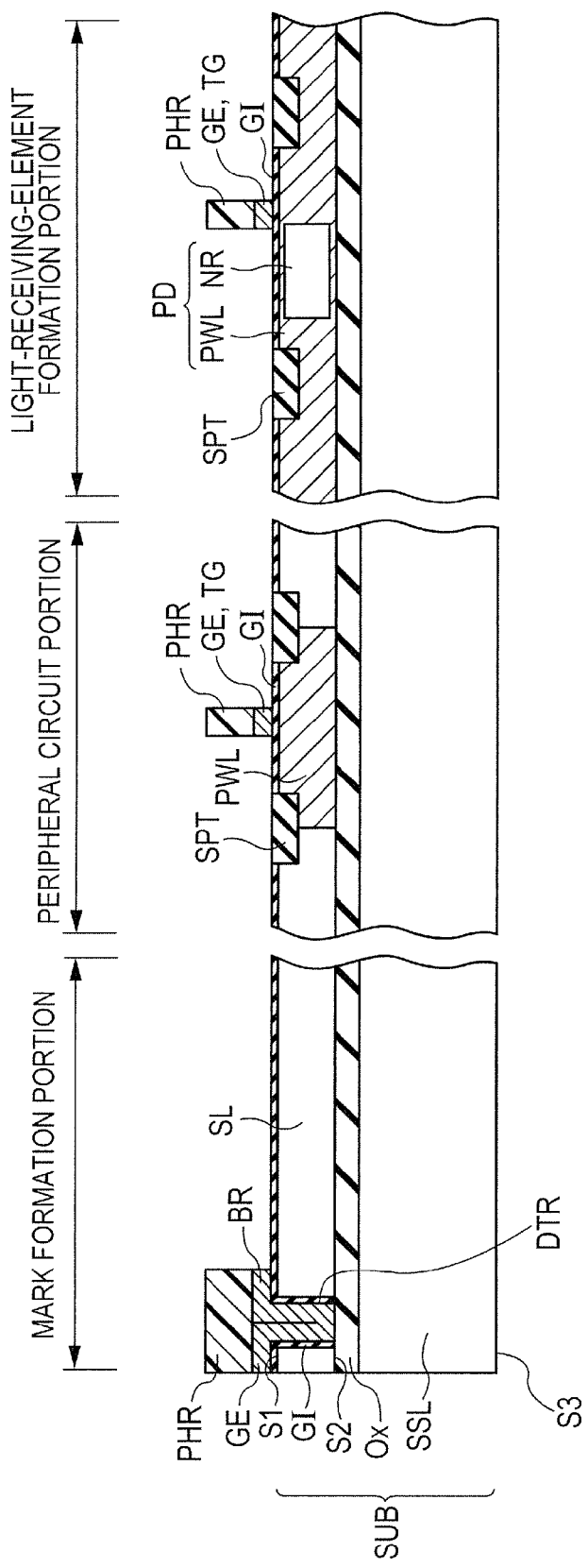
FIG. 61 is a schematic cross-sectional view showing a step of a manufacturing method of the semiconductor device in the sixth example of Embodiment 2 shown in FIG. 60.

As shown in FIG. 61, the manufacturing method in the sixth example of Embodiment 2 is the same as the manufacturing method of the third example (FIG. 54), but is different therefrom in that, in the same manner as in, e.g., the manufacturing method of the fourth example (FIG. 57), the protruding portion PR is not formed.

Next, a description will be given of the function/effect of Embodiment 2. In Embodiment 2, in addition to the function/effect of Embodiment 1, the following function/effect is achieved.

In Embodiment 2, the gate electrodes GE and the polysilicon layer PS1 of the alignment mark MK are formed in the same layer. That is, the step of forming the gate electrodes GE is used also as the step of forming the alignment mark MK. Accordingly, compared to the case where, e.g., the gate electrodes GE and the alignment mark MK each mentioned above are formed in separate steps, it is possible to reduce the number of processing steps and manufacturing cost.

Also, if the alignment mark MK having the brim portion BR is used as in, e.g., the foregoing third and sixth examples, the brim portion BR can be used not only for alignment in the step for the back side (main surface S2 side) (on which the on-chip lenses LNS or the like are formed), but also for alignment in the steps (such as the step of forming a protective film for contacts and the photodiodes PD) for the front side (main surface S1 side) including and subsequent to the formation of the gate electrodes GE. The alignment mark MK has a form in which the polysilicon layer GE formed particularly inside the trench portion DTR has the brim portion BR protruding upwardly above the front main surface S1 (having a width larger than that of the trench portion DTR) so that a pattern of an arbitrary mark of the polysilicon layer GE is disposed at a position two-dimensionally overlapping the alignment mark MK. Accordingly, compared to the case where, e.g., the pattern of the mark of the polysilicon layer GE is formed at a position different from that of the alignment mark MK, the area occupied by the mark in the main surface S1 can be reduced.

Thus, if the foregoing third and sixth examples are used, by forming the alignment mark MK used for alignment during processing over the front main surface S1 including and subsequent to gate processing at the two-dimensionally same position as that of the alignment mark MK for the back main surface S2, the use efficiency of the alignment mark MK can be maximized.

When the conductive layer PS1 of the alignment mark MK and the conductive layer PS1 of each of the gate electrodes GE are formed in the same layer as in Embodiment 2, by the oxidation step for forming the gate insulating film prior thereto, the side surface of the trench portion DTR for forming the alignment mark MK is also simultaneously oxidized (see FIG. 48). Consequently, between the side surface of the trench portion DTR and the conductive layer PS1 of the alignment mark MK, the oxide film GI corresponding to the gate insulating film is interposed. By contrast, when the conductive layer PS1 of the alignment mark MK and the conductive layer PS1 of each of the gate electrodes GE are formed in different steps as in Embodiment 1, the conductive layer PS1 of the alignment mark is formed to come in direct contact with substrate silicon at the side surface of the trench portion DTR so that no oxide film is present therebetween (see FIG. 7). Accordingly, if the absence of the oxide film GI corresponding to the gate insulating film at the side surface of the trench portion DR for forming the alignment mark MK is confirmed, it is possible to confirm the formation of the conductive layer PS1 of the alignment mark MK and the conductive layer PS1 of each of the gate electrodes GE in different steps. Therefore, if there is the oxide film GI formed during the gate oxidation between the conductive layer PS1 forming the alignment mark MK mentioned above and the side surface of the trench portion DTR, it is possible to verify that the conductive layer PS1 of the alignment mark MK and the conductive layer PS1 of each of the gate electrodes GE are formed in the same layer.

Embodiment 2 of the present invention is different from Embodiment 1 of the present invention only in the points described above. That is, the configurations, conditions, procedures, effects, and the like which are not described above about Embodiment 2 of the present invention are all based on those of Embodiment 1 of the present invention.

Embodiment 3

Compared to Embodiment 2, Embodiment 3 is different therefrom in the configuration of the alignment mark MK. Hereinbelow, using FIGS. 62 to 95, a description will be given of Embodiment 3.

Figure 62:
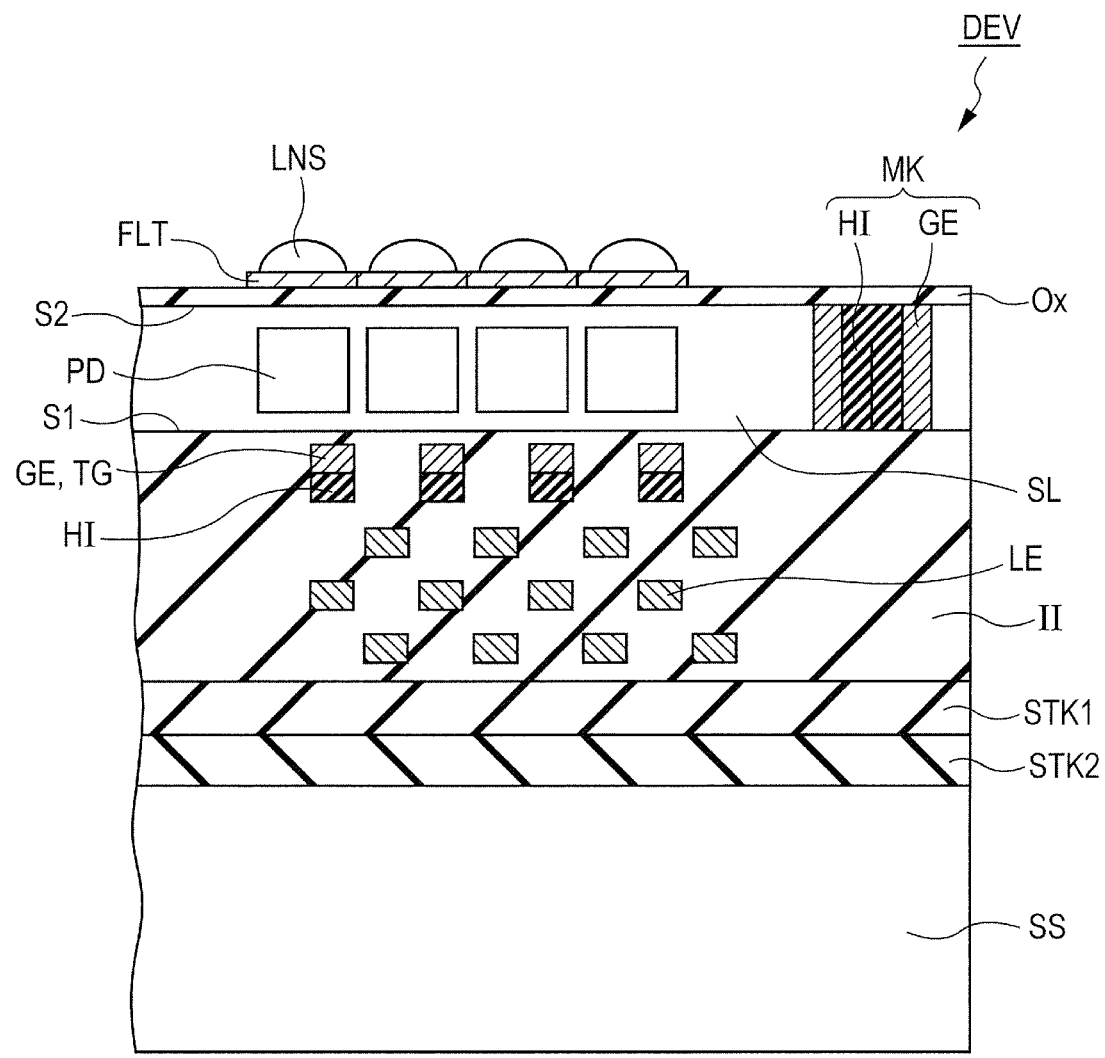
FIG. 62 is a schematic cross-sectional view showing a form of a light-receiving-element formation portion in which photodiodes, transistors, and the first example of a form of an alignment mark are formed in a semiconductor device according to Embodiment 3.

As shown in FIG. 62, the semiconductor device DEV according to the first example of Embodiment 3 has basically the same outer form as that of the semiconductor device DEV shown in FIG. 23. However, in Embodiment 3, the polysilicon layer GE as, e.g., the conductive film or semiconductor film (first layer) forming the alignment mark MK is in the same layer as that of the conductive film forming the gate electrodes GE of the transfer transistors TG. The alignment mark MK of FIG. 62 is filled with an insulating layer HI in the same layer as that of the insulating layer HI (second layer which is an insulating film) formed to come in contact with the gate electrodes GE of the transfer transistors TG as a hard mask (gate processing mask) for forming the gate electrodes GE.

In other words, the polysilicon layer GE forming the alignment mark MK in the first example of Embodiment 3 is the first layer forming the gate electrodes GE of the transistors TG. The insulating layer HI forming the alignment mark MK has been formed simultaneously with and as the same layer as the insulating layer HI as the hard mask for forming the gate electrode GE. The polysilicon layer GE forming the alignment mark MK and the conductive film forming the gate electrodes GE are originally formed as the same conductive film or semiconductor film (first layer). In the subsequent step, a part of the first layer is removed by etching to result in the form shown in FIG. 62. Likewise, the insulating layer HI forming the alignment mark MK in the first example of Embodiment 3 is originally formed as the same layer as the insulating layer (silicon oxide film or silicon nitride film) forming the hard mask formed over the gate electrodes GE so as to form the gate electrodes GE. In the subsequent step, a part of the insulating layer is removed by etching to result in the form shown in FIG. 62.

In the first example of Embodiment 3, the polysilicon layer GE as the first layer forming the alignment mark MK and the insulating layer HI inward thereof are preferably formed to fill the inside of the trench portion formed in the semiconductor layer SL so as to form the alignment mark in the same manner as in Embodiments 1 and 2. This can inhibit such a problem that, e.g., a part of the bottom surface or side surface of the trench portion is exposed and the exposed region is unintentionally etched.

The configuration in the first example of Embodiment 3 is different from the configuration in the fourth example of Embodiment 1 of FIG. 23 in the foregoing point and otherwise the same. Therefore, the description of the same components will not be repeated by providing them with the same reference numerals.

Next, referring to FIGS. 63 to 70, a description will be given of a manufacturing method of the alignment mark MK according to the first example in the semiconductor device of Embodiment 3.

Figure 63:
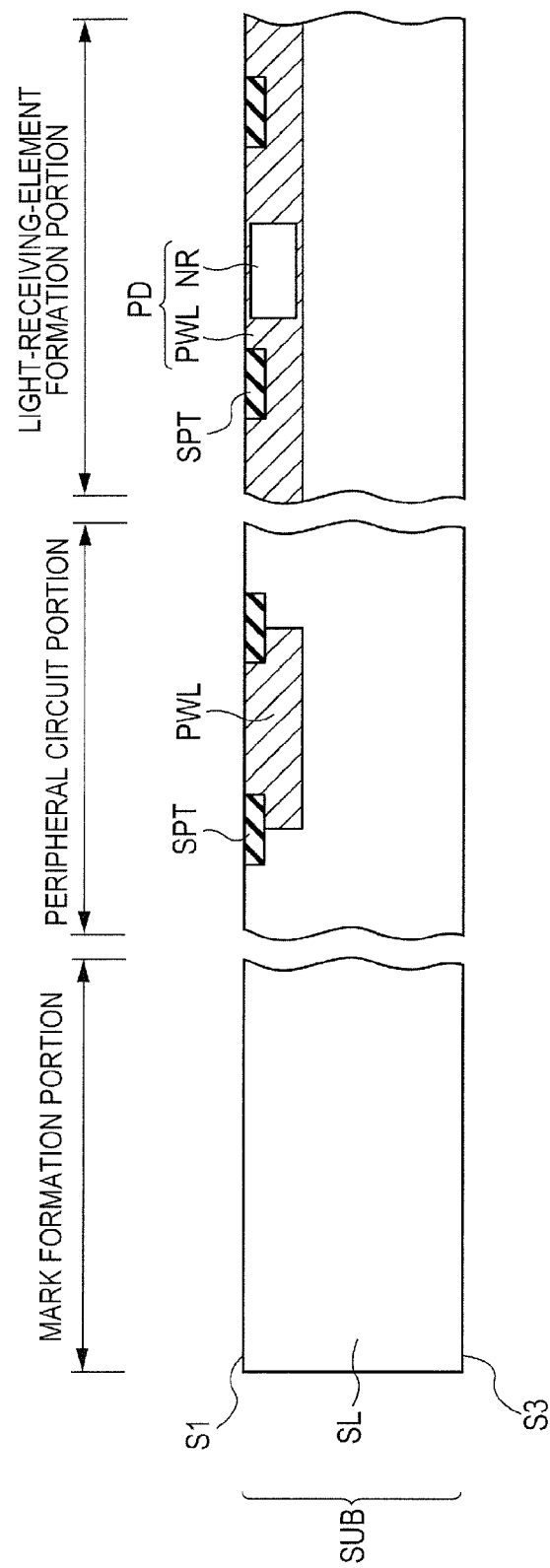
FIG. 63 is a schematic cross-sectional view showing the first step of a manufacturing method of the semiconductor device in the first example of Embodiment 3 shown in FIG. 62.

As shown in FIG. 63, the same semiconductor substrate SUB as in FIG. 25 is prepared first. For example, in the same manner as in the step of FIG. 45, in the desired areas of the light-receiving-element formation portion and the peripheral circuit portion of the semiconductor substrate SUB, e.g., the photodiodes PD, the isolation regions SPT, and the like are formed first.

Figure 64:
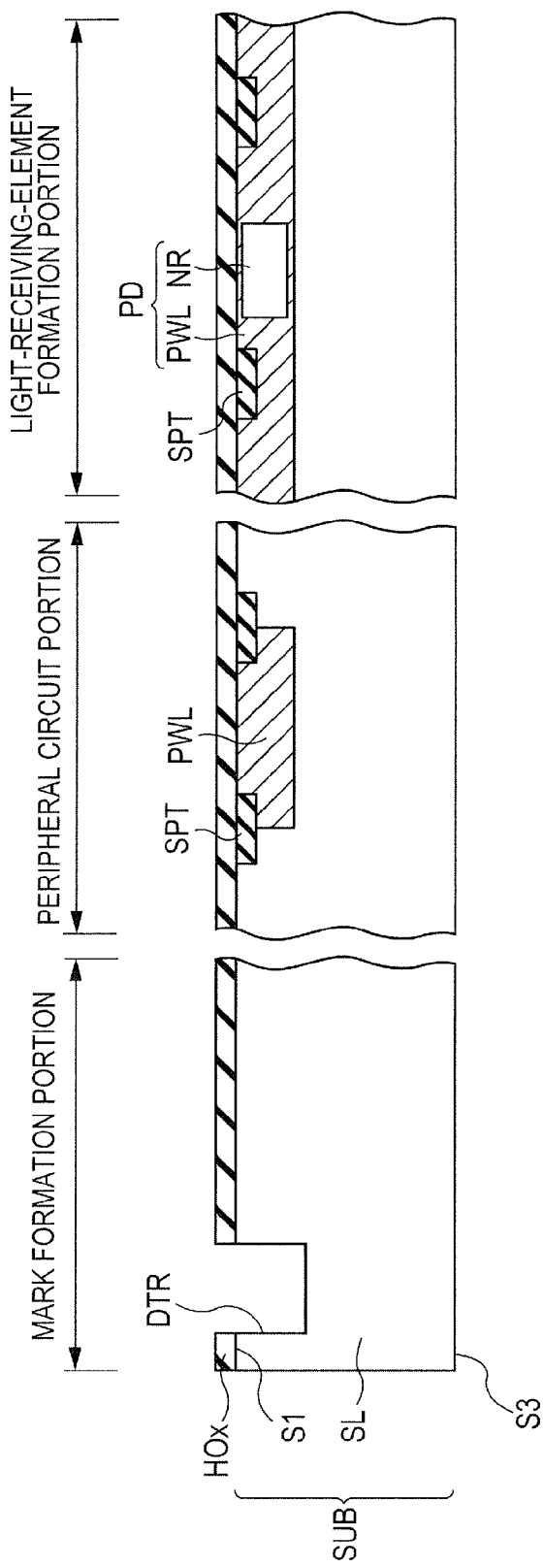
FIG. 64 is a schematic cross-sectional view showing the second step of the manufacturing method of the semiconductor device in the first example of Embodiment 3 shown in FIG. 62.

As shown in FIG. 64, in the same manner as in the step of FIG. 25 (FIG. 46), an insulating film such as, e.g., the silicon oxide film HOx is formed first and patterned. Then, using the patterned silicon oxide film HOx as a hard mask (trench processing mask), the trench portion DTR is formed. The size of the trench portion DTR is preferably determined to be the same as in the step of, e.g., FIG. 25.

Figure 65:
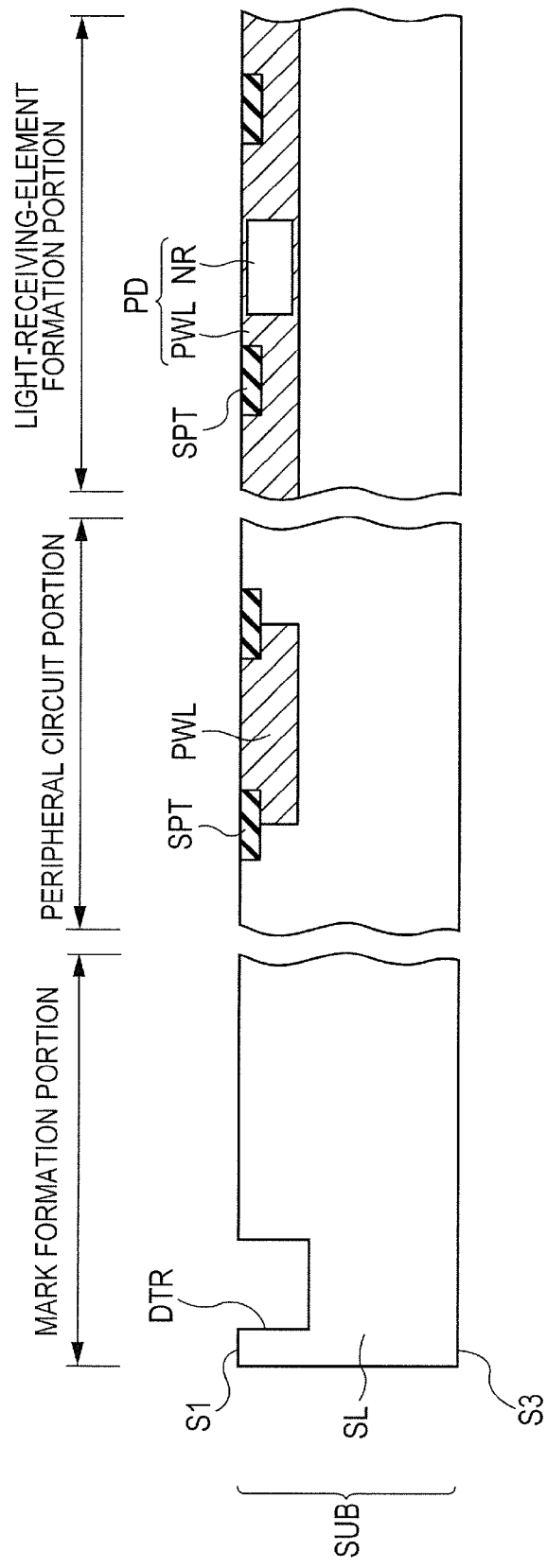
FIG. 65 is a schematic cross-sectional view showing the third step of the manufacturing method of the semiconductor device in the first example of Embodiment 3 shown in FIG. 62.
Figure 66:
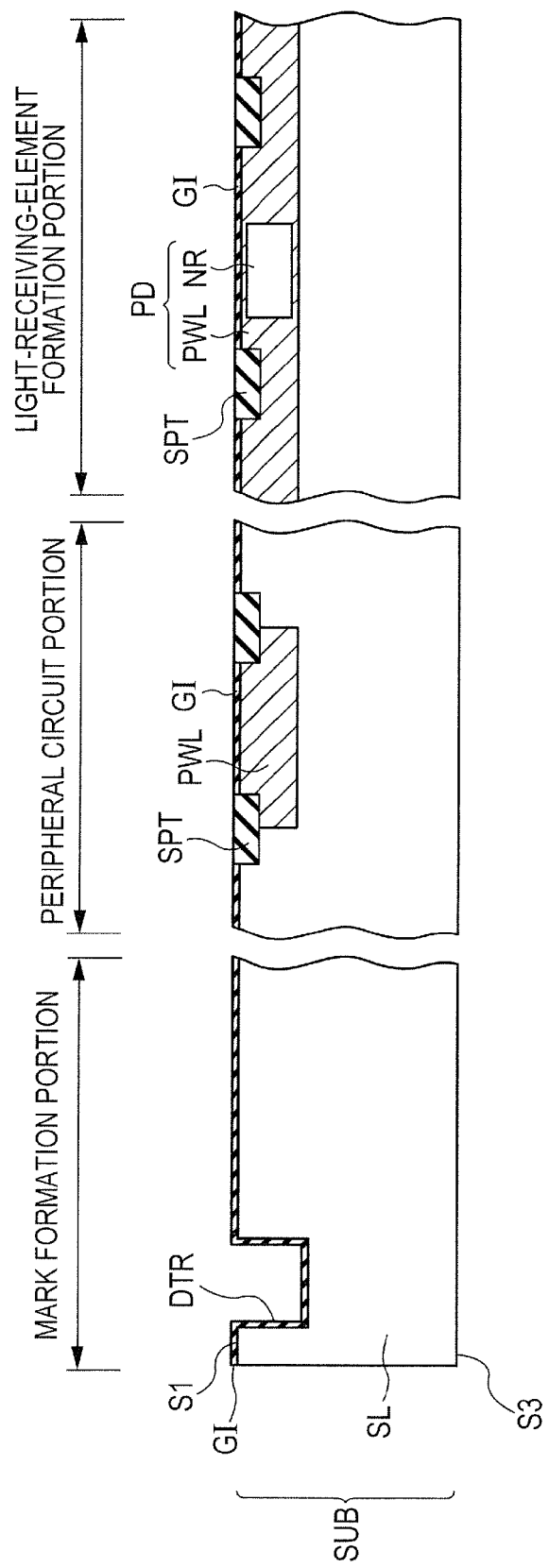
FIG. 66 is a schematic cross-sectional view showing the fourth step of the manufacturing method of the semiconductor device in the first example of Embodiment 3 shown in FIG. 62.

As shown in FIG. 65, the silicon oxide film HOx is removed using, e.g., a diluted aqueous hydrofluoric acid solution. As shown in FIG. 66, in the same manner as in the step of FIG. 48, the insulating film GI comprised of a silicon oxide film is formed over the front main surface S1 and the side surface and bottom surface of the trench portion DTR by, e.g., a typical thermal oxidation method.

Figure 67:
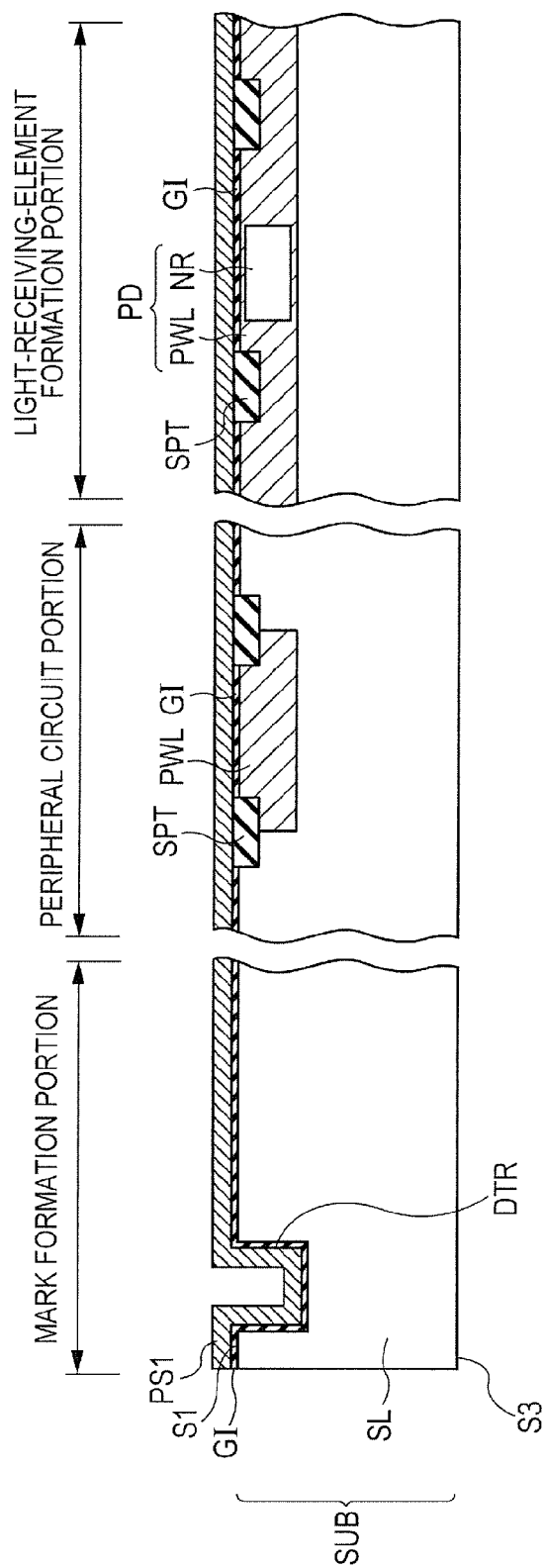
FIG. 67 is a schematic cross-sectional view showing the fifth step of the manufacturing method of the semiconductor device in the first example of Embodiment 3 shown in FIG. 62.

As shown in FIG. 67, in the same manner as in the step of FIG. 26, a conductive film or a semiconductor film (first layer) such as, e.g., the polysilicon layer PS1 is formed by, e.g., a CVD method so as to cover the inner peripheral wall surface of the trench portion DTR and the upper surface of the front main surface S1 formed with the insulating film GI. The first layer formed here is the same as the first layer in the step of FIG. 7. When the polysilicon layer PS1 formed here is a semiconductor film not containing an impurity, an impurity is implanted (into at least the regions of the polysilicon layer PS1 serving as the gate electrodes GE).

Alternatively, as the first layer PS1, e.g., a thin film containing a metal material may also be formed.

Figure 68:
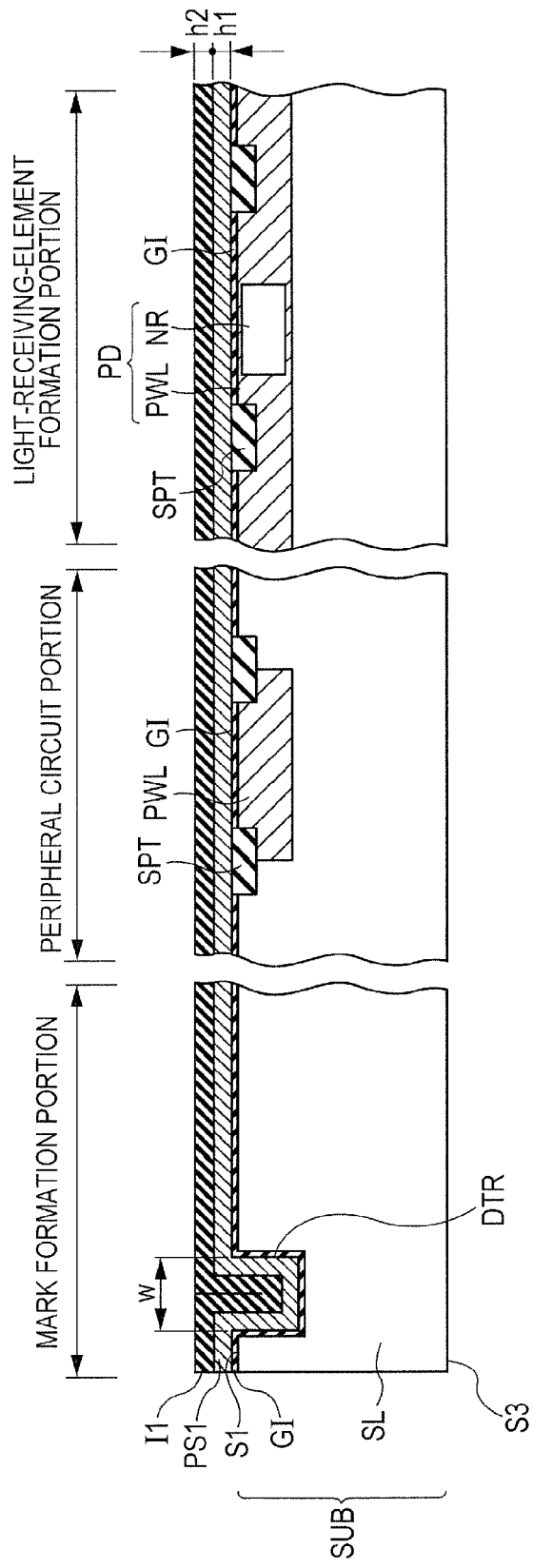
FIG. 68 is a schematic cross-sectional view showing the sixth step of the manufacturing method of the semiconductor device in the first example of Embodiment 3 shown in FIG. 62.

As shown in FIG. 68, in the same manner as in the step of FIG. 27, the insulating layer I1 (second layer) comprised of, e.g., a silicon oxide film or a silicon nitride film is formed so as to cover the upper surface of the polysilicon layer PS1 formed in FIG. 67.

Here, if the width of the trench portion DTR is w, the thickness of the polysilicon layer PS1 is h1, and the thickness of the hard mask insulating layer I1 is h2, it is preferable that w≤2(h1+h2) is satisfied. This allows the polysilicon layer PS1 and the insulating layer I1 to fill the trench portion particularly in the widthwise direction. If the inside of the trench portion DTR is thus filled, such a problem that the exposed region is unintentionally etched in the subsequent silicon etching step can be inhibited.

Figure 69:
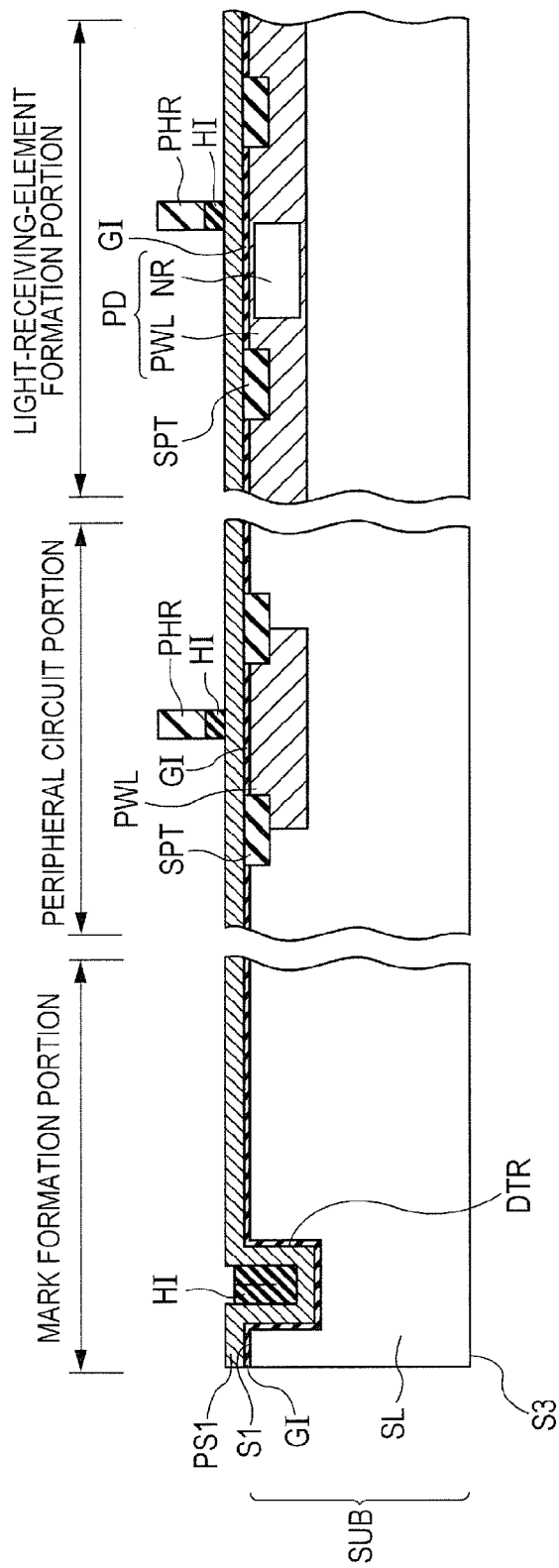
FIG. 69 is a schematic cross-sectional view showing the seventh step of the manufacturing method of the semiconductor device in the first example of Embodiment 3 shown in FIG. 62.

As shown in FIG. 69, onto the insulating layer I1 formed in the step of FIG. 68, the photoresist PHR is applied and patterned using a typical photoengraving technique. Here, for example, a pattern of the photoresist PHR is formed immediately above the region where the gate electrodes GE for forming the transistors TG is to be formed. Then, using the patterned photoresist PHR as a mask, the insulating layer I1 is etched to be patterned. At this time, a part of the insulating layer I1 (i.e., except for at least the insulating layer I1 immediately above the region where the gate electrodes GE are to be formed) located in the region other than the region inside the trench portion DTR (and immediately thereabove) and the region immediately below the pattern of the photoresist PHR is removed to leave the insulating layer I1 as the insulating layer HI in the region inside the trench portion DTR (and immediately thereabove) and the region immediately below the pattern of the photoresist PHR. As a result, the insulating layer HI (identical to the insulating layer I1) immediately above the region where the gate electrodes GE are to be formed remains in a pattern of the hard mask.

Figure 70:
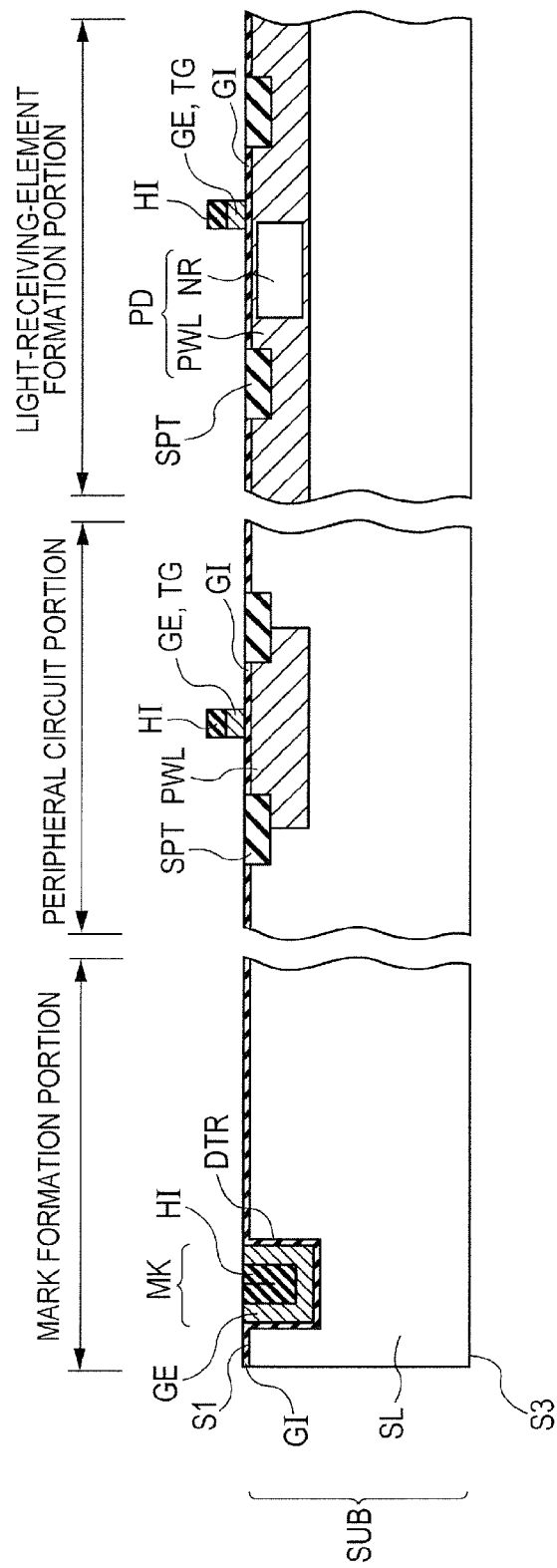
FIG. 70 is a schematic cross-sectional view showing the eighth step of the manufacturing method of the semiconductor device in the first example of Embodiment 3 shown in FIG. 62.

As shown in FIG. 70, after the photoresist PHR is removed, using the insulating layer HI as the gate processing mask, the polysilicon layer PS1 is patterned. As a result, the polysilicon layer PS1 remains immediately below the insulating layer HI to form a pattern of the gate electrodes GE. The polysilicon layer PS1 is etched so as to remain inside the trench portion DTR. At this time, a part of the polysilicon layer PS1 (i.e., except for at least the polysilicon layer PS1 immediately above the region where the gate electrodes GE are to be formed) is removed in the region other than inside the trench portion DTR. As a result, inside the trench portion DTR, the polysilicon layer GE as the same layer as that of the gate electrodes GE (identical to the polysilicon layer PS1) is formed, and the insulating layer HI as the same layer as that of the hard mask insulating layer HI is formed inwardly thereof. That is, inside the trench portion DTR, the alignment mark MK including the polysilicon layer GE and the insulating layer HI inward thereof is formed.

Thereafter, the same treatment (for forming the source/drain regions or the like) as the treatment performed immediately after the step of FIG. 13 is performed, and the same treatment as in FIGS. 14 to 17 is further performed to form the semiconductor device DEV having the same form as shown in, e.g., FIG. 62. Note that, in the same treatment as in the step shown in FIG. 17, the alignment mark MK having the form of FIG. 62 may also be formed by removing the semiconductor substrate SUB to the region shown by, e.g., the dot-dash line A of FIG. 29, or the alignment mark MK having the form of FIG. 24 may also be formed by removing the semiconductor substrate SUB to the region shown by, e.g., the dot-dash line B of FIG. 29.

Figure 71:
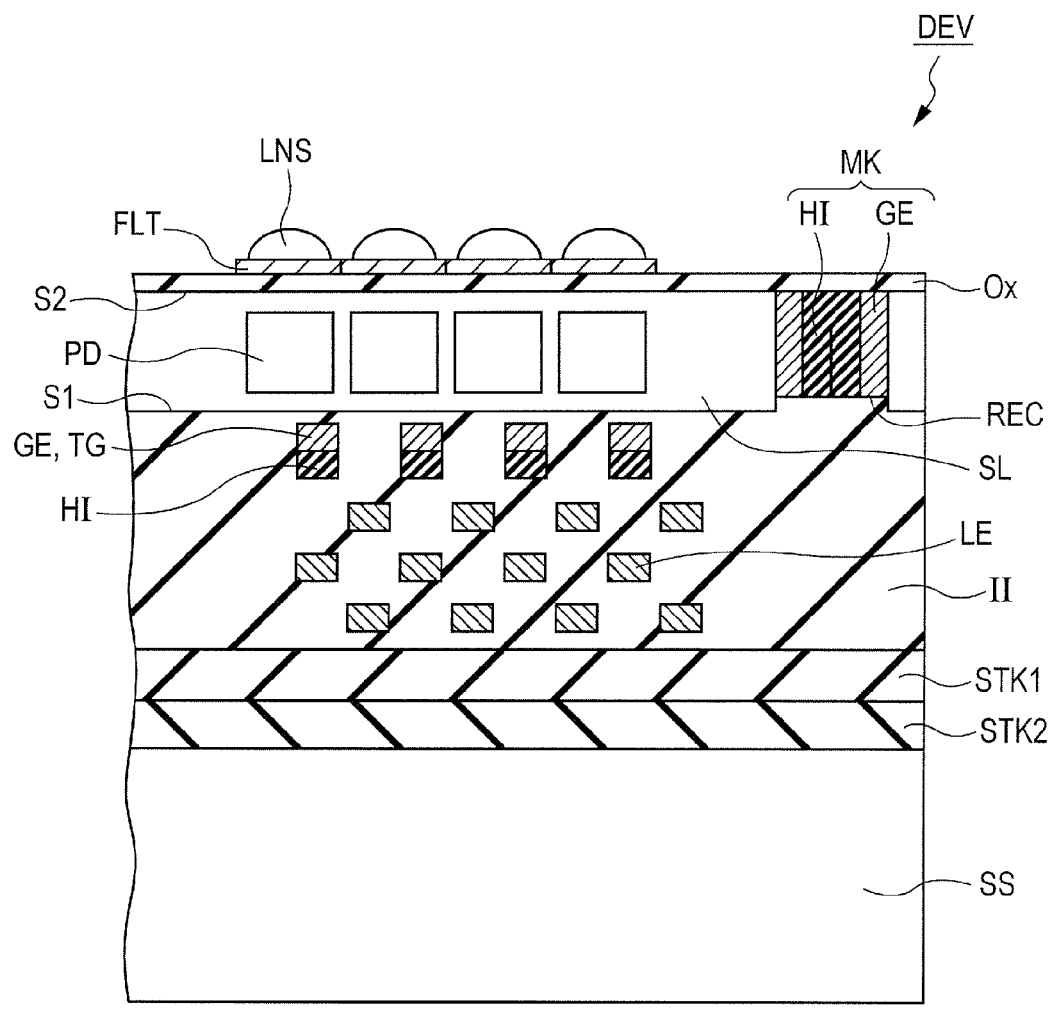
FIG. 71 is a schematic cross-sectional view showing a form of the light-receiving-element formation portion in which the photodiodes, the transistors, and the second example of the form of the alignment mark are formed in the semiconductor device according to Embodiment 3.

As shown in FIG. 71, the semiconductor device DEV according to the second example of Embodiment 3 has basically the same configuration as that of the semiconductor device DEV of the first example of Embodiment 3, but is different therefrom in that the alignment mark MK has the recessed portion REC in the same manner as in, e.g., the second example of Embodiment 1 (FIG. 20).

Figure 72:
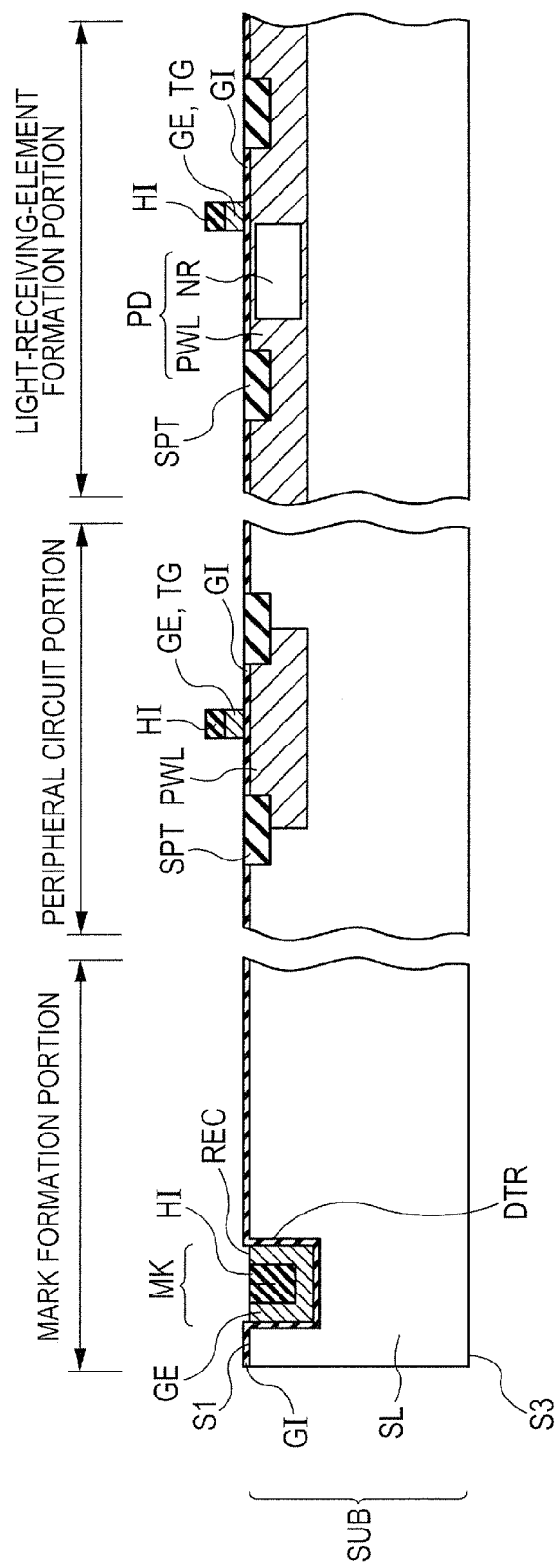
FIG. 72 is a schematic cross-sectional view showing a step of a manufacturing method of the semiconductor device in the second example of Embodiment 3 shown in FIG. 71.

As shown in FIG. 72, a manufacturing method in the second example of Embodiment 3 is the same as the manufacturing method in the first example (FIG. 70) but, in the same manner as in the manufacturing methods in the foregoing other examples, the recessed portion REC may also be formed.

Figure 73:
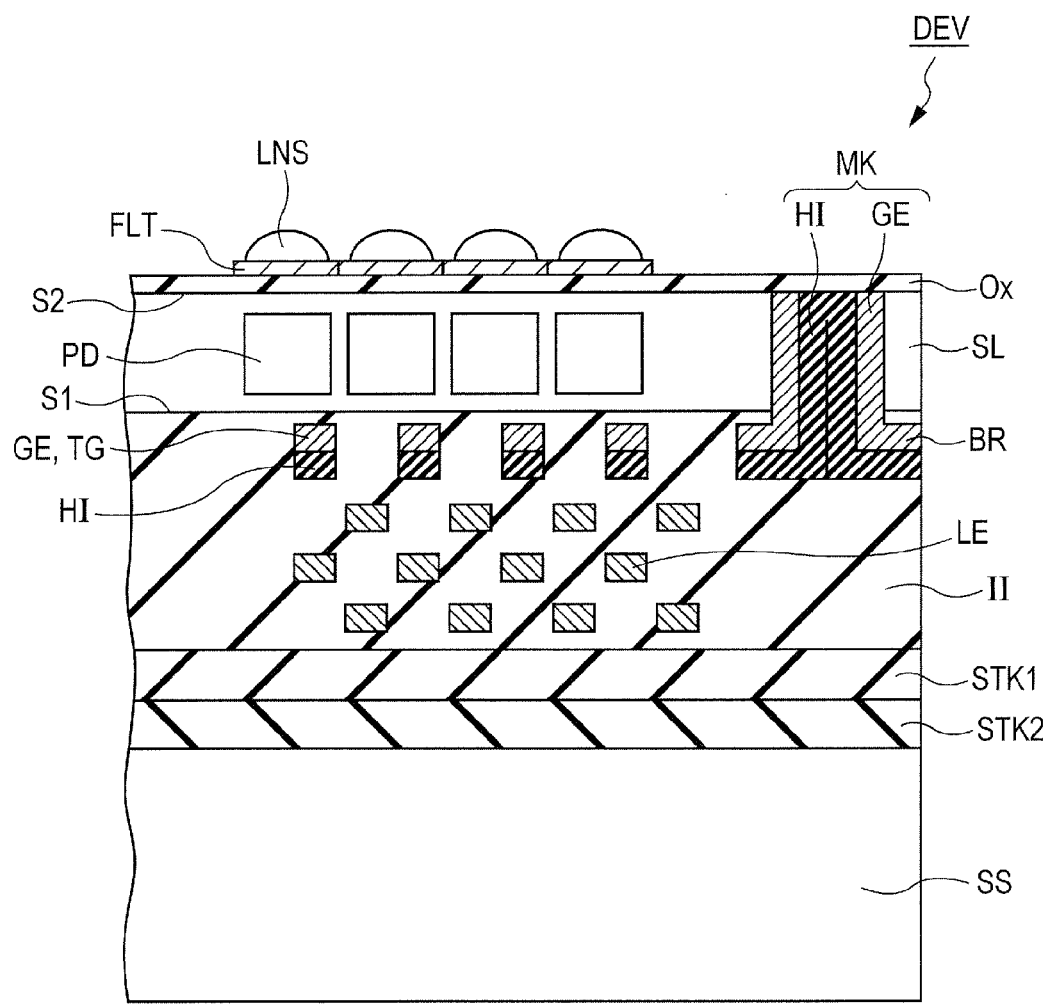
FIG. 73 is a schematic cross-sectional view showing a form of the light-receiving-element formation portion in which the photodiodes, the transistors, and the third example of the form of the alignment mark are formed in the semiconductor device according to Embodiment 3.

As shown in FIG. 73, in the semiconductor device according to the third example of Embodiment 3, basically similarly to the alignment mark MK in the first example of Embodiment 3, the alignment mark MK is formed in the same layer as that of the polysilicon layer PS1 forming the gate electrodes GE. However, the foregoing alignment mark MK of the third example is formed to have the brim portion BR in which the polysilicon layer GE and the insulating layer HI protrude downwardly (on the lower side opposite to the upper side on which the on-chip lenses are disposed) below the front main surface S1 of the semiconductor layer SL, similarly to the alignment mark MK of, e.g., FIG. 53. It is assumed that, in the alignment mark MK, each of the polysilicon layer GE and the insulating layer HI includes the brim portion BR to form the alignment mark MK.

The configuration of the foregoing third example is different from the configuration of the foregoing first example in the form of the alignment mark MK described above and otherwise the same as the configuration of the first example. Therefore, the description of the same components will not be repeated by providing them with the same reference numerals.

Next, referring to FIGS. 74 and 75, a description will be given of a manufacturing method of the alignment mark MK particularly according to the third example in the semiconductor device of Embodiment 3.

Figure 74:
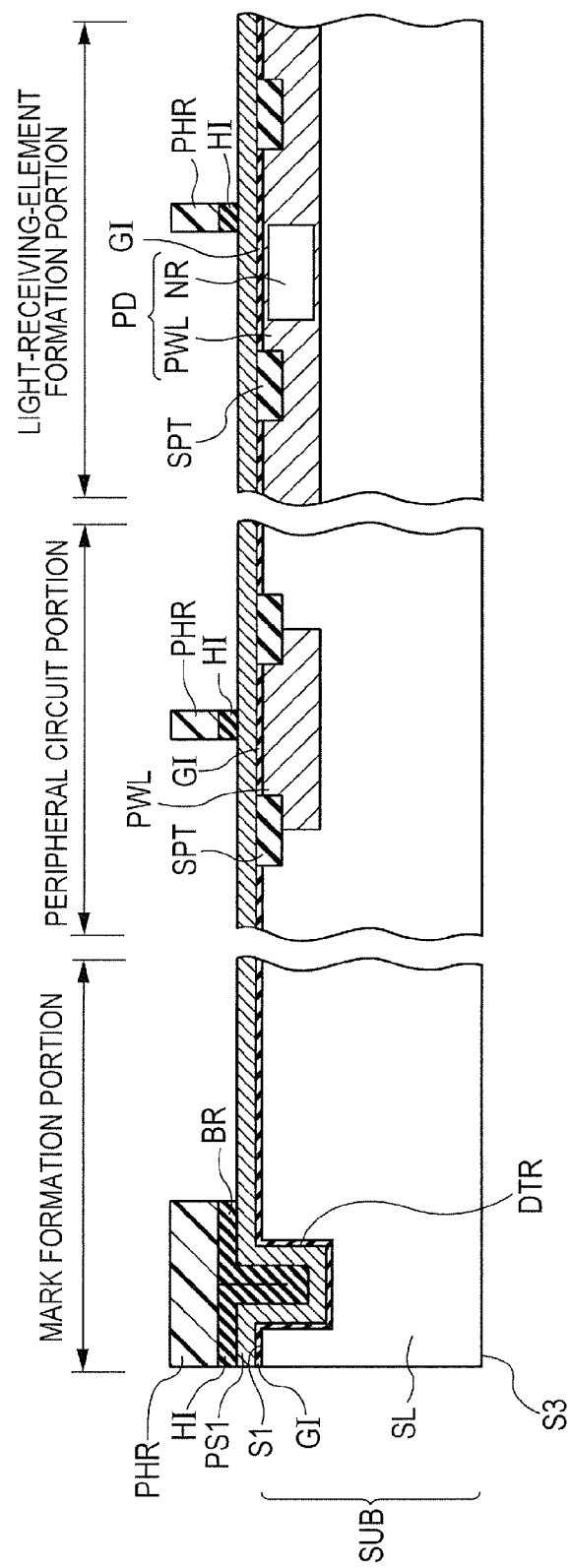
FIG. 74 is a schematic cross-sectional view showing the first step of a manufacturing method of the semiconductor device in the third example of Embodiment 3 shown in FIG. 73.

As shown in FIG. 74, after the same treatment as in, e.g., FIGS. 63 to 68 is performed, the photoresist PHR is applied onto the insulating layer I1 formed in the step of FIG. 68 and patterned using a typical photoengraving technique. Here, for example, a pattern of the photoresist PHR is formed immediately above the region where the gate electrodes GE for forming the transistors TG are to be formed and immediately above the trench portion DTR (and in the vicinity thereof).

Then, using the photoresist PHR as a mask, typical etching is performed to pattern the insulating layer I1. At this time, to provide the form in which the photoresist PHR and the insulating layer I1 remain in the region where the alignment mark MK is to be formed, a part of the insulating layer I1 in the region other than the region where the alignment mark MK is to be formed is removed by etching. As a result, the insulating layer I1 located inside and immediately above the trench portion DTR (and in the vicinity thereof) (identical to the insulating layer I1) remains as the insulating layer HI, and the insulating layer I1 immediately above the region where the gate electrodes GE are to be formed remains as the pattern of the hard mask (gate processing mask). However, in comparison to that in, e.g., FIG. 69, the insulating layer HI (in the same layer as the insulating layer I1 as the gate processing mask) located inside and immediately above the trench portion DTR is formed to have the brim portion BR protruding in the upward direction of the drawing.

Figure 75:
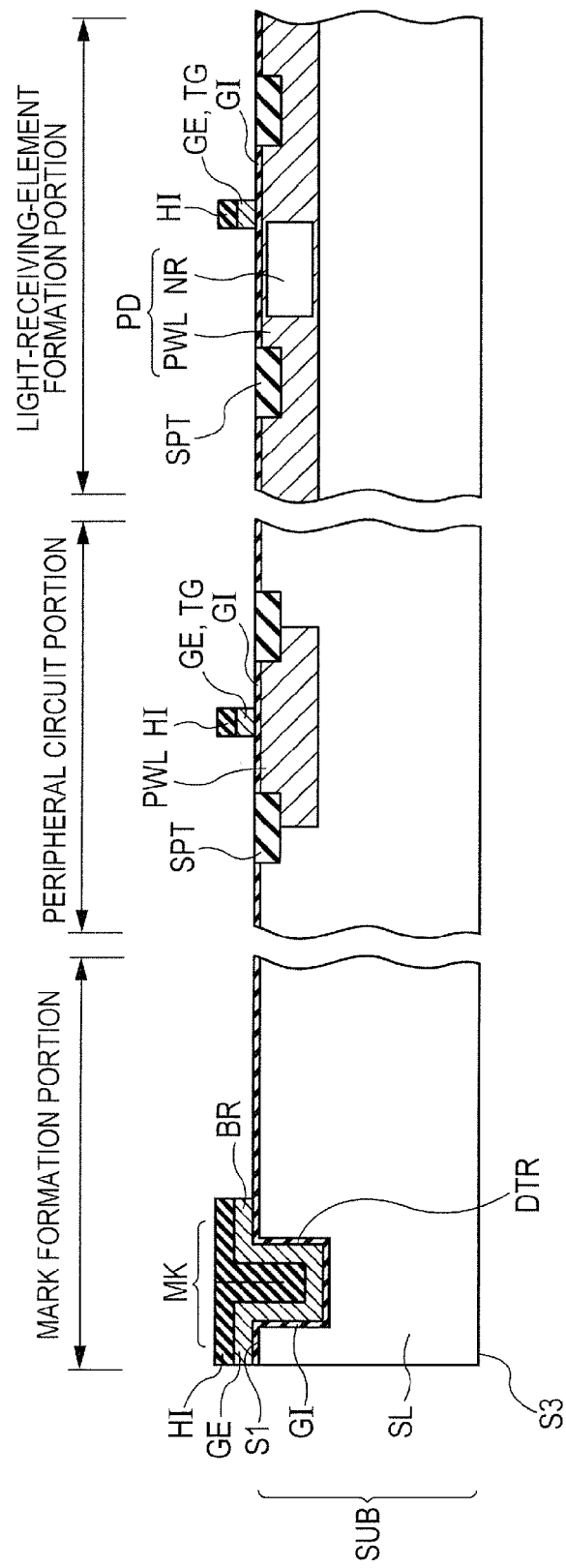
FIG. 75 is a schematic cross-sectional view showing the second step of the manufacturing method of the semiconductor device in the third example of Embodiment 3 shown in FIG. 73.

As shown in FIG. 75, after the photoresist PHR is removed, in the same manner as in the step of, e.g., FIG. 70, using the pattern of the insulating layer HI as a hard mask for gate electrode processing, typical etching is performed. By the treatment, the polysilicon layer PS1 is etched to remain immediately below the hard mask insulating film HI and form the alignment mark MK having the brim portion BR. In this manner, the pattern is formed as the alignment mark MK such that each of the polysilicon layer PS1 and the insulating layer II has the brim portion BR above the font-side main surface S1.

Thereafter, the same treatment as in the steps subsequent to the step shown in FIG. 70 in the first example is performed to form the semiconductor device DEV having the form of FIG. 73.

Figure 76:
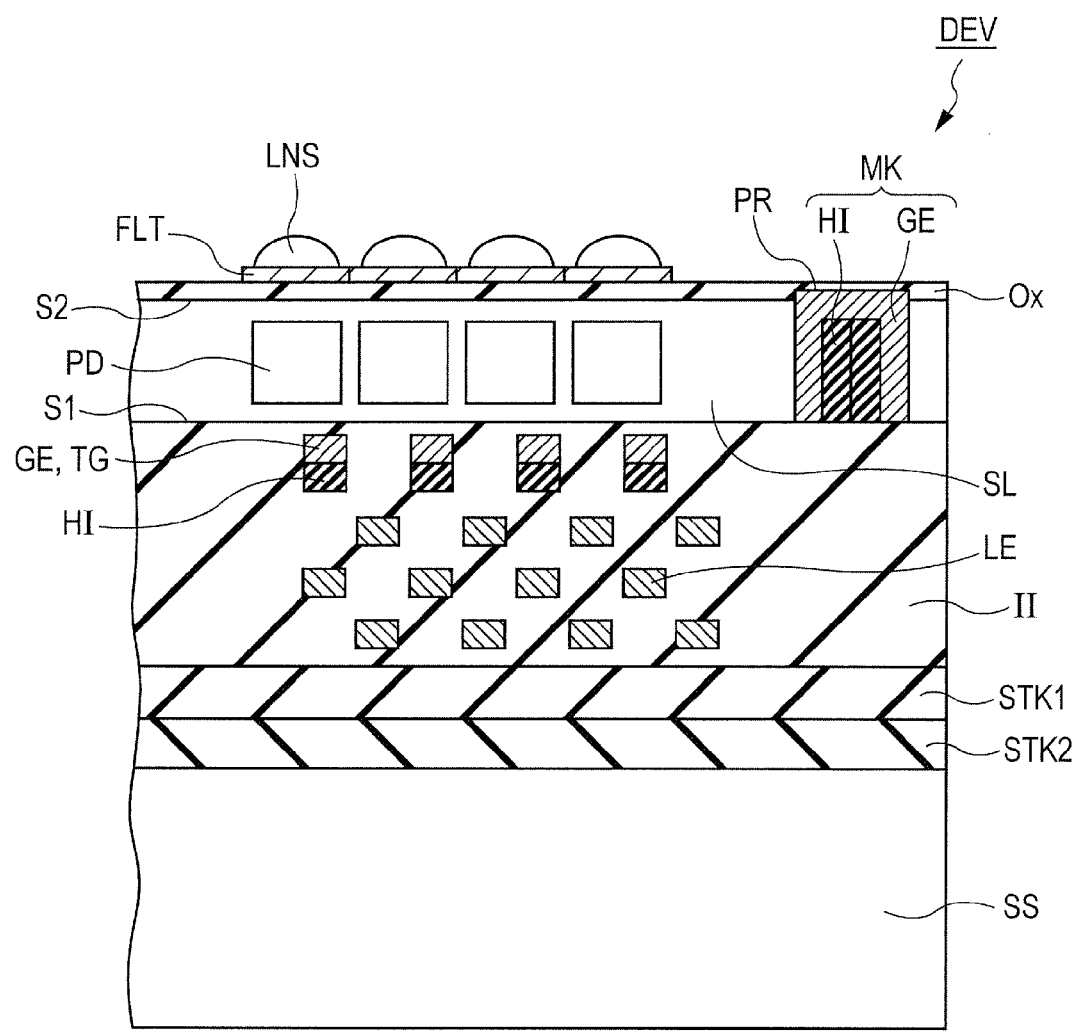
FIG. 76 is a schematic cross-sectional view showing a form of the light-receiving-element formation portion in which the photodiodes, the transistors, and the fourth example of the form of the alignment mark are formed in the semiconductor device according to Embodiment 3.

Next, as another modification, fourth to ninth examples of Embodiment 3 will be described. As shown in FIG. 76, the semiconductor device DEV according to the fourth example of Embodiment 3 is basically the same as the semiconductor device DEV of the first example of Embodiment 3. However, the fourth example is different from the first example of Embodiment 3 in that the alignment mark MK of the fourth example has the protruding portion PR and the same configuration as that of the alignment mark MK of the fifth example of Embodiment 1 of FIG. 32.

Figure 77:
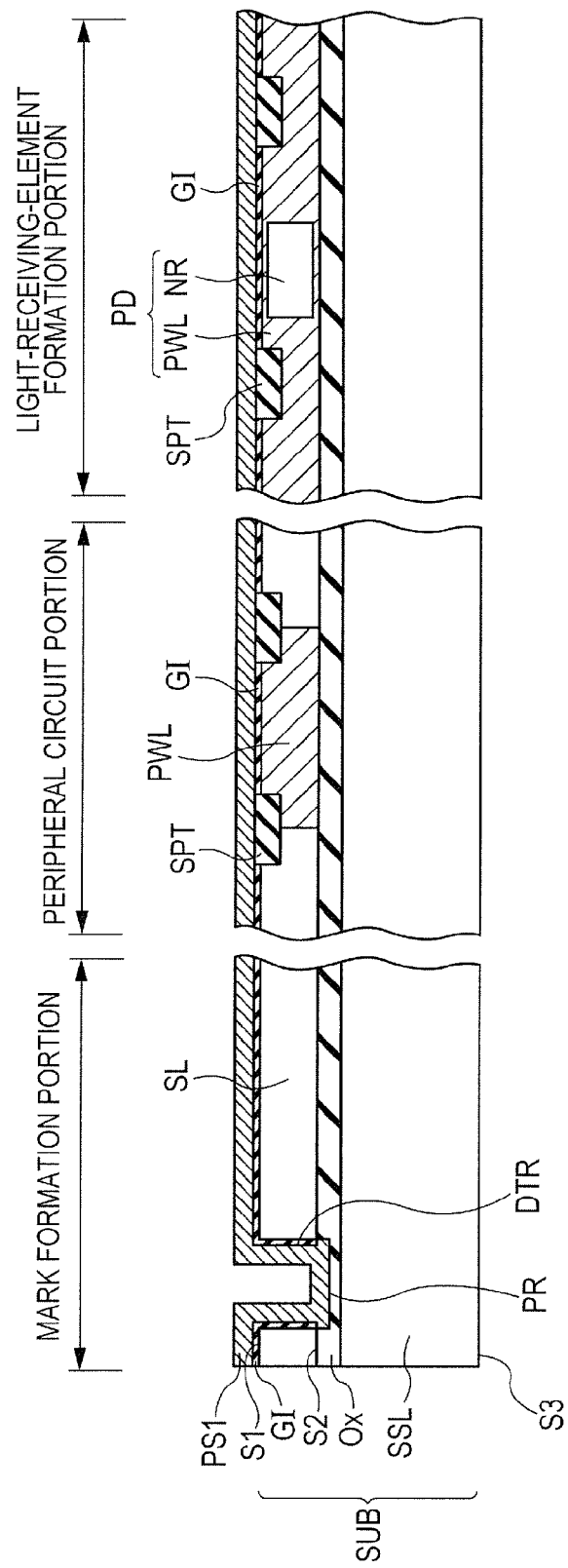
FIG. 77 is a schematic cross-sectional view showing the first step of a manufacturing method of the semiconductor device in the fourth example of Embodiment 3 shown in FIG. 76.

As shown in FIG. 77, after the same treatment as in the steps of FIGS. 45 to 48 is performed first using the semiconductor substrate SUB having a SOI structure, in the same manner as in the step of FIG. 67, the polysilicon layer PS1 (first layer) is formed.

Figure 78:
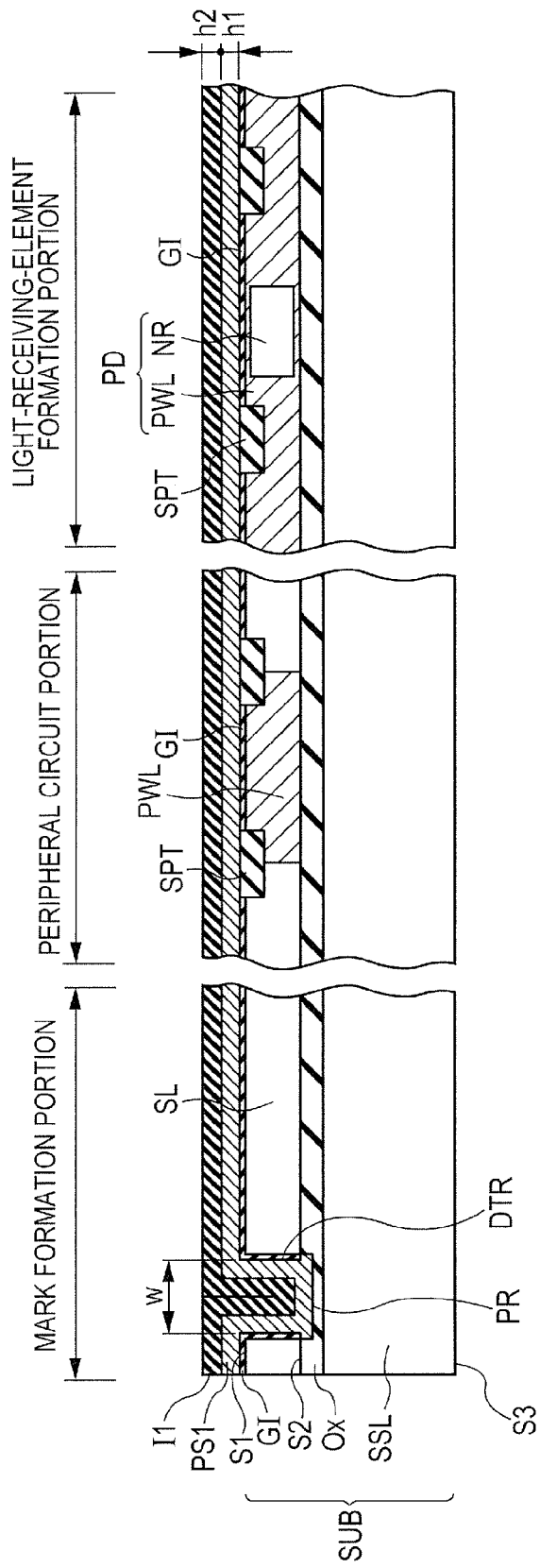
FIG. 78 is a schematic cross-sectional view showing the second step of the manufacturing method of the semiconductor device in the fourth example of Embodiment 3 shown in FIG. 76.
Figure 79:
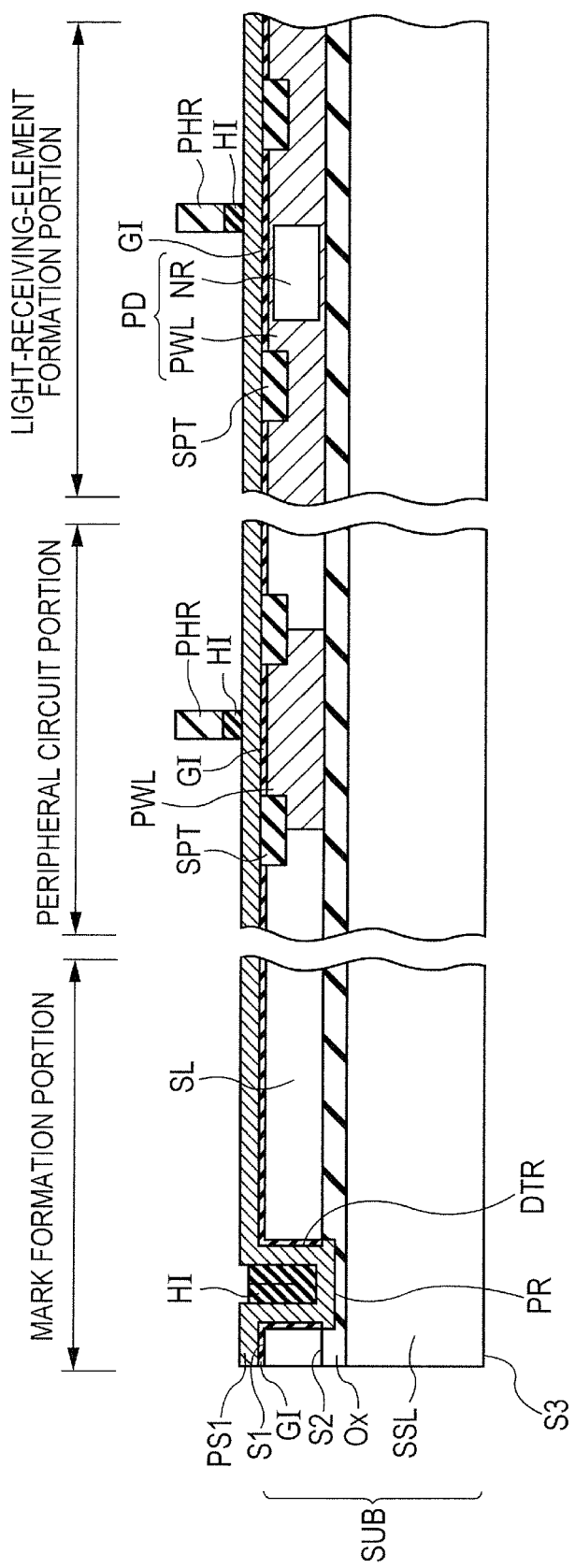
FIG. 79 is a schematic cross-sectional view showing the third step of the manufacturing method of the semiconductor device in the fourth example of Embodiment 3 shown in FIG. 76.
Figure 80:
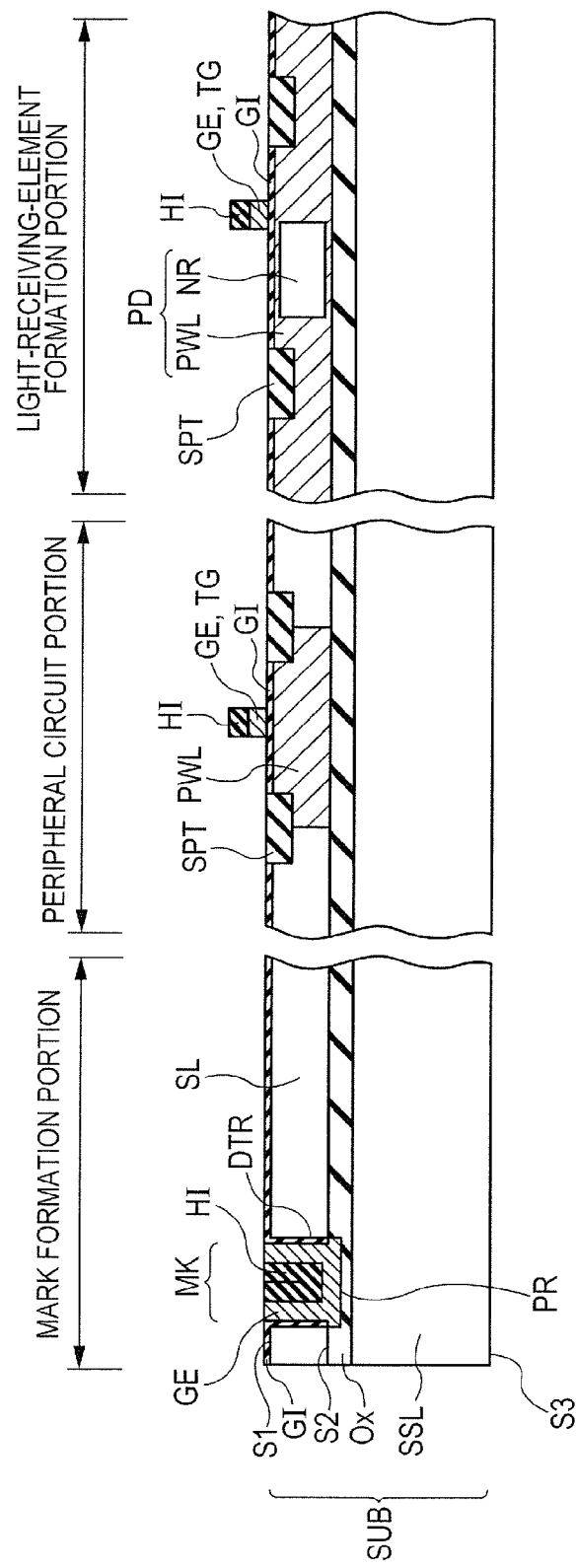
FIG. 80 is a schematic cross-sectional view showing the fourth step of the manufacturing method of the semiconductor device in the fourth example of Embodiment 3 shown in FIG. 76.

As shown in FIGS. 78 to 80, the same treatment as in the steps of FIGS. 68 to 70 is performed. If the trench portion DTR having the protruding portion PR reaching the inside of the insulating film layer Ox is thus formed using the semiconductor substrate SUB having the SOI structure, the semiconductor device DEV having the form shown in FIG. 76 is formed.

Figure 81:
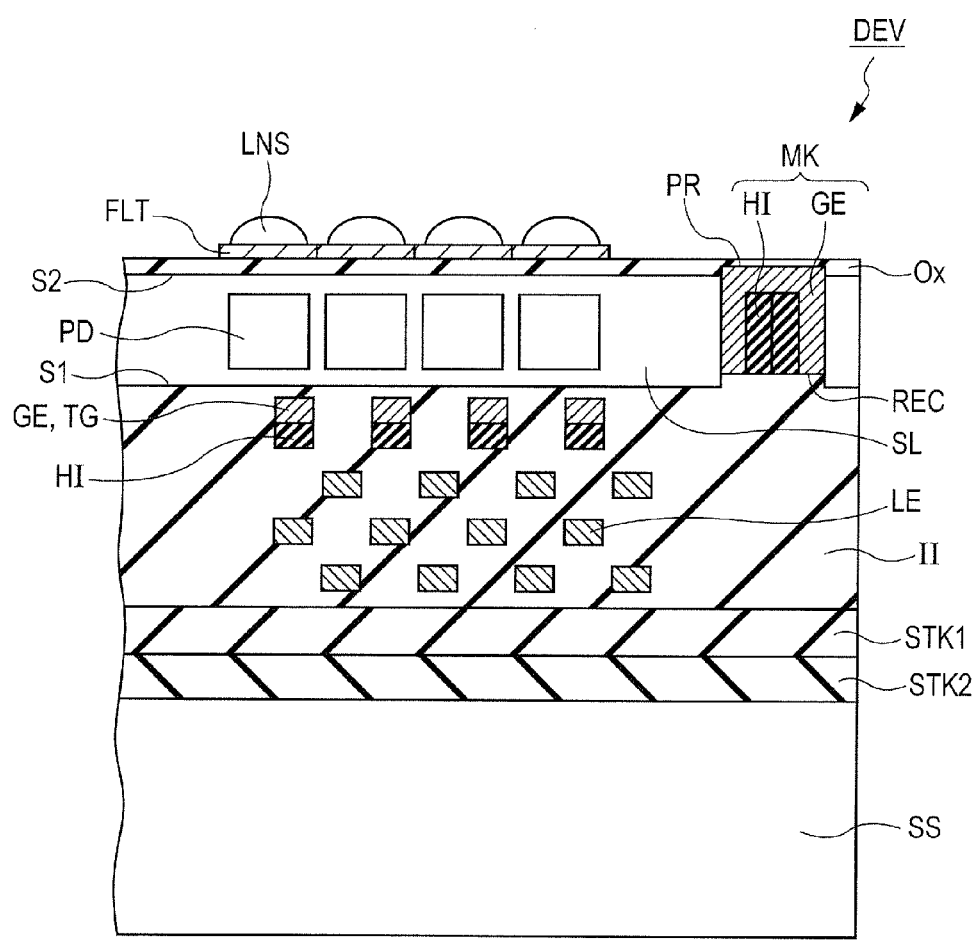
FIG. 81 is a schematic cross-sectional view showing a form of the light-receiving-element formation portion in which the photodiodes, the transistors, and the fifth example of the form of the alignment mark are formed in the semiconductor device according to Embodiment 3.

As shown in FIG. 81, the semiconductor device DEV according to the fifth example of Embodiment 3 has basically the same configuration as that of the semiconductor device DEV of the fourth example, but is different therefrom in that the alignment mark MK has the recessed portion REC in the same manner as in, e.g., the second example.

Figure 82:
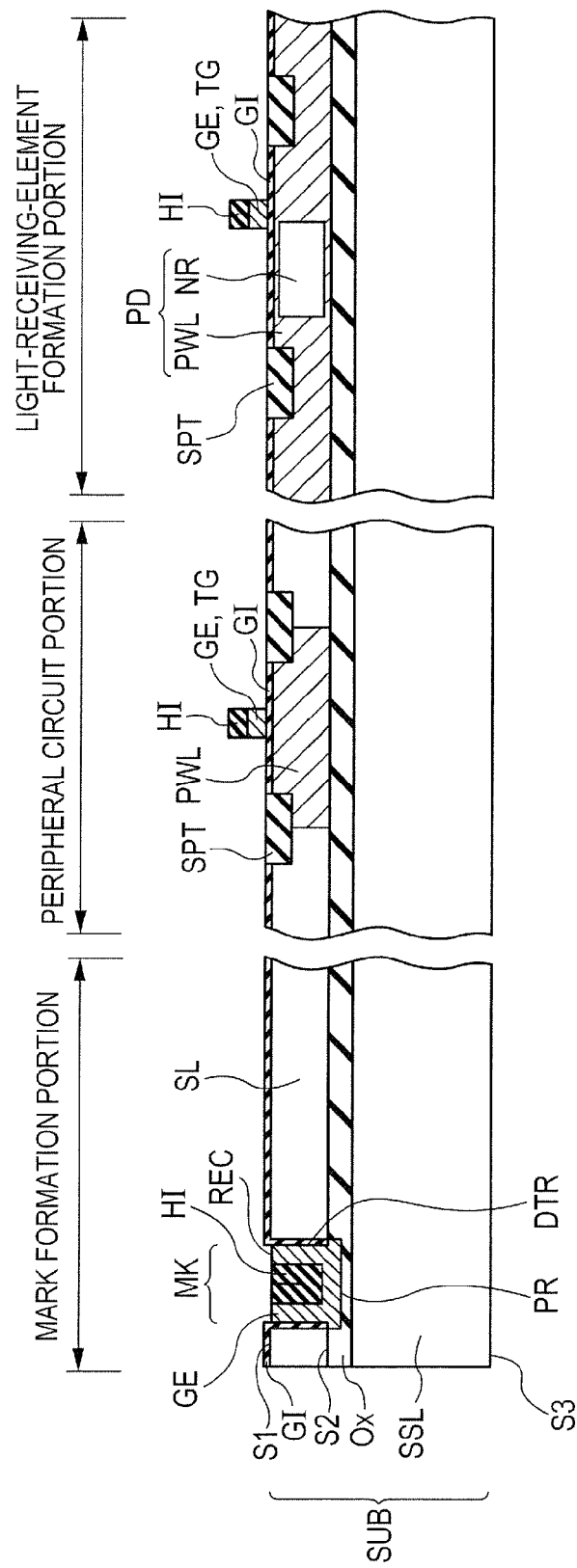
FIG. 82 is a schematic cross-sectional view showing a step of a manufacturing method of the semiconductor device in the fifth example of Embodiment 3 shown in FIG. 81.

As shown in FIG. 82, a manufacturing method of the fifth example of Embodiment 3 is the same as the manufacturing method of the fourth example (FIG. 80), but the recessed portion REC is formed in the same manner as in the manufacturing method of, e.g., the second example (FIG. 72).

Figure 83:
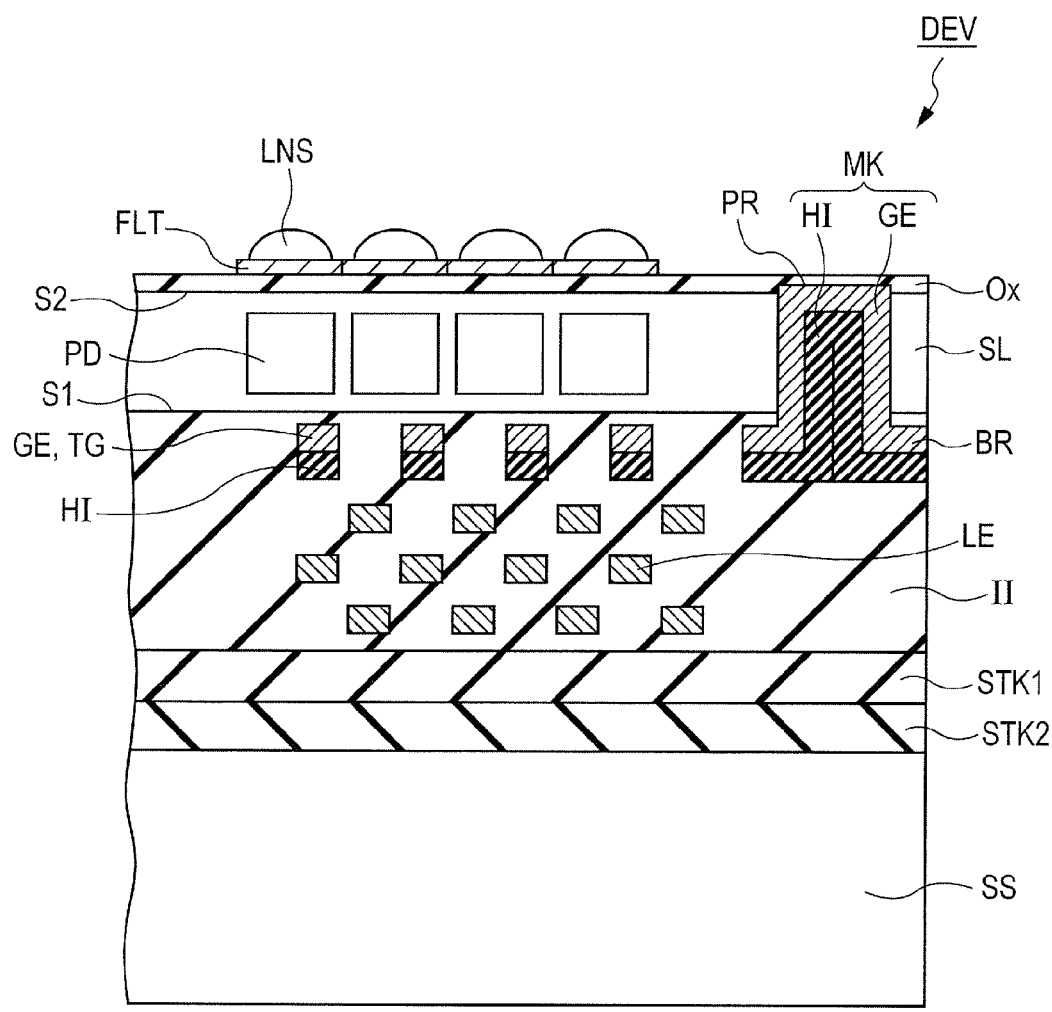
FIG. 83 is a schematic cross-sectional view showing a form of the light-receiving-element formation portion in which the photodiodes, the transistors, and the sixth example of the form of the alignment mark are formed in the semiconductor device according to Embodiment 3.

As shown in FIG. 83, the semiconductor device DEV according to the sixth example of Embodiment 3 has basically the same configuration as that of the semiconductor device DEV of the fourth example, but is different therefrom in that the alignment mark MK has the brim portion BR in the same manner as in, e.g., the third example.

Figure 84:
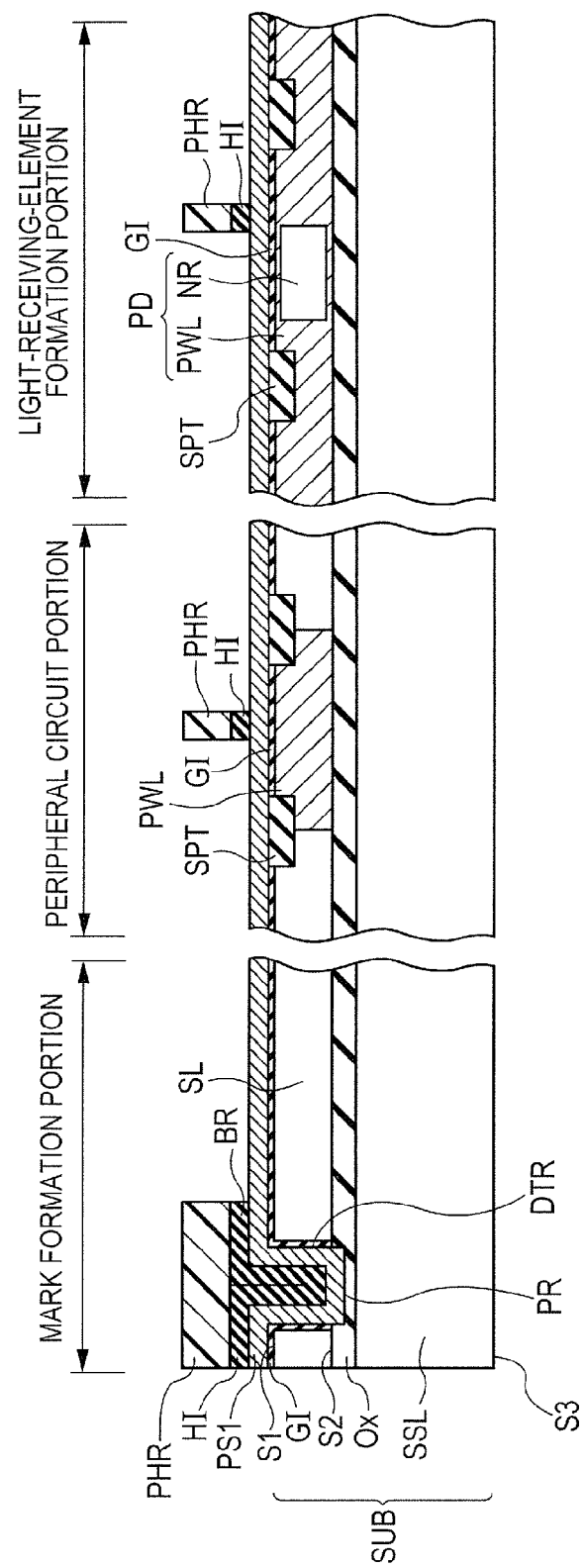
FIG. 84 is a schematic cross-sectional view showing the first step of a manufacturing method of the semiconductor device in the sixth example of Embodiment 3 shown in FIG. 83.
Figure 85:
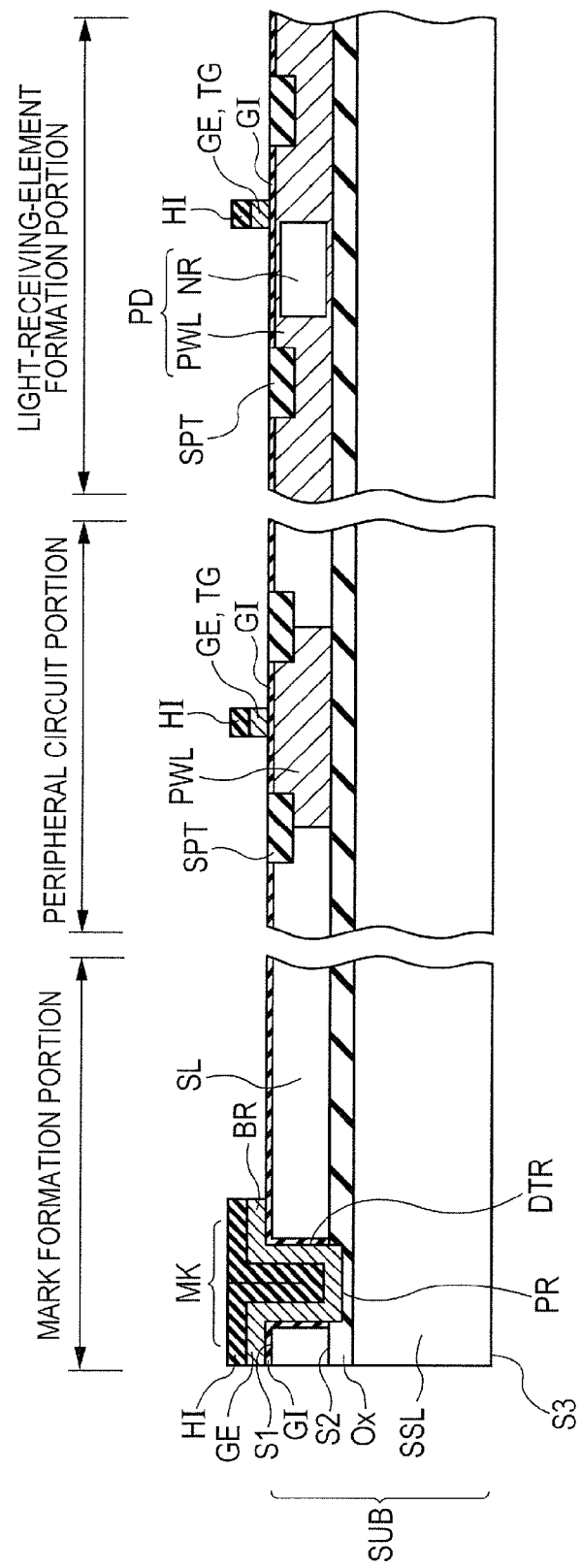
FIG. 85 is a schematic cross-sectional view showing the second step of the manufacturing method of the semiconductor device in the sixth example of Embodiment 3 shown in FIG. 83.

As shown in FIGS. 84 and 85, a manufacturing method of the sixth example of Embodiment 3 is the same as the manufacturing method of the third example (FIGS. 74 and 75), but is different therefrom in that the alignment mark MK has the protruding portion PR reaching the inside of the insulating film layer Ox of the semiconductor substrate SUB.

Figure 86:
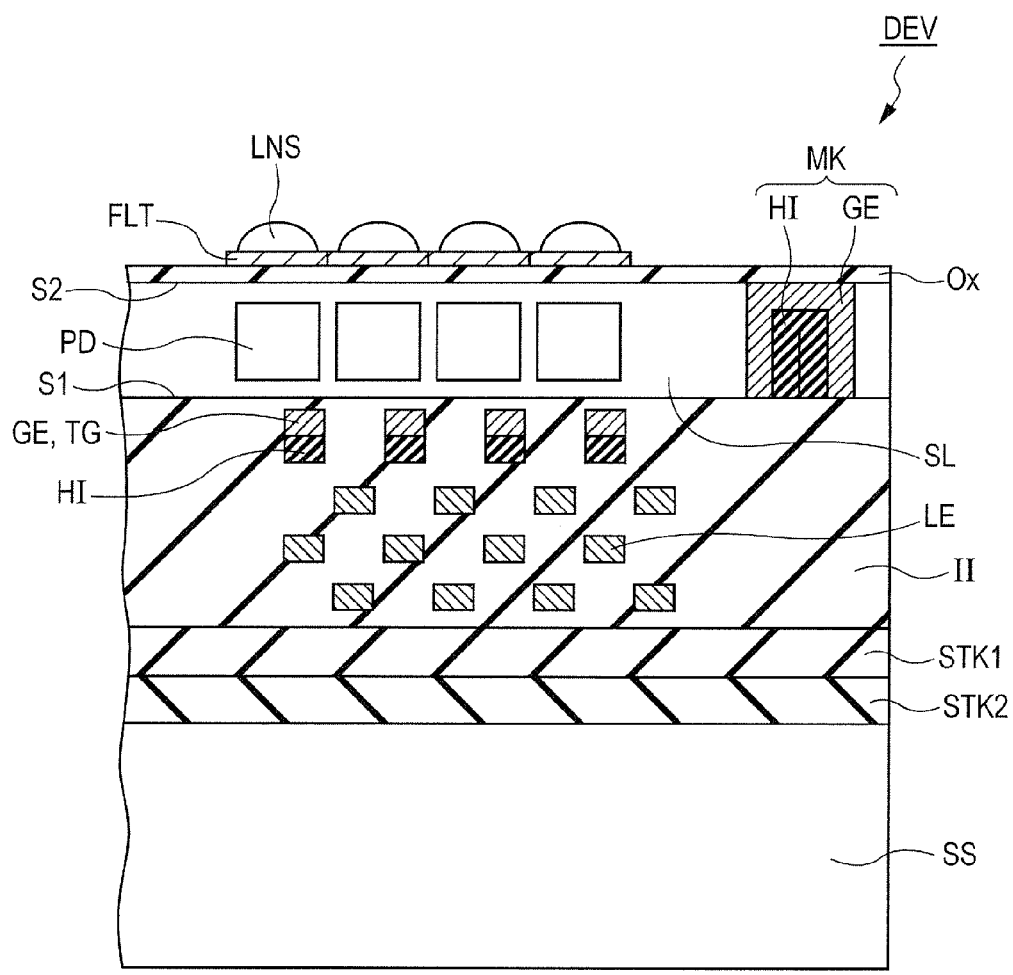
FIG. 86 is a schematic cross-sectional view showing a form of the light-receiving-element formation portion in which the photodiodes, the transistors, and the seventh example of the form of the alignment mark are formed in the semiconductor device according to Embodiment 3.
Figure 87:
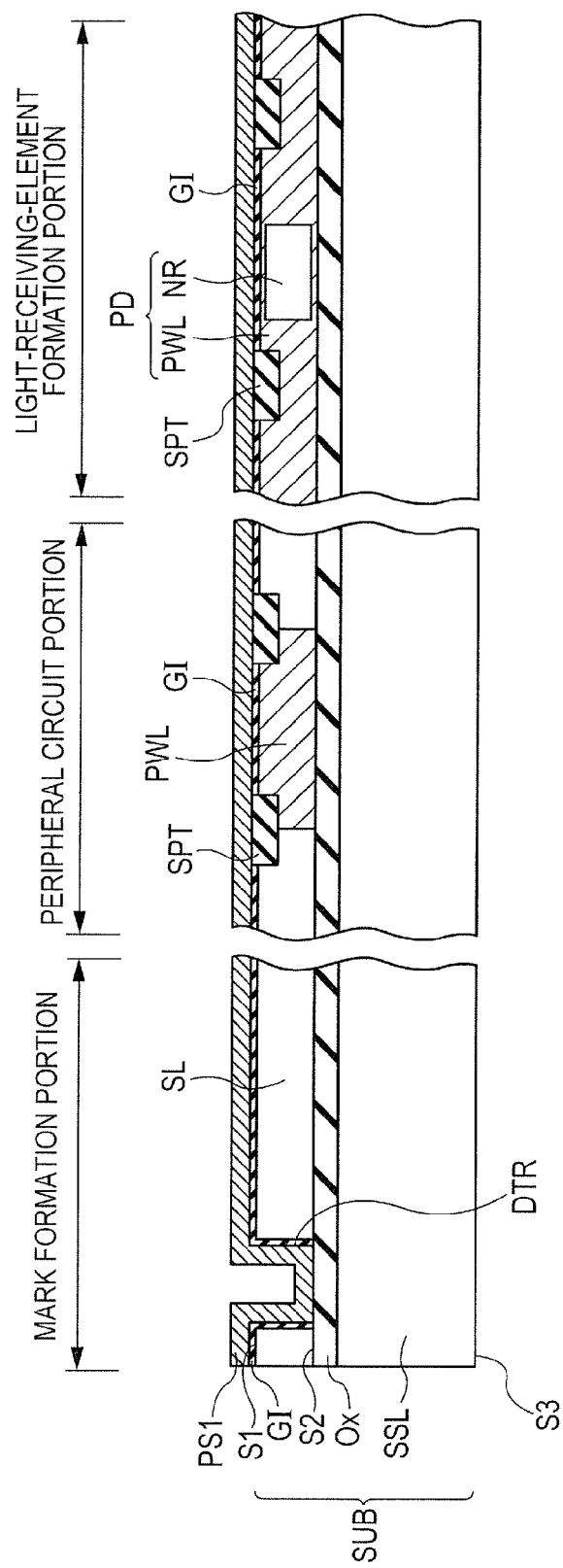
FIG. 87 is a schematic cross-sectional view showing the first step of a manufacturing method of the semiconductor device in the seventh example of Embodiment 3 shown in FIG. 86.
Figure 88:
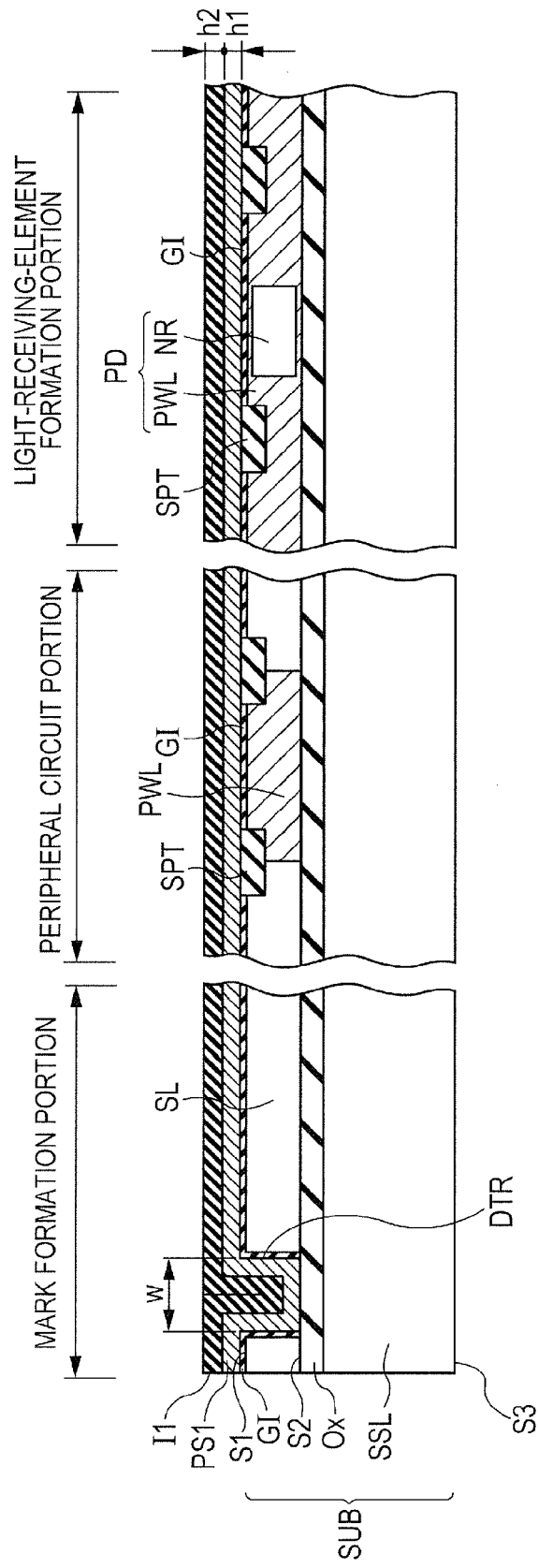
FIG. 88 is a schematic cross-sectional view showing the second step of the manufacturing method of the semiconductor device in the seventh example of Embodiment 3 shown in FIG. 86.
Figure 89:
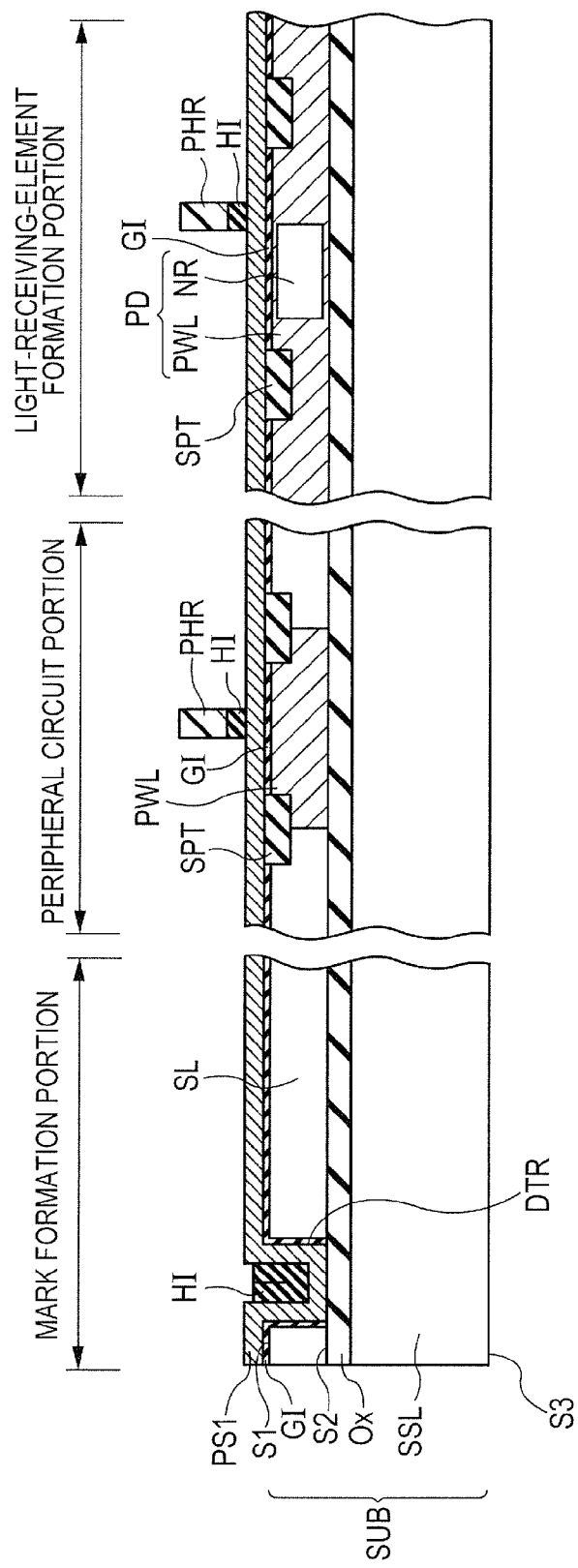
FIG. 89 is a schematic cross-sectional view showing the third step of the manufacturing method of the semiconductor device in the seventh example of Embodiment 3 shown in FIG. 86.
Figure 90:
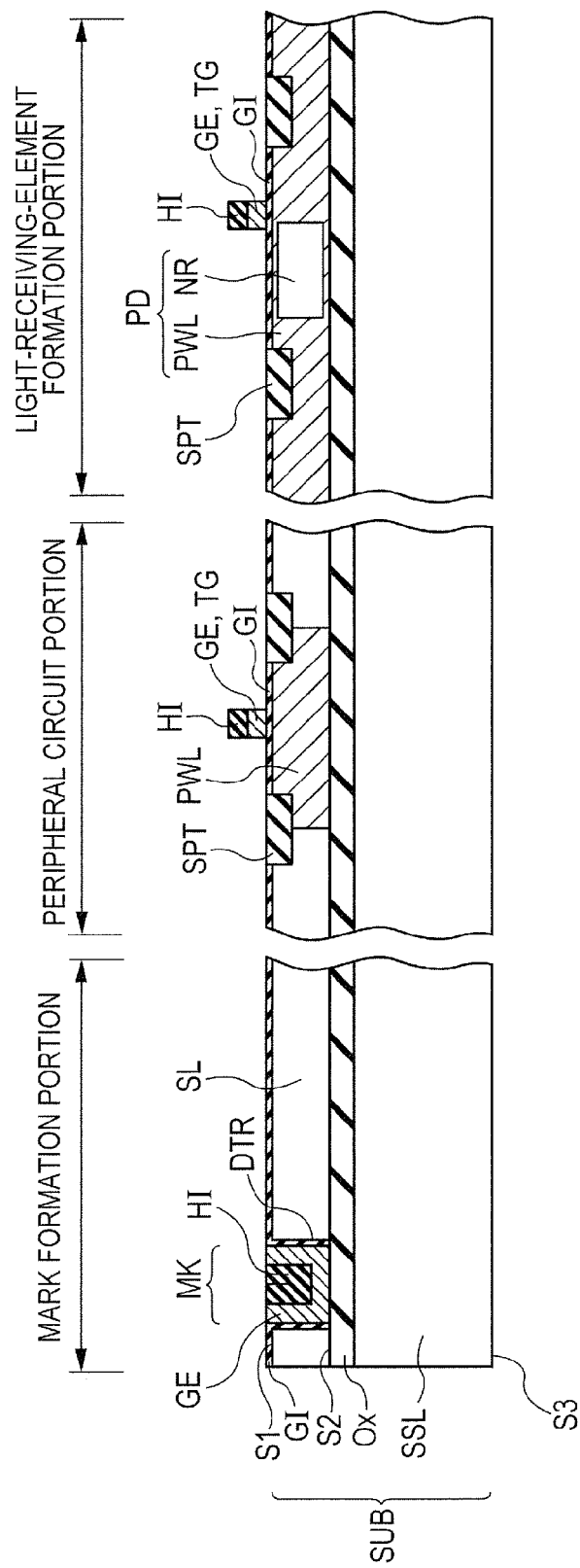
FIG. 90 is a schematic cross-sectional view showing the fourth step of the manufacturing method of the semiconductor device in the seventh example of Embodiment 3 shown in FIG. 86.

As shown in FIG. 86, the semiconductor device DEV according to the seventh example of Embodiment 3 is basically the same as the semiconductor device DEV of the fourth example of Embodiment 3. However, the seventh example is different from the foregoing first example in that the alignment mark MK does not have the protruding portion PR.

As shown in FIGS. 87 to 90, a manufacturing method of the seventh example of Embodiment 3 is basically the same as the manufacturing method of the fourth example of Embodiment 3, but is different therefrom in that the alignment mark MK is formed to stop at the uppermost surface of the insulating film layer Ox. This form is the same as in the steps of FIGS. 39 to 41. Accordingly, in the manufacturing method of the seventh example, the protruding portion PR is not formed. The manufacturing method is otherwise the same as in the foregoing fourth example.

Figure 91:
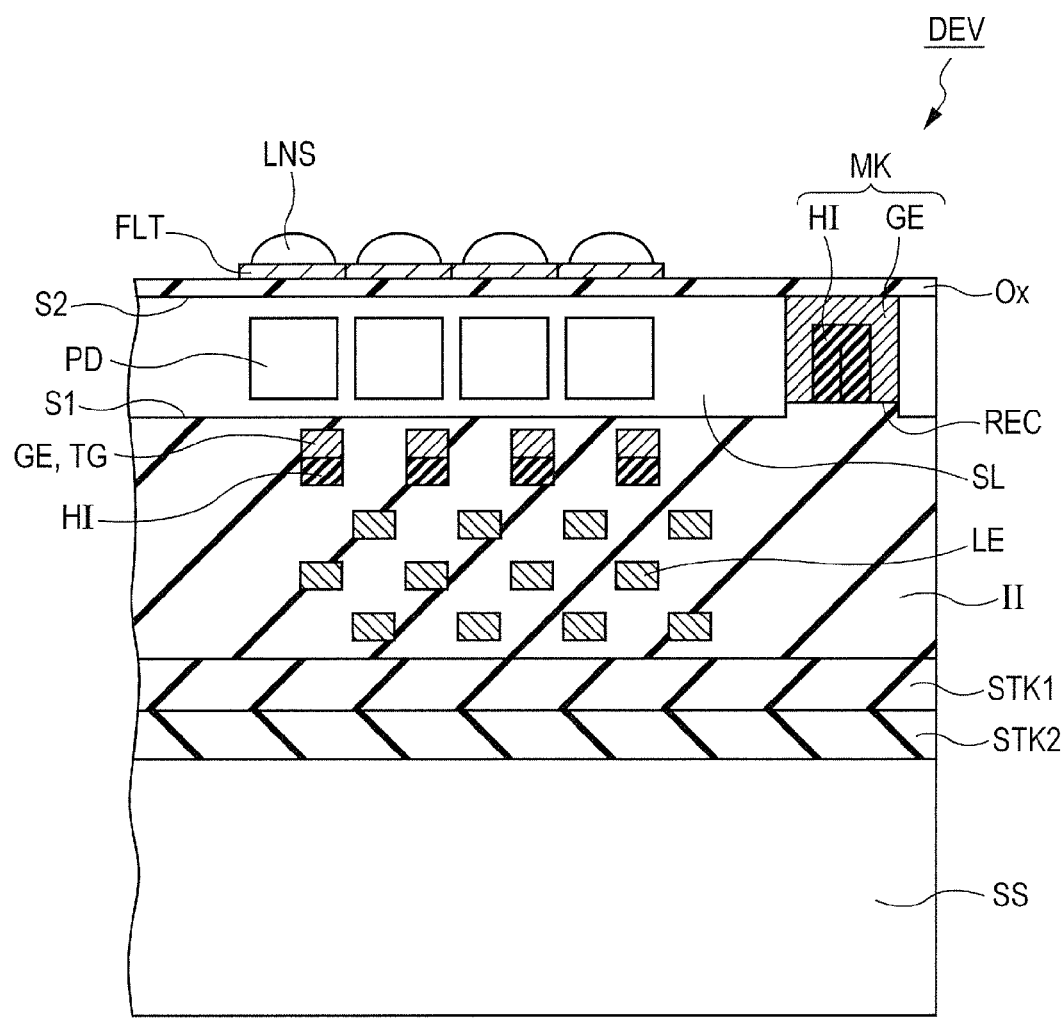
FIG. 91 is a schematic cross-sectional view showing a form of the light-receiving-element formation portion in which the photodiodes, the transistors, and the eighth example of the form of the alignment mark are formed in the semiconductor device according to Embodiment 3.

As shown in FIG. 91, the semiconductor device DEV according to the eighth example of Embodiment 3 has basically the same configuration as that of the semiconductor device DEV of the seventh example, but is different therefrom in that the alignment mark MK has the recessed portion REC in the same manner as in, e.g., the second example.

Figure 92:
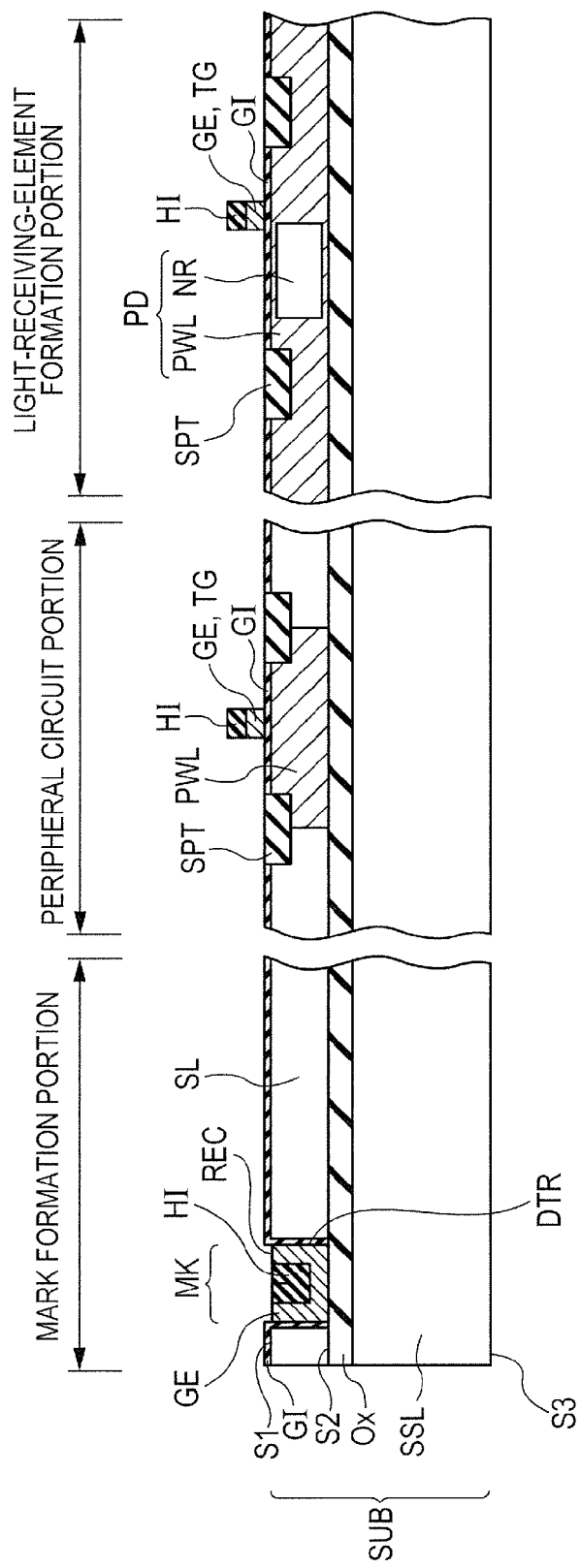
FIG. 92 is a schematic cross-sectional view showing a step of a manufacturing method of the semiconductor device in the eighth example of Embodiment 3 shown in FIG. 91.

As shown in FIG. 92, a manufacturing method of the eight example of Embodiment 3 is the same as the manufacturing method of the seventh example (FIG. 90), but the recessed portion REC is formed in the same manner as in the manufacturing method of, e.g., the second example (FIG. 72).

Figure 93:
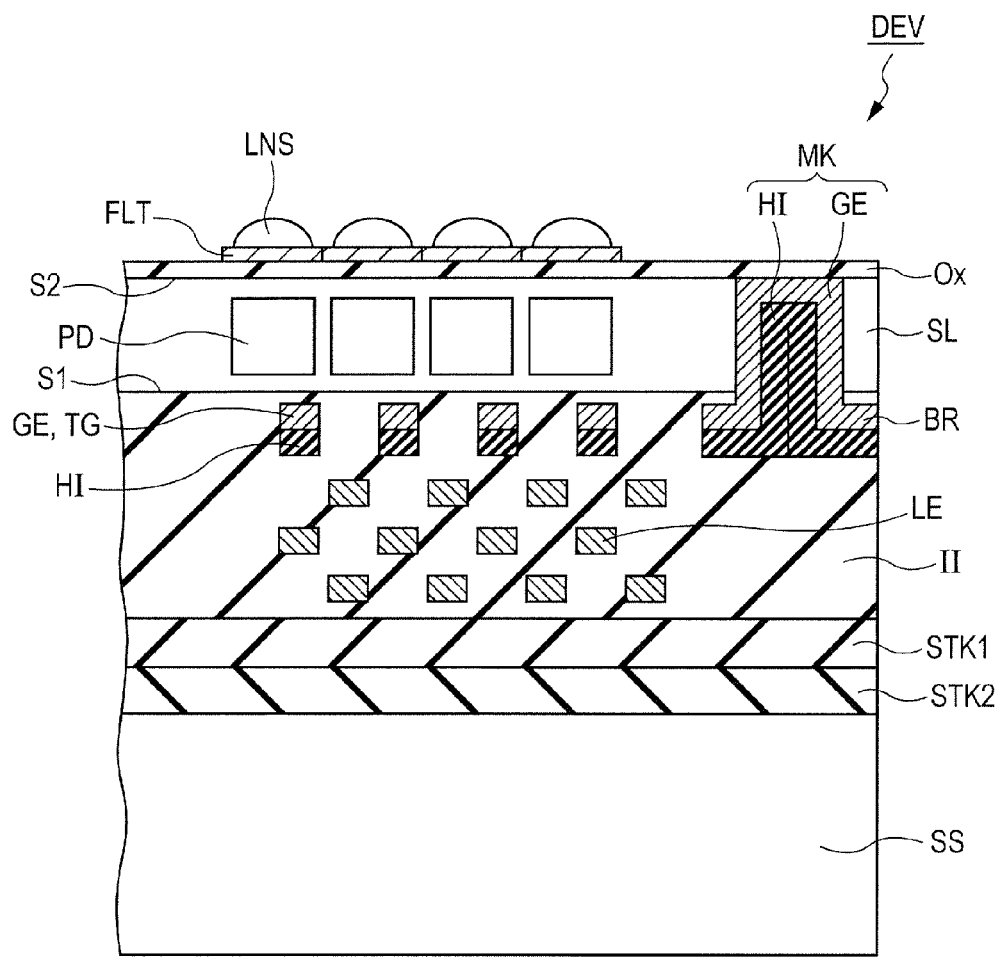
FIG. 93 is a schematic cross-sectional view showing a form of the light-receiving-element formation portion in which the photodiodes, the transistors, and the ninth example of the form of the alignment mark are formed in the semiconductor device according to Embodiment 3.

As shown in FIG. 93, the semiconductor device DEV according to the ninth example of Embodiment 3 has basically the same configuration as that of the semiconductor device DEV of the seventh example, but is different therefrom in that the alignment mark MK has the brim portion BR in the same manner as in, e.g., the third example.

As shown in FIGS. 94 to 95, a manufacturing method of the ninth example of Embodiment 3 is the same as the manufacturing method of the sixth example (FIGS. 84 and 85), but is different therefrom in that the alignment mark MK is formed to stop at the uppermost surface of the insulating film layer Ox (not to have the protruding portion PR).

Next, a description will be given of the function/effect of Embodiment 3. In Embodiment 3, in basically the same manner as in Embodiment 2, the first layer GE forming the alignment mark MK is formed in the same layer as that of the gate electrodes GE. In addition, the same layer as that of the insulating layer HI as the gate processing mask which is the insulating film for forming the gate electrodes GE forms the alignment mark MK. Therefore, in the same manner as in Embodiment 2, the alignment mark MK is formed using the steps of forming the gate electrodes GE. Accordingly, compared to the case where, e.g., the gate electrodes GE and the alignment mark MK each mentioned above are formed in different steps, it is possible to reduce the number of processing steps and manufacturing cost.

The alignment mark MK has the two layers including the polysilicon layer GE and the insulating layer HI as the gate processing mask to allow the width in the direction along the main surface S1 to be increased compared to that in the case where the alignment mark MK having only the polysilicon layer GE is formed and allow easier visual recognition of the mark. Therefore, the insulating layer HI used to form the gate electrodes GE can be used effectively for the formation of the alignment mark MK.

If the alignment mark MK having the brim portion BR protruding from the front main surface S1 in the direction opposite to the direction in which the photodiodes PD are arranged as shown in, e.g., FIGS. 73 to 75 is used also in Embodiment 3, the alignment mark MK can be used not only in the step for the back side (main surface S2 side) (on which the on-chip lenses LNS or the like are formed), but also in the steps subsequent to the gate formation (such as, e.g., the formation of contacts) on the front side (main surface S1 side). The brim portion BR is the same as in the state where the mark pattern formed simultaneously with the gate electrode GE is formed at a position two-dimensionally overlapping the alignment mark MK. This reduces the area occupied by the mark and improves the use efficiency of the area.

Embodiment 3 of the present invention is different from Embodiments 1 and 2 of the present invention only in the points described above. That is, the configurations, conditions, procedures, effects, and the like which are not described above about Embodiment 3 of the present invention are all based on those of Embodiments 1 and 2 of the present invention.

It should be considered that the embodiments disclosed herein are illustrative in all points and are not limitative. The scope of the present invention is shown not by the description given above, but by the claims and is intended to include the meanings equivalent to the claims and all the modifications within the claims. The embodiments and modifications each shown above may also be combined with each other within a scope consistent with the gist of each thereof.

The present invention is particularly advantageously applicable to a back-side-illumination solid-state image sensor formed using a mark for alignment and a manufacturing method thereof.

What is claimed is:

1. A semiconductor device, comprising:
   a semiconductor layer having a first main surface and a second main surface opposing the first main surface;
   a plurality of light receiving elements which are formed in the semiconductor layer and in each of which photoelectric conversion is performed;
   a light receiving lens disposed over the second main surface or the semiconductor layer to supply light to each of the light receiving elements; and
   a mark for alignment formed inside the semiconductor layer, wherein
   the mark for alignment extends from the first main surface toward the second main surface,
   the mark for alignment includes a protruding portion formed so as to protrude from the second main surface in a direction toward where the light receiving lens is disposed,
   the mark for alignment comprises a first layer including a conductive film or a semiconductor film, the first layer filling at least a part of an inside of a trench formed in the semiconductor layer,
   the mark for alignment further comprises a second layer including an insulating film, the second layer being formed in the first layer,
   the mark for alignment comprises the first and second layers inside the trench portion, and
   the protruding portion includes the first layer.

2. The semiconductor device according to claim 1, wherein the second layer is a silicon oxide film or a silicon nitride film.

3. The semiconductor device according to claim 1, wherein the mark for alignment is formed only in a part of an outer peripheral portion of the semiconductor layer in planar view.

4. The semiconductor device according to claim 1, wherein the protruding portion of the mark for alignment comprises the first layer only.

5. The semiconductor device according to claim 1, wherein
   the first layer is the conductive film or the semiconductor film, and
   the second layer is the insulating film.

* * * * *